(12) United States Patent
Svedberg

(10) Patent No.: US 10,715,807 B2
(45) Date of Patent: *Jul. 14, 2020

(54) METHOD AND APPARATUS FOR PYRAMID VECTOR QUANTIZATION INDEXING AND DE-INDEXING OF AUDIO/VIDEO SAMPLE VECTORS

(71) Applicant: Telefonaktiebolaget L M Ericsson (publ), Stockholm (SE)

(72) Inventor: Jonas Svedberg, Luleå (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 16/512,587

(22) Filed: Jul. 16, 2019

(65) Prior Publication Data

US 2019/0342552 A1 Nov. 7, 2019

Related U.S. Application Data

(63) Continuation of application No. 16/170,346, filed on Oct. 25, 2018, now Pat. No. 10,404,984, which is a
(Continued)

(51) Int. Cl.
*G10L 19/00* (2013.01)
*H04N 19/124* (2014.01)
(Continued)

(52) U.S. Cl.
CPC ........... *H04N 19/124* (2014.11); *G10L 19/00* (2013.01); *H03M 7/3082* (2013.01); *H04N 19/513* (2014.11); *H04N 19/94* (2014.11)

(58) Field of Classification Search
CPC .... H04N 19/124; H04N 19/513; H04N 19/94; H03M 7/3082; G10L 19/00
See application file for complete search history.

(56) References Cited

U.S. PATENT DOCUMENTS 5,974,380 A * 10/1999 Smyth ................. G10L 19/0208
704/229
6,006,179 A 12/1999 Wu et al.
(Continued)

FOREIGN PATENT DOCUMENTS

EP 2482052 A1 8/2012

OTHER PUBLICATIONS

Office Action, ROC (Taiwan) Patent Application No. 104106553, dated Oct. 19, 2016.
(Continued)

*Primary Examiner* — Howard D Brown, Jr.
(74) *Attorney, Agent, or Firm* — Sage Patent Group

(57) ABSTRACT

A method for pyramid vector quantization indexing of audio/video signals comprises obtaining of an integer input vector representing the audio/video signal samples. A leading sign is extracted from the integer input vector. The leading sign is a sign of a terminal non-zero coefficient in the integer input vector. The terminal non-zero coefficient is one of a first non-zero coefficient and a last non-zero coefficient in the integer input vector. The integer input vector is indexed with a pyramid vector quantization enumeration scheme into an output index representing the audio/video signal samples. The pyramid vector quantization enumeration scheme is designed for neglecting the sign of the terminal non-zero coefficient. The output index and the leading sign are outputted. A corresponding method for de-indexing, an encoder, a decoder, and computer programs therefore are also disclosed.

20 Claims, 25 Drawing Sheets

Related U.S. Application Data continuation of application No. 15/610,708, filed on Jun. 1, 2017, now Pat. No. 10,158,854, which is a continuation of application No. 14/434,058, filed as application No. PCT/SE2015/050216 on Feb. 26, 2015, now Pat. No. 9,774,854.

(60) Provisional application No. 61/945,403, filed on Feb. 27, 2014.

(51) Int. Cl.
*H03M 7/30* (2006.01)
*H04N 19/94* (2014.01)
*H04N 19/513* (2014.01)

(56) References Cited

U.S. PATENT DOCUMENTS

| | | | |
|---|---|---|---|
| 6,820,052 | B2 | 11/2004 | Das et al. |
| 6,925,119 | B2 | 8/2005 | Bartolucci et al. |
| 8,238,424 | B2 | 8/2012 | Chang et al. |
| 9,591,304 | B2 | 3/2017 | Kau et al. |
| 2004/0176951 | A1 | 9/2004 | Sung et al. |
| 2012/0232909 | A1 | 9/2012 | Terriberry et al. |
| 2012/0232913 | A1* | 9/2012 | Terriberry ............ G10L 19/038 704/503 |
| 2013/0136371 | A1 | 5/2013 | Ikai et al. |
| 2014/0286399 | A1* | 9/2014 | Valin ..................... H04N 19/94 375/240.03 |
| 2015/0204971 | A1 | 7/2015 | Yoshimura et al. |
| 2016/0088297 | A1* | 3/2016 | Svedberg ............... G10L 19/00 375/240.03 |
| 2016/0093308 | A1* | 3/2016 | Kim ....................... G06F 17/10 381/22 |
| 2016/0093311 | A1* | 3/2016 | Kim ....................... G10L 19/038 381/22 |
| 2018/0061428 | A1 | 3/2018 | Seroussi et al. |
| 2019/0342552 | A1* | 11/2019 | Svedberg ............... H04N 19/94 |

OTHER PUBLICATIONS

International Search Report, PCT Application No. PCT/SE2015/050216, dated Jun. 25, 2015.
Written Opinion of the International Searching Authority, PCT Application No. PCT/SE2015/050216, dated Jun. 25, 2015.
Fischer T R: "A Pyramid Vector Quantizer", IEEE Transactions on Information Theory, IEEE Press, USA, vol. IT-32, No. 4, Jul. 1, 1986, pp. 568-583, XP000877055.
Office Action for Taiwan Patent Application No. 106109124 dated Jan. 18, 2019 including English translation, 6 pages.

\* cited by examiner

| $N_{MPVQ}(n,k) = M(n,k)$ | |
|---|---|
| pos[0] value | NUMBER OF ENTRIES |
| "k" | 1 |
| NON-ZERO POSITIVE OR NEGATIVE NEXT LEAD_SIGN | 2*U(n,k) |
| "0" | M(n-1,k) |
| MPVQ-SIZE IS: $N_{MPVQ}(n,k) = M(n,k) = 1 + 2*U(n,k) + M(n-1,k)$ | |

Fig. 4

| LSB BIT IN "2*U(n,k)" section | |
|---|---|
| 0 | NEXT LEADING SIGN AFTER pos[0] IS POSITIVE |
| 1 | NEXT LEADING SIGN AFTER pos [0] IS NEGATIVE |
| 0 | NEXT LEADING SIGN AFTER pos [0] IS POSITIVE |
| 1 | NEXT LEADING SIGN AFTER pos [0] IS NEGATIVE |
| ⋮ | |
| 1 | NEXT LEADING SIGN AFTER pos [0] IS NEGATIVE |
| 0 | NEXT LEADING SIGN AFTER pos [0] IS POSITIVE |
| 1 | NEXT LEADING SIGN AFTER pos [0] IS NEGATIVE |

| $N_{MPVQ}(n,k) = M(n,k)$ | |
|---|---|
| pos[0] value | NUMBER OF ENTRIES |
| "k" | 1 |
| NON-ZERO POSITIVE NEXT LEAD_SIGN | U(n,k) |
| NON-ZERO NEGATIVE NEXT LEAD_SIGN | U(n,k) |
| "0" | M(n-1,k) |
| MPVQ-SIZE IS: $N_{MPVQ}(n,k) = M(n,k) = 1 + 2 \cdot U(n,k) + M(n-1,k)$ | |

Fig. 8

```
% Example of pre-shifting the leading signs, (N=8,K=13)
% pos      =   0   1   2   3   4   5   6   7
% PVQ-vec  =  -1   0   0   0  +5   0  -6  -1
%  becomes:
%
%PVQ-vec   =  -1   0   0   0  +5   0  -6  -1
%encode_sign= +1   0   0   0  -1   0  -1   0
%  and;
lead_sign  = -1 (negative, (the sign from PVQ-vec(0))
```

Fig. 24

METHOD AND APPARATUS FOR PYRAMID VECTOR QUANTIZATION INDEXING AND DE-INDEXING OF AUDIO/VIDEO SAMPLE VECTORS

CROSS REFERENCE TO RELATED APPLICATIONS

This application is a continuation of U.S. patent application Ser. No. 16/170,346, filed Oct. 25, 2018, which is a continuation of U.S. patent application Ser. No. 15/610,708, filed Jun. 1, 2017 (now U.S. Pat. No. 10,158,854), which is a continuation of U.S. patent application Ser. No. 14/434,058, filed Apr. 7, 2015 (now U.S. Pat. No. 9,774,854), which itself is a 35 U.S.C. § 371 national stage application of PCT International Application No. PCT/SE2015/050216, filed Feb. 26, 2015, which itself claims priority to U.S. provisional Application No. 61/945,403, filed Feb. 27, 2014, the disclosure and content of all of which are incorporated by reference herein in their entirety.

TECHNICAL FIELD

The proposed technology generally relates to encoding/decoding of audio/video signals and in particular to methods and apparatuses for pyramid vector quantization indexing and de-indexing of audio/video sample vectors.

BACKGROUND

When audio or video signals are to be transmitted or stored, the signals are typically encoded. In an encoder, vectors representing audio/video signal samples are encoded to be represented by a number of coefficients or parameters. These coefficients or parameters can then efficiently be transmitted or stored. When the coefficients or parameters are received or retrieved, a decoding of the coefficients or parameters into audio/video signal samples is performed to retrieve the original audio/video signal. Many different kinds of encoding techniques have been used for audio/video signals.

One approach is based on vector quantization (VQ). It is known that unconstrained vector quantization (VQ) is the optimal quantization method for grouped samples (vectors) of a certain length. However, the memory and search complexity constraints have led to the development of structured vector quantizers. Different structures gives different trade-offs in terms of search complexity and memory requirements. One such method is the gain-shape vector quantization, where the target vector x is represented using a shape vector vec and a gain G:

$$vec = \frac{x}{G}$$

The concept is, instead of quantizing directly the target vector, to quantize pairs of {vec, G}. Gain and shape components are then encoded using a shape quantizer which is tuned for the normalized shape input and a gain quantizer which handles the dynamics of the signal. This structure is well used in e.g. audio coding since the division into dynamics and shape (or fine structure) fits well with the perceptual auditory model.

A valid entry in the selected structured vector quantizer, is first searched using the knowledge of the structure (e.g. L1 (absolute amplitude)-normalization or L2 (energy)-normalization). After a valid vector has been found one needs to efficiently create an index (or codeword) that represents that specific vector and then transmit that index to the receiver. The index creation (also known as indexing or enumeration) will use the properties of the selected structure and create a unique index (codeword) for the found vector in the structured VQ.

On the receiving side the decoder needs to efficiently decompose the index into the same vector that was determined on the encoder side. This decomposition can be made very low complex in terms of operations by using a large table lookup, but then at the cost of huge stored Read-Only Memory (ROM) tables. Alternatively, one can design the decomposition (also known as de-indexing) so that it uses knowledge of the selected structure and potentially also the available target hardware numerical operations to algorithmically decompose the index into the unique vector, in an efficient way.

A well designed structured VQ, has a good balance between encoder search complexity, encoder indexing complexity and decoder de-indexing complexity in terms of Million Operations Per Second (MOPS) and in terms of Program ROM and dynamic Random Access Memory (RAM) required, and in terms of Table ROM.

Many audio codecs such as CELT, IETF/Opus-Audio and ITU-T G.719 use an envelope and shape VQ and an envelope mixed gain-shape VQ to encode the spectral coefficients of the target audio signal (in the Modified Discrete Cosine Transform (MDCT) domain). CELT/IETF OPUS-Audio use a PVQ-Vector Quantizer, while G.719 uses and slightly extended RE8 Algebraic Vector Quantizer for R=1 bit/dimension coding and a very low complexity D8 Lattice quantizer for VQ rates higher than 1 bit/dimension. PVQ stands for Pyramid Vector Quantizer, it is a VQ that uses the L1-norm($\Sigma$abs(vector)) to enable a fast search. It has also been found that PVQ may provide quite efficient indexing. The PVQ has been around for some time, but was initially developed in 1983-86 by Fischer.

PVQ-quantizers have also been used for encoding of time domain and Linear Prediction (LP) residual domain samples in speech coders, and for encoding of frequency domain Discrete Cosine Transform (DCT) coefficients. An advantage with the PVQ compared to other structured VQs is that it naturally can handle any vector dimension, while other structured VQs often are limited to the dimension being multiples, e.g. multiples of 4 or multiples of 8.

The IETF/OPUS Codec in Audio mode is employing a recursive PVQ-indexing and de-index scheme that has a maximum size of the PVQ-indices/(short) codewords set to 32 bits. If the target vector to be quantized requires more than 32 bits, the original target vector is recursively split in halves into lower dimensions, until all sub-vectors fit into the 32 bit short codeword indexing domain. In the course of the recursive binary dimension splitting there is an added cost of adding a codeword for encoding the energy relation (the relative energies, which can be represented by a quantized angle) between the two split sub target vectors. In OPUS-Audio the structured PVQ-search is made on the resulting split smaller dimension target sub-vectors.

The original CELT codec (developed by Valin, Terribery and Maxwell in 2009), is employing a similar PVQ-indexing/deindexing scheme, (with a 32 bit codeword limit) but the binary dimension split in CELT is made in the indexing domain after searching and after establishing the initial PVQ-structured vector. The integer PVQ-vector to index is then recursively reduced to smaller than or equal to 32 bit PVQ-vector sub-units in the integer domain. This is again achieved by adding an additional codeword for the split, this time for the integer relation between the 'left' integer sub-vector and the 'right' integer sub-vector, so that one can know the L1-norm of each of the sub PVQ-vectors in the decoder. The CELT post-search integer indexing split approach leads to a variable rate (variable total size index), which can be a disadvantage if the media-transport requires fixed rate encoding.

In 1997 and 1998 Hung, Tsern and Meng, investigated the error robustness of a few PVQ-indexing variations, they summarized the PVQ-enumeration (indexing) problem this way (l is the vector dimension and k is the number of unit pulses):

"Enumeration assigns a unique index to all possible vectors in the PVQ-codebook, P(l, k), imparting a sorting order to the PVQ-codebook vectors." "Systematic sorting for enumeration is done through counting formulas for the number of vectors in the pyramid; this is a common concept to all pyramid enumeration techniques."

"The number of vectors in the pyramid codebook P(l, k) is denoted N(l, k). This is related to a binary codeword index length which is ceil(log2(N(l,k))) bits. N(l,k) can be viewed as the number of ways l integer values in a vector can have an absolute sum of k."

Hung et al, studied the bit error robustness of the PVQ-codewords for a couple of variations of PVQ-indexing/enumeration schemes, but they did not focus the study on making the implementation of PVQ-enumeration efficient and of sufficiently low complex for an actual hardware implementation. The CELT and the IETF/OPUS-Audio PVQ-implementations of PVQ-indexing are strongly focused on providing an as low complex enumeration as possible (both encoding and decoding), given a 32 bit unsigned integer based hardware, but disregarding the PVQ-sensitivity to bit errors. Also in 1999 Ashley proposed a way to reduce the complexity for implementing the product code PVQ-enumeration by the use of a low complexity deterministic approximation of the Binomial combinatorial function used for size calculation and offset calculation, Ashley et al call this technique Factorial Pulse Coding (FPC), and it has been employed in the ITU-G.718 speech codec standard.

In CELT and IETF/OPUS-Audio, the PVQ-codeword is not limited by the granularity of a single bit. The two codecs use a higher granularity scheme, using eighth (⅛) bits resolution. This is achieved by using an arithmetic encoder/decoder as an intermediate step in the interface to the transport bit stream, (CELT/OPUS-Audio uses an implementation of a range encoder/decoder as the arithmetic encoder/decoder) where the number of bits used by the PVQ-codeword can be made into fractional bits. With a bit resolution BITRES=8 (eighths), the fractional PVQ codeword length becomes ceil(log2(N(l, k)*BITRES))/BITRES. For instance, if l=64, k=5 and BITRES=8, this leads to that NPVQ=N(l,k)=286680704, log2 (NPVQ)=28.0948696, and ceil(log2(NPVQ)*BITRES)/BITRES=28.125 bits. By using fractional bits there will be much less truncation loss for many of the N(l, k) PVQ codeword sizes, and especially when a codec is using many calls/instances of a PVQ-quantizer, this will increase the codec's efficiency.

One general issue with structured vector quantization is to find a suitable overall compromise including the methods for efficient search, efficient codeword indexing and efficient codeword de-indexing.

Long index codewords (e.g. a 400 bit integer codeword) gives larger complexity overhead in indexing and deindexing calculations (and special software routines will be needed for multiplying and dividing these large integers in the long codeword composition and decomposition).

Short index code words can use efficient hardware operators (e.g. Single Instruction Multiple Data (SIMD) instructions in a 32 bit Digital Signal Processor (DSP)), however at the cost of requiring pre-splitting of the target VQ-vectors (like in IETF/OPUS-Audio), or post-search-splitting the integer PVQ-search result-vector (like in original-CELT). These dimension splitting methods adds a transmission cost for the splitting information codeword (splitting overhead), and the shorter the possible index-codewords are, the higher number of splits are required and the result is an increased overhead for the long index codeword splitting. E.g. 16 bit short PVQ-codewords will result in many more splits than 32 bit short codewords, and thus a higher overhead for the splitting.

The PVQ (Pyramid Vector Quantizer) readily allows for a very efficient search, through L1-normalization. Typically the absolute sum normalized target vector is created, followed by vector value truncation (or rounding) and then a limited set of corrective iterations are run to reach the target L1-norm (k) for the PVQ-vector (PVQ-vec).

The problem of the previously mentioned CELT/OPUS prior art short codeword indexing schemes is that they are limited to a 32-bit integer range (unsigned 32-bit integers), and further they cannot be efficiently implemented in a DSP-architecture that only supports fast instructions for signed 32-bit integers.

SUMMARY

It is an object of the here presented technology to expand the size of the vectors indexed by PVQ that can be processed in a hardware having an optimum operation bit size.

This and other objects are met by embodiments of the proposed technology.

According to a first aspect, there is provided a method for pyramid vector quantization indexing of audio/video signals. The method comprises obtaining of an integer input vector, which integer input vector representing audio/video signal samples, which integer input vector having a number of integer-valued coefficients, extracting of a leading sign from said integer input vector, which leading sign is a sign of a terminal non-zero coefficient in the integer input vector, which terminal non-zero coefficient is one of a first non-zero coefficient and a last non-zero coefficient in the integer input vector, indexing the integer input vector with a pyramid vector quantization enumeration scheme into an output index, which output index together with the leading sign representing the audio/video signal samples, wherein the pyramid vector quantization enumeration scheme is designed for neglecting the sign of the terminal non-zero coefficient, and outputting of the output index as a first codeword and the leading sign as a second codeword into an outgoing bit stream.

In one embodiment, the extracting takes place before the enumerating. In another embodiment, extracting takes place concurrently and in cooperation with the enumerating. In one embodiment, an offset parameter, in this disclosure denoted as U(n,k), is defined as the number of integer vectors of dimension n and L1-norm of k, that does not have a leading zero, and does not have the leading value k, has a leading positive value, and has a positive next leading sign. The offset parameter U is in that embodiment used for calculation of the indexing scheme used in the enumeration. In another embodiment, the index calculation is dependent on both the U parameter and an offset parameter, in this disclosure denoted as A(n,k), being defined as the number of integer vectors of dimension n and L1-norm of k, that has a positive leading value and that does not have a leading zero. In yet another embodiment, index calculation in the enumeration is dependent partly on the enumeration procedures based on U or a combination of U and A. In other words, the enumeration may employ an initial MPVQ-leading sign enumeration stage followed by any other efficient PVQ-enumeration scheme, for the remainder of the vector.

According to a second aspect, there is provided a method for pyramid vector quantization deindexing of audio/video signals. The method comprises receiving, from an ingoing bit stream, of a leading sign as a first codeword and an input index as a second codeword, the leading sign and the input index representing audio/video signal samples, which leading sign is a sign of a terminal non-zero coefficient in an integer output vector to be created, representing the audio/video signal samples, which integer output vector having a number of integer-valued coefficients, which terminal non-zero coefficient is one of a first non-zero coefficient and a last non-zero coefficient in the integer output vector, deindexing of the input index into the integer output vector according to a pyramid vector quantization de-enumeration scheme, wherein the input index being created by an enumeration scheme is designed for neglecting the sign of the terminal non-zero coefficient, assigning of a sign of the terminal non-zero coefficient in the integer output vector according to the received leading sign, and outputting of the integer output vector.

According to a third aspect, there is provided a method for communication of audio/video signals. The method comprises encoding the audio/video samples, in an encoder of a transmitter, according to a method according to the first aspect, transmission of the output index and the leading sign from the transmitter to a receiver, where it is received as an input index and a leading sign, and decoding, in a decoder in the receiver, said input index and said leading sign according to a method according to the second aspect.

According to a fourth aspect, there is provided an encoder for indexing of audio/video signals by pyramid vector quantization. The encoder is operative to obtain an integer input vector, which integer input vector representing the audio/video signal samples, which integer input vector having a number of integer-valued coefficients, extract a leading sign from the integer input vector, which leading sign is a sign of a terminal non-zero coefficient in the integer input vector, which terminal non-zero coefficient is one of a first non-zero coefficient and a last non-zero coefficient in the integer input vector, index the integer input vector with a pyramid vector quantization enumeration scheme into an output index, which output index together with the leading sign representing the audio/video signal samples, wherein the pyramid vector quantization enumeration scheme is designed for neglecting the sign of the terminal non-zero coefficient, and to output the leading sign as a first codeword and the output index as a second codeword into an outgoing bit stream.

According to a fifth aspect, there is provided a decoder for deindexing of audio/video signals by pyramid vector quantization. The decoder is operative to receive, from an ingoing bit stream, a leading sign as a first codeword and an input index as a second codeword, the leading sign and the input index representing audio/video signal samples, which leading sign is a sign of a terminal non-zero coefficient in an integer output vector to be created, representing the audio/video signal samples, which integer output vector having a number of integer-valued coefficients, which terminal non-zero coefficient is one of a first non-zero coefficient and a last non-zero coefficient in the integer output vector, deindex the input index into a the integer output vector according to a pyramid vector quantization de-enumeration scheme, wherein the input index being created by an enumeration scheme is designed for neglecting the sign of the terminal non-zero coefficient, assign a sign of the terminating non-zero coefficient according to the received leading sign, and to output the integer output vector.

According to a sixth aspect, there is provided an encoder for pyramid vector quantization indexing of audio/video signal samples. The encoder comprises an input module for obtaining an integer input vector, which integer input vector representing the audio/video signal samples, which integer input vector having a number of integer-valued coefficients. The encoder further comprises an extracting module for extracting a leading sign from the integer input vector. The leading sign is a sign of a terminal non-zero coefficient in the integer input vector. The terminal non-zero coefficient is one of a first non-zero coefficient and a last non-zero coefficient in the integer input vector. The encoder further comprises an indexing module for indexing the integer input vector with a pyramid vector quantization enumeration scheme into an output index, which output index together with the leading sign representing the audio/video signal samples, wherein the pyramid vector quantization enumeration scheme is designed for neglecting the sign of the terminal non-zero coefficient. The encoder further comprises an output module for outputting the leading sign as a first codeword and the output index as a second codeword into an outgoing bit stream.

According to a seventh aspect, there is provided a decoder for decoding of audio/video signal samples. The decoder comprises a receiver for receiving a leading sign as a first codeword and an input index as a second codeword from an ingoing bit stream. The leading sign and the input index representing audio/video signal samples. The leading sign is a sign of a terminal non-zero coefficient in an integer output vector to be created, representing the audio/video signal samples. The integer output vector has a number of integer-valued coefficients. The terminal non-zero coefficient is one of a first non-zero coefficient and a last non-zero coefficient in the integer output vector. The decoder further comprises a deindexing module for deindexing the input index into the integer output vector according to a pyramid vector quantization de-enumeration scheme, wherein the input index being created by an enumeration scheme is designed for neglecting the sign of the terminal non-zero coefficient. The decoder further comprises an assigning module for assigning a sign of the terminal non-zero coefficient in the integer output vector according to the received leading sign. The decoder further comprises an output module for outputting the integer output vector.

According to an eighth aspect, there is provided a network node comprising an encoder according to the fourth or sixth aspect and/or a decoder according to the fifth or seventh aspect.

According to a ninth aspect, there is provided a user equipment comprising an encoder according to the fourth or sixth aspect and/or a decoder according to the fifth or seventh aspect.

According to a tenth aspect, there is provided a computer program for encoding of audio/video signal samples, which computer program comprises instructions, which when executed by at least one processor, cause the processor(s) to obtain an integer input vector, which integer input vector represents the audio/video signal samples. The integer input vector has a number of integer-valued coefficients. The computer program comprises further instructions, which when executed by the processor(s), cause the processor(s) to extract a leading sign from the integer input vector. The leading sign is a sign of a terminal non-zero coefficient in the integer input vector. The terminal non-zero coefficient is one of a first non-zero coefficient and a last non-zero coefficient in the integer input vector. The computer program comprises further instructions, which when executed by the processor(s), cause the processor(s) to index the integer input vector with a pyramid vector quantization enumeration scheme into an output index, which output index together with said leading sign representing the audio/video signal samples. The pyramid vector quantization enumeration scheme is designed for neglecting the sign of said terminal non-zero coefficient. The computer program comprises further instructions, which when executed by the processor(s), cause the processor(s) to output the leading sign as a first codeword and the output index as a second codeword into an outgoing bit stream.

According to an eleventh aspect, there is provided a computer program for decoding of audio/video signals, which computer program comprises instructions, which when executed by at least one processor, cause the processor(s) to receive a leading sign as a first codeword and an input index as a second codeword from an ingoing bit stream. The leading sign and the input index representing audio/video signal samples. The leading sign is a sign of a terminal non-zero coefficient in an integer output vector to be created, representing the audio/video signal samples. The integer output vector has a number of integer-valued coefficients. The terminal non-zero coefficient is one of a first non-zero coefficient and a last non-zero coefficient in said integer output vector. The computer program comprises further instructions, which when executed by the processor(s), cause the processor(s) to deindex the input index into the integer output vector with a pyramid vector quantization de-enumeration scheme. The input index being created by an enumeration scheme is designed for neglecting the sign of the terminal non-zero coefficient. The computer program comprises further instructions, which when executed by the processor(s), cause the processor(s) to assign a sign of the terminating non-zero coefficient according to the received leading sign. The computer program comprises further instructions, which when executed by the processor(s), cause the processor(s) to output the integer output vector.

According to a twelfth aspect, there is provided a carrier comprising the computer program of at least one of the tenth and eleventh aspect. The carrier is one of an electronic signal, an optical signal, an electromagnetic signal, a magnetic signal, an electric signal, a radio signal, a microwave signal, or a computer-readable storage medium.

One advantage with the here presented techniques is that it reduces the dynamic range necessary for the required indexing offsets, thereby reducing the demands on the accepted bit size of the used hardware.

The indexing algorithm preferably iteratively decomposes the PVQ-structure and indices into leading sign sections. The decomposition is made in such a way that independently of the number of non-zero elements in the found PVQ-vector to index, always one leading sign is extracted. This low complex sign extraction further enables the creation of a reduced dynamic range for runtime calculated PVQ indexing offsets.

As one particular example, the improved indexing and de-indexing algorithms will enable the use of 33 bit PVQ-indices in 32-bit DSP Hardware, with marginal additional cost in terms of overall MOPS, RAM, ROM and Program Read-Only Memory (P-ROM). Further the algorithm will enable the use of 32-bit PVQ-indices in a DSP Hardware only supporting signed 32 bit arithmetic.

Other advantages will be appreciated when reading the detailed description.

BRIEF DESCRIPTION OF THE DRAWINGS

The embodiments, together with further objects and advantages thereof, may best be understood by making reference to the following description taken together with the accompanying drawings, in which:

FIG. 4 is a tabled structure view of an embodiment of an offset and its relation to the total number of vectors in the structure;

FIG. 8 is a tabled high level structure view of an embodiment of a basic MPVQ iteration;

FIG. 24 illustrates an example of sign pre-shifting that utilizes N=8 and K=13.

DETAILED DESCRIPTION

The embodiments, together with further objects and advantages thereof, may best be understood by making reference to the following description taken together with the accompanying drawings.

Throughout the drawings, the same reference designations are used for similar or corresponding elements.

The indexing algorithm iteratively decomposes the PVQ-structure and indices into leading sign sections. The decomposition is made in such a way that independently of the number of non-zero elements in the found PVQ-vector to index, always one leading sign is extracted. This low complex sign extraction further enables the creation of a reduced dynamic range for runtime calculated PVQ indexing offsets.

The PVQ indexing offsets are used in PVQ-index composition and in the PVQ-index decomposition. As the structured PVQ-quantizer intrinsically can handle a large variation in dimension (l) and unit pulses (k), and thus in bit rate, the offsets are usually only calculated for the current dimension to be encoded and the current number of unit pulses. The bit rate corresponds to log2($N_{PVQ}$(l,k), resulting in a huge amount of possible PVQ offsets. The offsets are stored in a dynamic RAM. However, an l,k-limited PVQ quantizer implementation may use table lookup to store the indexing/de-indexing offsets.

For a better understanding of the proposed technology, it may be useful to refer to extracts of IETF/OPUS search/indexing/de-indexing prior art description, collected in Appendix A.

Figure 1:
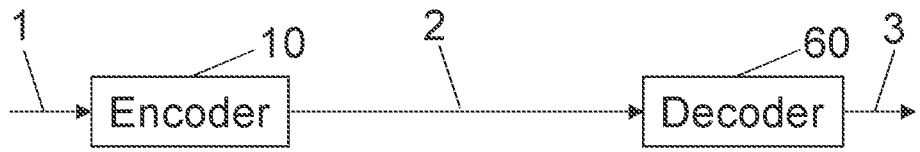
FIG. 1 is a schematic illustration of an example audio coding system.

In FIG. 1, an example audio coding system using the scheme presented in the present description is illustrated. This is an example audio codec system with an encoder 10 and a decoder 60 using MPVQ indexing and de-indexing. The first part corresponds to the parts comprised in an encoder 10 and the second part of the figure corresponds to the parts comprised in a decoder 60. An input sample 1 is provided to the encoder 10. The encoder 10 provides a bit stream 2 representing the input vector as at least a MPVQ index and a leading sign. A bit stream 2', preferably essentially equal to the bit stream 2 from the encoder 10, is provided to the decoder 60, where the decoder decodes the MPVQ index and the leading sign to a reconstructed sample 3. Typically, the MPVQ index and the leading sign are provided as separate codewords.

Figure 2:
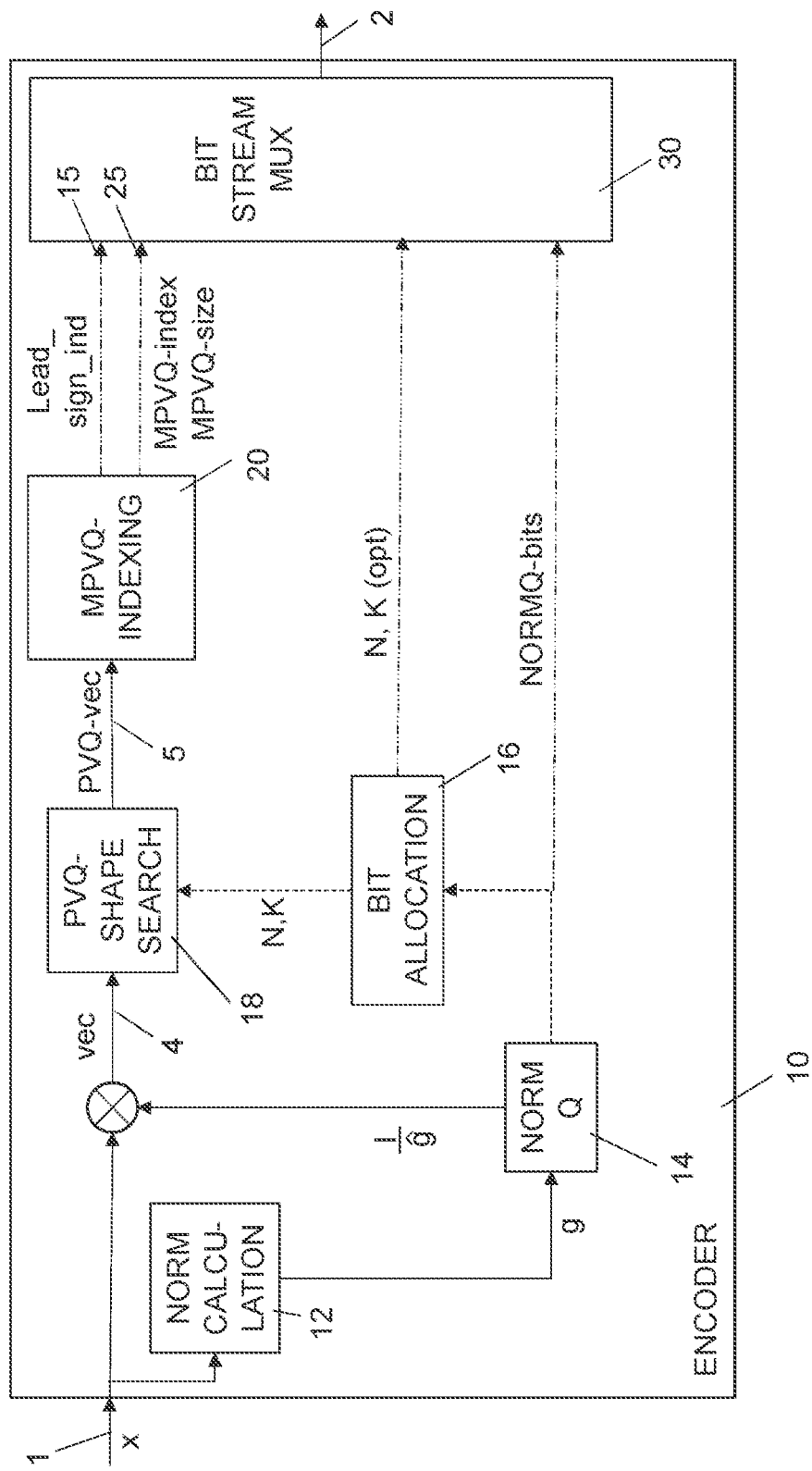
FIG. 2 is a schematic block diagram of an embodiment of an encoder.

An embodiment of an encoder 10 is illustrated in more detail in FIG. 2. The input sample 1, representing an audio/video sample x is received. In a norm calculator 12, a norm factor g is computed. A norm quantizer 14 creates norm quantization bits NORMQ-bits representing the norm of the input vector. These bits are typically provided to be included in the Bit stream. The input vector is normalized by the norm factor into a normalized vector 4. The norm quantizer 14 also optionally provided the norm factor, e.g. as NORMQ-bits, to a bit allocation section 16, which calculates, or retrieves from look-up tables, suitable values of N and K, i.e. the dimension of the integer vector and the total number of unit pulses. These values may optionally be provided in the outgoing bit-stream or be derived at the receiving side from preceding parameters in the bit stream. A PVQ shape search section 18 converts the normalized vector 4 into an integer input vector 5 for PVQ. The integer input vector 5 is provided to a MPVQ-indexing section 20, where the actual MPVQ indexing takes place. This will be discussed more in detail further below. A leading sign 15, as a first codeword, and an output index, as a second codeword, an MPVQ index 25, typically accompanied by the MPVQ size are output from the MPVQ-indexing section 20 to a bit stream multiplexor, MUX, 30. There, the different information quantities are merged into a single bit stream 2, being output from the bit stream MUX 30.

Figure 3:
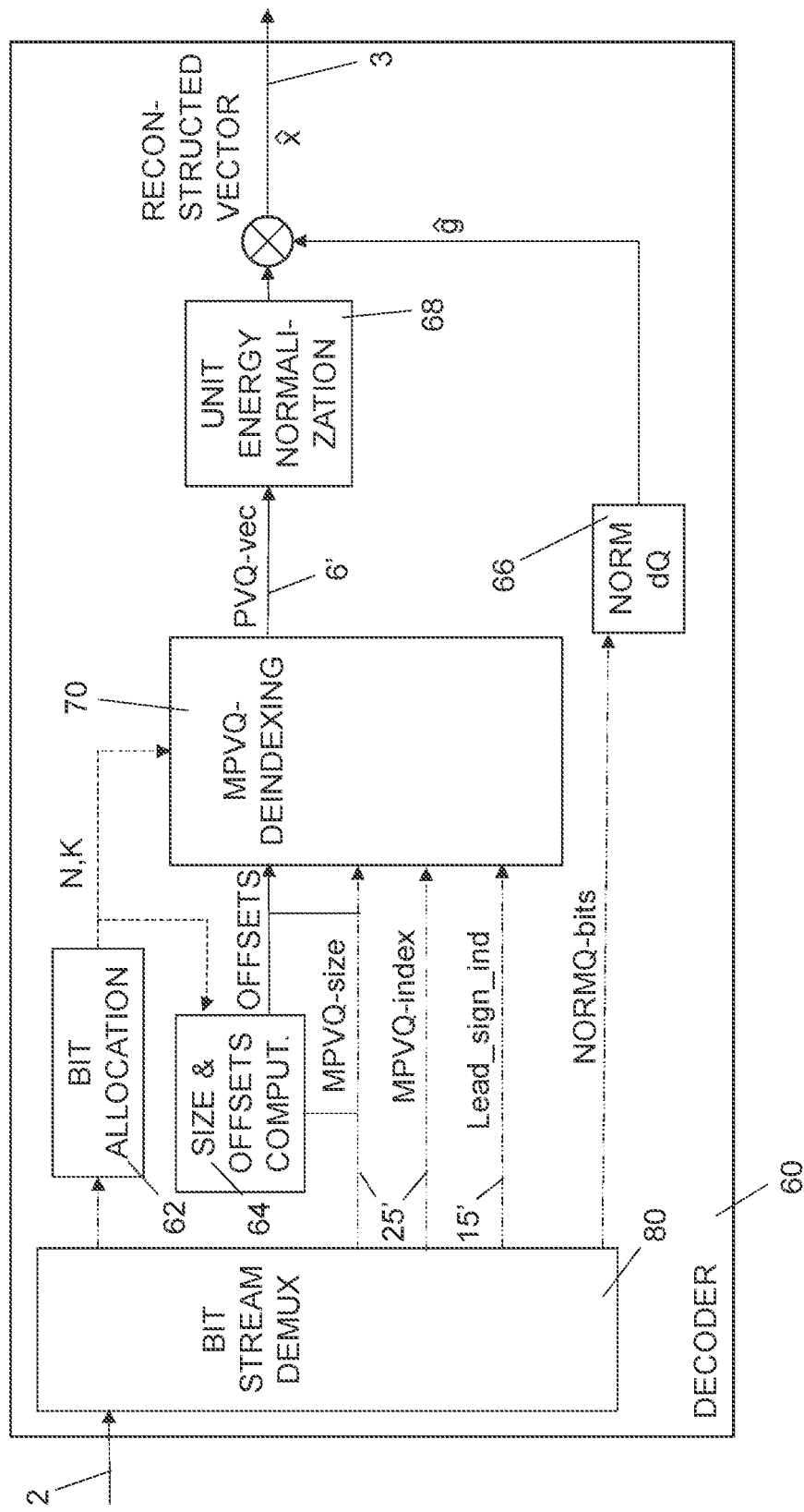
FIG. 3 is a schematic block diagram of an embodiment of a decoder.

An embodiment of a decoder 60 is illustrated in more detail in FIG. 3. An incoming bit stream 2' is provided to a bit stream DEMUX 80. Here the different parts of the information is divided into parts. Information supporting the bit allocation, such as N and K values or NORMQ-bits, is provided to a bit allocation section 62, outputting relevant values of N and K to a size/offsets calculation section 64 and a MPVQ-deindexing section 70. The size/offsets calculation section 64 calculates offsets 8, based on the N and K values as well as the MPVQ size obtained from the information 25' of reconstructed MPVQ index 25', typically accompanied by the MPVQ size, and provided to the MPVQ deindexing section 70. The reconstructed MPVQ index 25', as a second codeword, and the reconstructed leading sign 15', as a first codeword, are also provided to the MPVQ deindexing section 70, where the actual MPVQ deindexing takes place. This will be discussed more in detail further below. An integer output vector 6', being a reconstruction of the integer input vector in the encoder, is output to a unit energy normalization section 68 in which the normalization is secured. A norm de-quantizer 66 uses the NORMQ-bits to provide a norm factor $\hat{g}$. The norm factor is then used to form the final output vector $\hat{x}$ being a reconstructed sample 3 of the original audio/video sample.

It should be noted that the MPVQ-scheme is not limited to the particular system in the FIGS. 2 and 3, but can also be employed for indexing of any PVQ-based quantization system, e.g. time domain signals in a Linear Predictive (LP) Vocoder or transform domain coefficients in a video codec.

For instance, in FIGS. 2 and 3 the "BITSTREAM MUX" and "BITSTREAM DEMUX" blocks may optionally employ an arithmetic encoder and decoder respectively, to limit the PVQ-index truncation loss as explained elsewhere in the present disclosure. The "MUX" and "DEMUX" blocks need to know the integer size (MPVQ-size) of each short PVQ-codeword, to be able to extract the right number of bits for the MPVQ(n, k) codeword. Without an arithmetic encoder/decoder the MUX/DEMUX will use ceil(log2 (MPVQ-size)) whole non-fractional bits when parsing the bit-stream for the MPVQ(n, k) short codeword. With an arithmetic encoder/decoder pair, the bit resolution and distribution function(s) employed by the arithmetic encoder/decoder pair will decide the fractional bits used by the "MUX" and "DEMUX blocks". The arithmetic encoder/decoder pair will also need the integer MPVQ-size to determine how it should parse bits (now fractional) decoded from the bit-stream.

Such operations are well known by anyone skilled in the art and are in the remaining description assumed to be a natural part of a PVQ system.

In FIG. 2, in the encoder the MPVQ-size is calculated as a part of the MPVQ-indexing loop and then provided to the MUX. In FIG. 3, the decoder, a function calculating MPVQ-offsets and MPVQ-size is called first, then the codeword is extracted from the MUX using this integer size information. The extracted index (second codeword) and the initial offsets are then provided to the MPVQ-deindexing block.

The encoder part and/or the decoder part of FIGS. 2 and 3 may in some applications be comprised in a node of a communication network, or a User Equipment. The node of the communication network may e.g. be a radio network node, e.g. a base station. The communication between the encoder part and the decoder part can be performed by wired and/or wireless transmission. The encoder part and the decoder part may also operate separately. For instance, the encoder part could be a part of a recording equipment, and the resulting bitstream could be stored for a future use. Likewise, the decoder part could be a part of a playing equipment, which for instance retrieves a bitstream from a storage and decode it into audio/video signals.

One embodiment of an MPVQ enumeration method is using an inventive combined magnitude and single leading sign bit based enumeration, $N_{PVQ}(l,k)=2*N_{MPVQ}(l,k)$, where the MPVQ scheme preferably is using an iterative additive magnitude enumeration, further preferably based on an established leading sign of the first non-zero element in the remaining vector.

The prior art, IETF/OPUS-codec is using an optimized version of the original Fischer enumeration, with improved row-by-row, direct row offset calculation recursions, fast exact-integer division through wrapping multiplication, and also direct non-recursive equation offset and size calculations (if dimension l and the number of unit pulses k, are low enough to allow for such direct calculations). See Appendix A for RFC-text description extracts of the IETF/OPUS-Audio PVQ-implementation and OPUS-c-code references. To reduce the implementation complexity in OPUS, the maximum index values for a PVQ codeword is restricted to $2^{32}-1$ (an index value that can be represented in unsigned 32 bit integer arithmetic, which is a typical format for many desktop computers).

In a first part of the presently presented technology a leading sign Modular PVQ (MPVQ) enumeration using a leading sign approach is described. This new improved MPVQ enumeration is using the same general techniques (e.g. row-by-row, direct row offset calculation recursions, exact integer division, and direct non-recursive equation offset and size calculations), but by employing another recursion scheme. The dynamics of the offset, and size calculation are reduced, enabling an efficient implementation of short PVQ-codeword indexing, with double the size (1 bit more) of the number of entries in a codeword that can be indexed and de-indexed efficiently.

This indexing/de-indexing improvement seeks in a particular example to enable a low complexity assignment procedure for 33 bit indices, extending the largest possible PVQ that can be used by 1 bit (or alternatively keep it at 1+31 bits, by modifying the enumeration so that one can use signed arithmetic for a 32 bit spanning PVQ).

Define an offset parameter $U(n,k)$ as the number of integer vectors of dimension n and L1-norm of k, that does not have a leading zero, and does not have the leading value k, has a leading positive value, and has a positive leading sign. The leading sign is the first sign encountered after the current value in the direction of the recursion.

Define an offset parameter $A(n,k)$, as the number of integer vectors of dimension n and L1-norm of k, that has a positive leading value and that does not have a leading zero.

It then follows that $A(n,k)=1+2*U(n,k)$. The "1" comes from the single initial-"k" valued vector, and the factor "2" is due to positive and negative sign possibility of the next leading sign. $A(n, k)$ is also equal to the $(N_{PVQ}(n,k-1)+N_{PVQ}(n-1,k-1))/2$, a sum which have been used as an indexing offset in prior art.

See FIG. 4 for a tabled structured view of $U(n,k)$ and its relation to the total number of vectors in the MPVQ(n, k) structure with $N_{MPVQ}(n, k)$ vectors. The figure illustrates a high level schematic view of an embodiment of a basic MPVQ-iteration including the preferred Least Significant Bit (LSB) leading sign enumeration variation, using LSB first "interleaving" of the next leading sign information. In a preferred solution the leading sign interleaving is performed for each pos[0] unique amplitude k_delta, e.g. k_delta=k−1 or k−2 block. For pos[0] value="k", all unit pulses are consumed in pos[0] and the iteration can stop. For pos[0] value being non-zero, positive or negative next leading sign, the first encountered non-zero position sign requires 1 bit of information. This is stored as the LSB bit in the always even sized "2*U(n−k)" subsection. For pos[0] value="k", iteration is extended to pos[0] without any new leading sign info.

The basic indexing/enumeration approach of this first part is described in the following. The PVQ vector to index/enumerate is known to be in the range $[0 \ldots 2^{B+1}-1]$ and fits into B+1 bits. Here, B=32 bits is typical for current DSP hardware. For instance if one has PVQ(N,K), i.e. dimension N, K unit pulses, the number of indices $N_{PVQ}<=(2^{B+1}-1)$.

Figure 5:
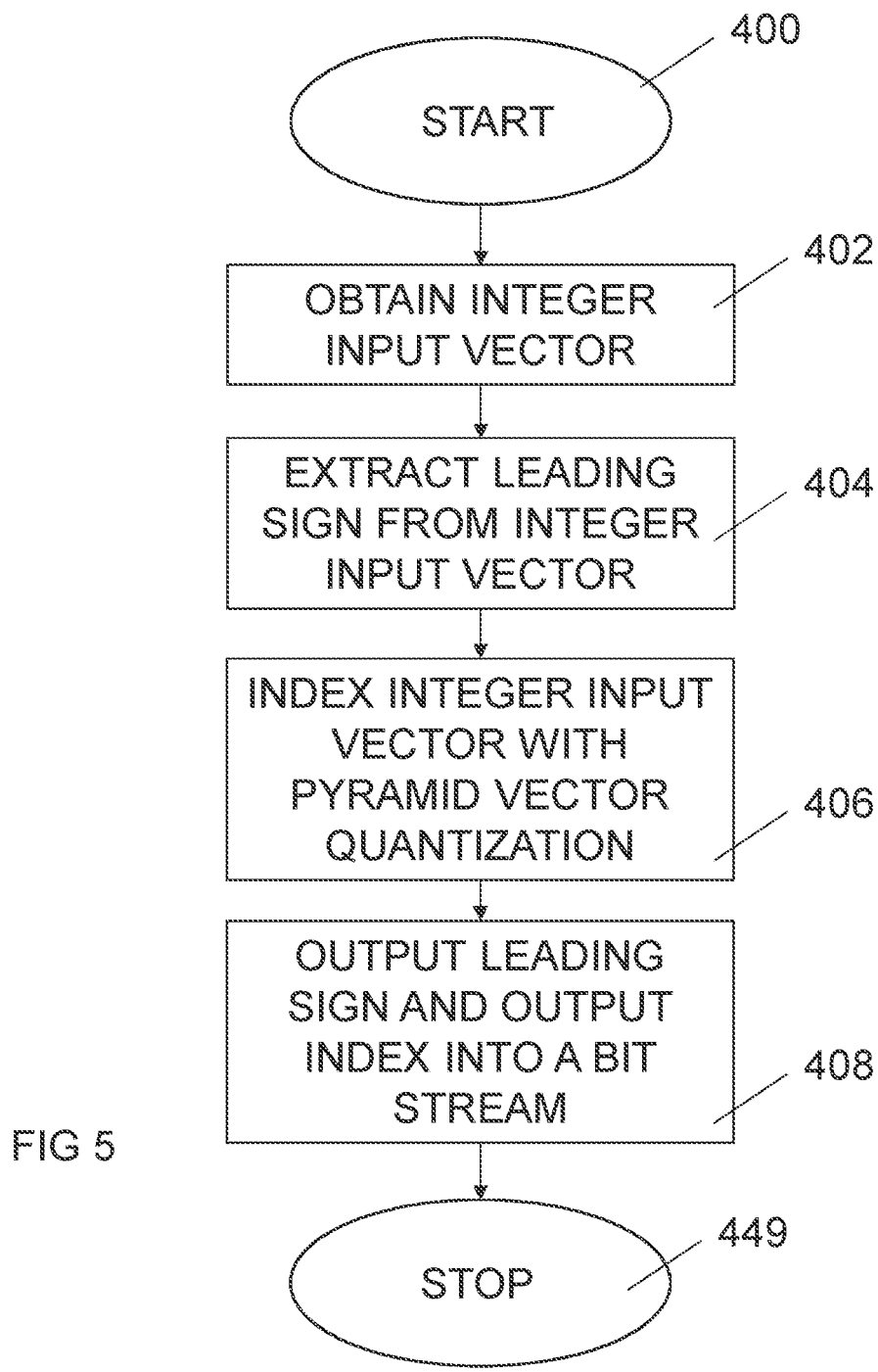
FIG. 5 is a flow diagram of steps of an embodiment of a method for pyramid vector quantization indexing of audio/video samples.

FIG. 5 illustrates a flow diagram of steps of an embodiment of a method for pyramid vector quantization indexing of audio/video samples. The method starts in step 400. In step 402, an integer input vector representing the audio/video signal samples is obtained. The integer input vector has a number of integer-valued coefficients. In step 404, a leading sign is extracted from the integer input vector. The leading sign is a sign of a terminal non-zero coefficient in the integer input vector. The terminal non-zero coefficient is one of a first non-zero coefficient and a last non-zero coefficient in the integer input vector. In step 406, the integer input vector is indexed with a pyramid vector quantization enumeration scheme into an output index, which output index together with the leading sign representing the audio/video signal samples. The pyramid vector quantization enumeration scheme is designed to neglect the sign of said terminal non-zero coefficient. In alternative embodiments, step 406 can be performed concurrently as, in combination with or before step 404. In step 408, the leading sign and the output index are outputted as a first codeword and a second codeword, respectively, into an outgoing bit stream. The procedure ends in step 449.

In a particular embodiment, the step of indexing 406 is performed by an iterative enumeration procedure. In a further particular embodiment, the iterative enumeration procedure comprises repetition of an iteration step, in which one current coefficient of the integer input vector is selected for consideration. The iteration step in turn comprises finding of an offset parameter that is associated with all coefficients of said integer input vector processed prior to the current coefficient of the integer input vector and increasing of an accumulated index in dependence of the offset parameter. The repetition is continued with coefficients of the integer input vector being selected one after the other as the current coefficient at least until all coefficients in the integer input vector has been considered. The iterative enumeration procedure comprises a terminating step in which the output index is set equal to the accumulated index after all iteration steps have been ended.

Figure 6:
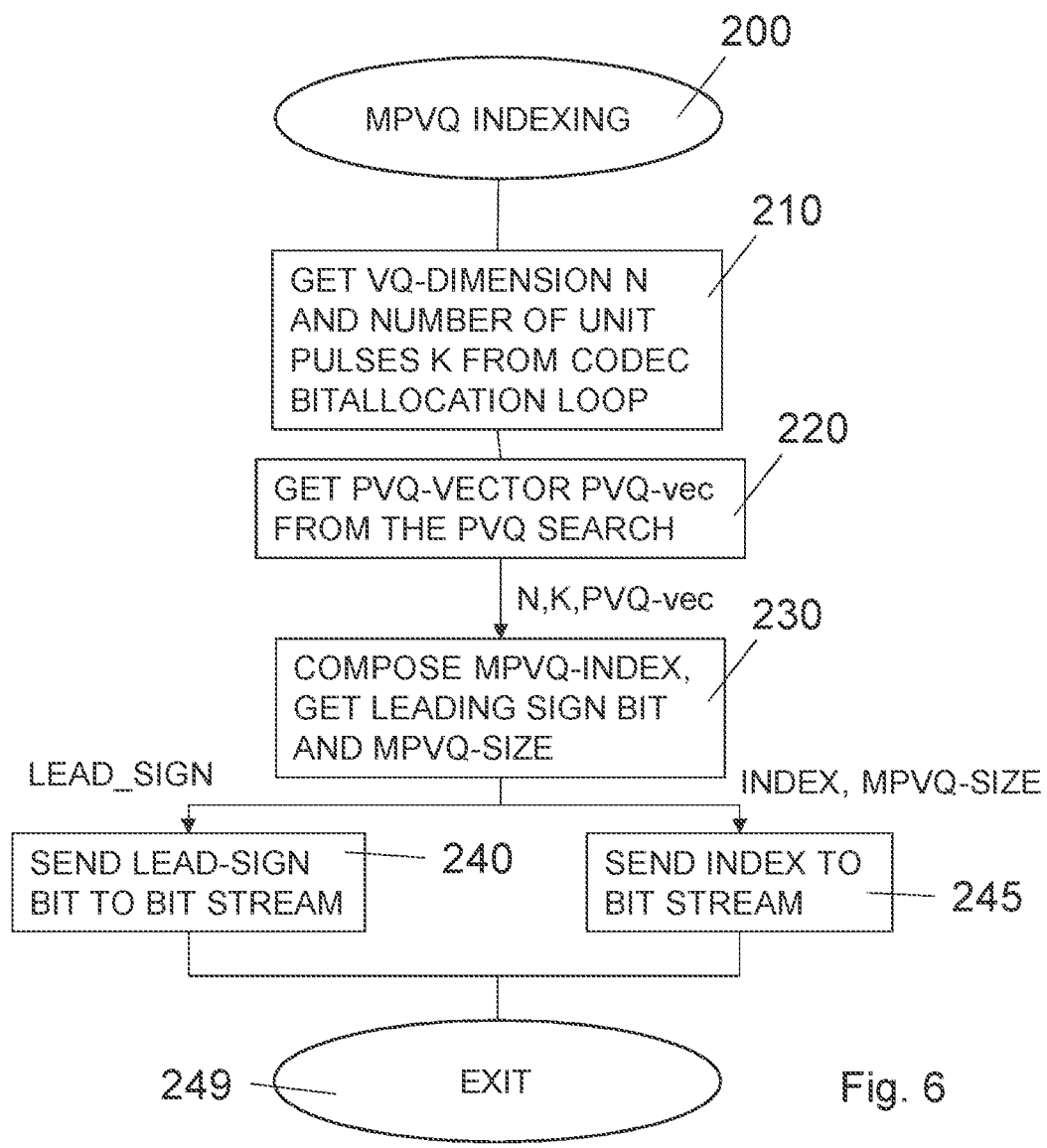
FIG. 6 is a flow diagram of steps of an embodiment of a MPVQ indexing on a general level.

FIG. 6 illustrates an embodiment of a MPVQ indexing on a general level. Detailed block diagrams implementing the sending side aspects of MPVQ-indexing are following below. The MPVQ indexing process starts in step 200, in step 210, the VQ dimension N and number of unit pulses K is achieved from the codec bit allocation loop. In step 220, the PVQ vector "PVQ-vec" is achieved from the PVQ search. In step 230, the MPVQ index is composed by finding the leading sign bit and MPVQ size. The leading sign is in step 240 sent to the bit stream and the index is in step 245 sent to the bit stream. The procedure is exited in step 249.

In comparison with the flow diagram of FIG. 5, steps 210 and 220 can be considered as being comprised in the step 402. Steps 404 and 406 are similarly considered to be comprised in step 230. Finally, the steps 240 and 250 are considered to be comprised in step 408.

Figure 7A:
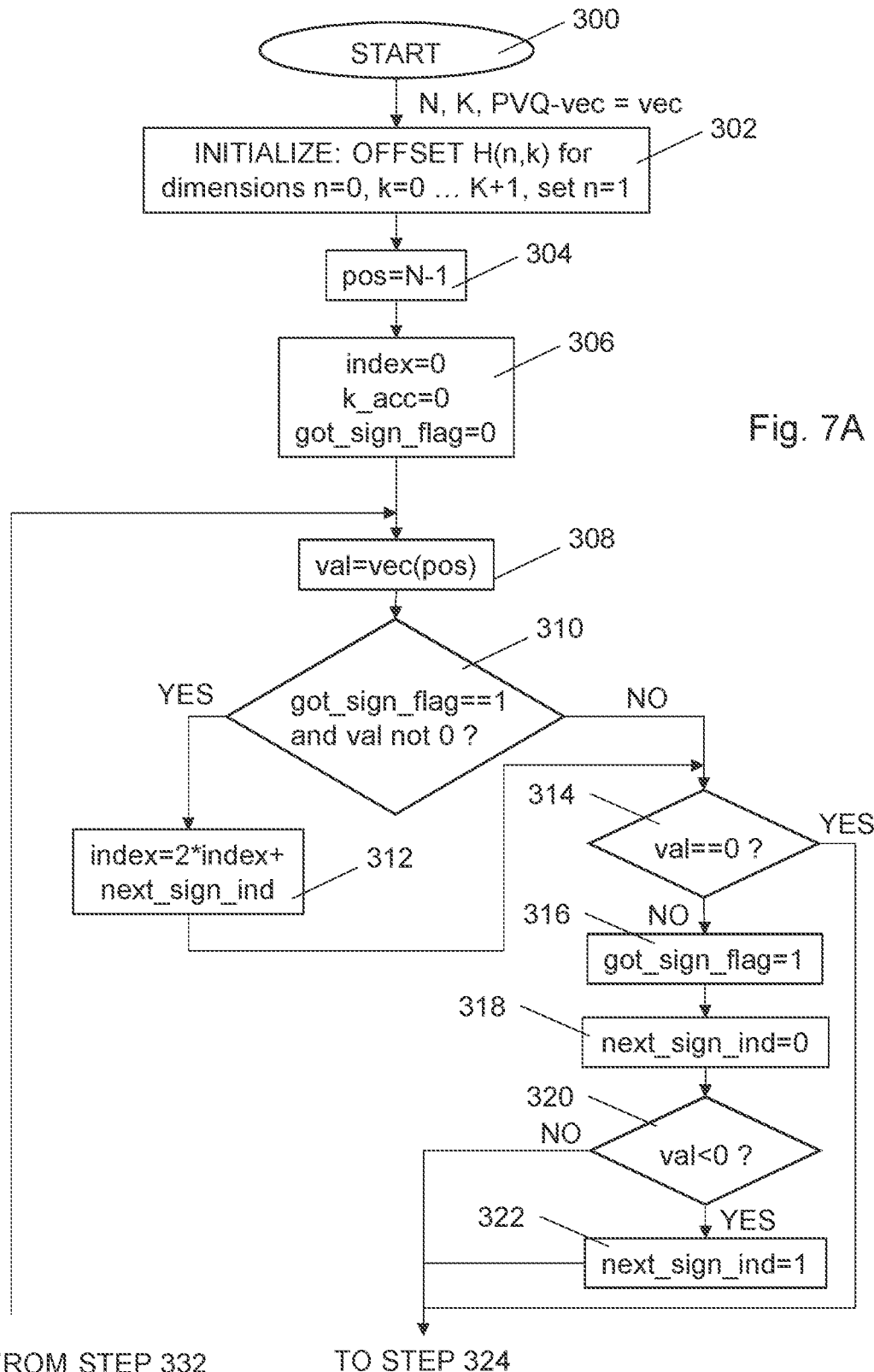
FIG. 7A-B is a flow diagram of steps of an embodiment of a method for MPVQ-index composition.
Figure 7B:
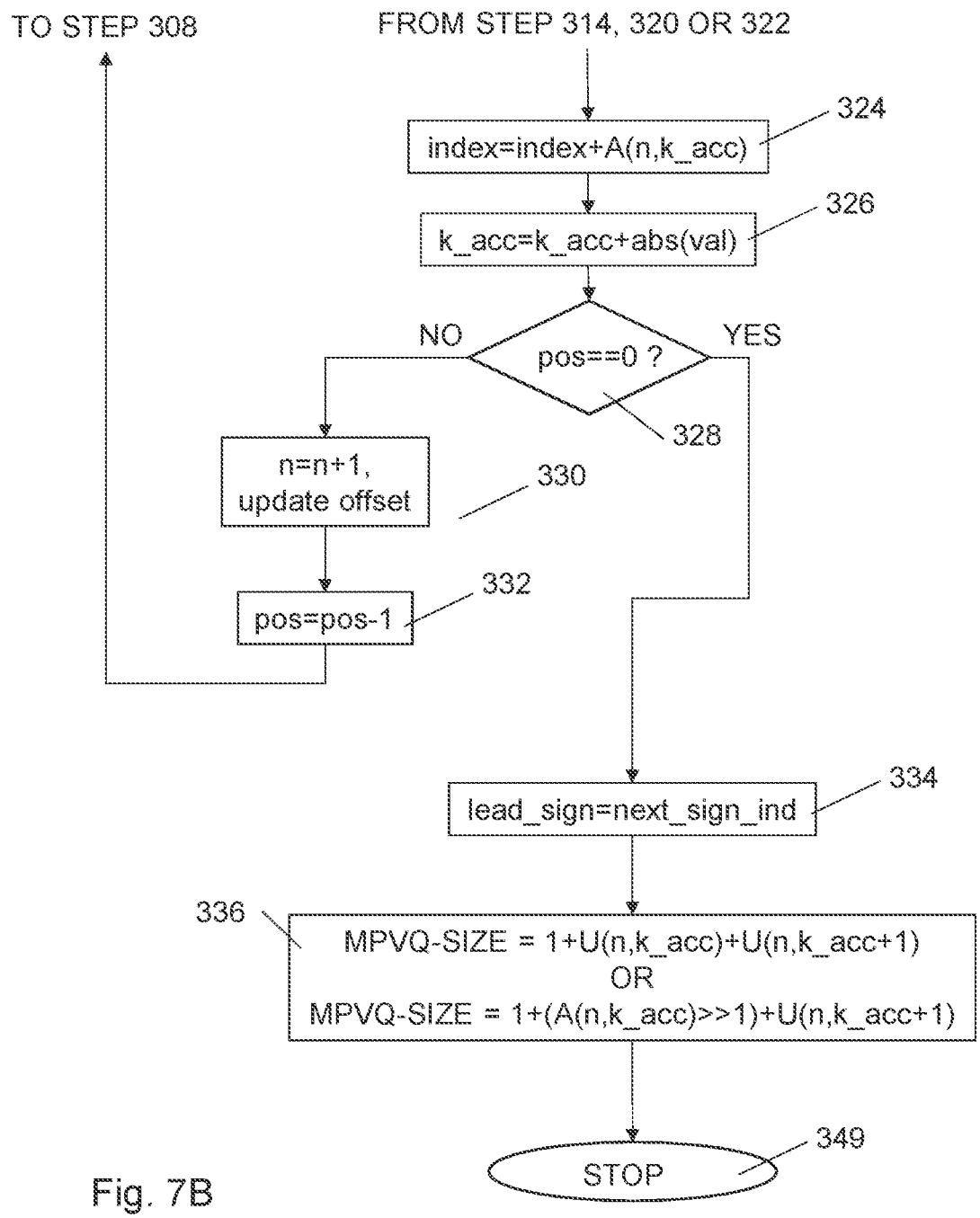

FIG. 7A-B illustrate an embodiment of MPVQ-index composition, and is e.g. provided as step 230 of FIG. 6. In FIG. 7A-B, the composition of the MPVQ index and the finding of the leading sign and MPVQ size starts in step 300. This embodiment is based on a solution with a next sign of the vector in a LSB position. In step 302, the process is initialized by a known offset iteration base case. In step 304, the current position parameter is set. The indexing is in this embodiment run from the end of the vector towards the beginning. The indexing is run in reverse position order compared to deindexing, see further below. This means that when increasing the accumulated index in each iteration step as caused by a leading sign, the accumulated index is given a least significant bit in dependence of a previous leading sign in the integer input vector.

In alternative embodiments, the vector position order can be changed between the indexing and de-indexing.

In step 306, an accumulated index is initiated to zero. The parameter k_acc denotes the accumulated unit pulses that are analyzed, and is initiated to zero. The flag got_sign_flag, indicating whether or not a sign is extracted, and is initially also set to zero. In step 308, a current coefficient "vec(pos)" from the vector is considered as a parameter "val". In step 310, if a first sign has been found and the current coefficient is not equal to zero, the process continues to step 312, otherwise, the process continues directly to step 314. In step 312, a saved leading sign information from a previous step is put in a LSB. A negative sign in a previous step corresponds to the value next_sign_ind=1 and a positive sign corresponds to the value next_sign_ind=0. In step 314, the search for the present sign begins. If the value is equal to zero, no new sign is present and the last sign should be forwarded, which means that the process continues directly to step 324 (of FIG. 7B). If the current coefficient is not zero, first the flag that a sign has been found is set in step 316. This is really only necessary for the first sign, but in the present embodiment, to simplify the flow, the flag is set every time a non-zero value is found. In step 318, the next_sign_ind, i.e. the indicator of the next sign is set to indicate a positive sign. In step 320, it is checked whether the value of the current coefficient really is positive. If it is found to be like that, the flow continues to step 324, otherwise, the next_sign_ind, i.e. the indicator of the next sign is changed to indicate a negative sign.

In step 324, the accumulated index is increased in accordance with an offset value based on the present dimension n and the accumulated unit pulses that are analyzed. In other words, the accumulated index is counted up a number that corresponds to the number of integer vectors of dimension n and L1-norm of k_acc, that has a positive leading value and that does not have a leading zero. In the present embodiment, the A offset is used for modification of the accumulated index. As will be discussed further below, in other embodiments, the U offset can be used instead, or a combination of A and U offsets can be used. In step 326, the k_acc parameter is then updated by adding the value of current coefficient. If not all positions in the vector has been considered, i.e. the parameter "pos" is larger than zero, and a next repetition is prepared. In step 330, the dimension is increased, and the offsets are updated, as will be discussed more in detail further below. In step 332, the position of the current coefficient is reduced one step. The process then returns to step 308 (FIG. 7A) for another repetition with a new current coefficient from the integer input vector to be considered.

If all positions in the vector has been considered, the flow continues to step 334, where the leading sign is set equal to the current next sign indication. In other words, the very first sign in the vector has not been included in the accumulated index and is extracted as a separate parameter which do not influence the rest of the indexing. This means that the pyramid vector quantization enumeration scheme that is used neglects the sign of the first non-zero coefficient. Instead, this sign is "pushed" out from the indexing process and is denoted as the "leading sign" or "lead_sign". The other signs are typically also extracted during the iteration but will also influence the index accumulation. Finally in step 336, the MPVQ size is calculated, which in the present embodiment can be performed in two different ways. The accumulated index is exiting this procedure as the output index of the MPVQ pyramid vector quantization enumeration scheme. The procedure ends in step 349.

The above structure operates to shift all the signs of the non-zero vector values to be coded one step, to the next, in a selected direction, non-zero coefficient. If there is no next position, i.e. the process is outside the original vector, store that sign as the remaining lead_sign. This sign shifting can be done as a separate preprocessing step, as can be seen further below, or in a preferred embodiment inside the overall dimension iteration loop, as above. The lead_sign (+1 or −1) can now be transmitted as a separate bit in the bit stream, as lead_sign_ind (0 or 1).

The remaining shifted signs and the amplitudes of the original vector are encoded with a modified indexing/enumeration scheme that use the fact that always exactly one sign has been extracted/shifted out from the original PVQ-vector. This extraction is independent of the number of non-zero elements in the original PVQ-target vector PVQ-vec.

Three examples are described here below, in order to support the understanding of the structure of FIGS. 7A and 7B. The examples are of an extremely low complexity in order to keep the description limited and to make the total example perceivable. However, in typical real examples, the dimensions and the number of unit pulses are far higher. The principles are however the same.

In a first example, having a dimension N=3 and number of unit pulses K=5, consider an integer input vector of [2,2,−1]. The initializing is performed and "pos" is set to "2", index, k_acc to "0", dimension n=1, and the got_sign_flag is unset (=0). The first value "val" is selected as coefficient 2 of the vector, i.e. −1. (The coefficients of the vector are numbered: 0, 1, and 2.) Since no non-zero value has been evaluated yet, no sign has been extracted, and the flow skips the adjustment of the index based on detected signs. The flow thereby passes directly to the evaluation of the value "val", which is not identical to zero. This trigs the sign flag to be set. A first sign has been detected, and next_sign_ind is set according to the detected sign, in this case next_sign_ind=1, i.e. a negative value (−1). The accumulated index is then counted up by an offset A(1,0), which corresponds to the number of integer vectors of dimension 1 and L1-norm of 0, that has a positive leading value and that does not have a leading zero. A(1,0) is equal to 0. The accumulated index is now index=0. The accumulated k-parameter k_acc is then updated by the absolute value of "val", i.e. by 1 unit, i.e. k_acc=1.

A next repetition is prepared by increasing the number n by 1, i.e. n=2, and decreasing the position indicator "pos" by 1, e.g. pos=1. The flow returns to step 308 and a new value of position 1 is selected, i.e. val=vec(1)=2 in our example. The sign flag "got_sign_flag" indicates that a sign is detected and since the present value "val" is not equal to zero, the "next_sign_ind" is added to the accumulated index "index" as a LSB, giving an accumulated index of 1 (=2*0+ 1). The flow continues to the evaluation of the value "val", which is again not identical to zero. The next_sign_ind is set according to the detected sign, in this case next_sign_ind=0, i.e. a positive value (2). The accumulated index is then counted up by an offset A(2,1), which corresponds to the number of integer vectors of dimension 2 and L1-norm of 1, that has a positive leading value and that does not have a leading zero. A(2,1) is equal to 1. The accumulated index is now index=2. The accumulated k-parameter k_acc is then updated by the absolute value of vec(1), i.e. by 2 units, i.e. k_acc=3.

A next repetition is prepared by increasing the number n by 1, i.e. n=3, and decreasing the position indicator "pos" by 1, e.g. pos=0. The flow returns to step 308 and a new value of position 0 is selected, i.e. val=vec(0)=2 in our example. The sign flag "got_sign_flag" indicates that a sign is detected and since the present value "val" is not equal to zero, the "next_sign_ind" is added to the accumulated index "index" as a LSB, giving an accumulated index of 4 (=2*2+ 0). The flow continues to the evaluation of the value "val", which is again not identical to zero. The next_sign_ind is set according to the detected sign, in this case next_sign_ind=0, i.e. a positive value (2). The accumulated index is then counted up by an offset A(3,3), which corresponds to the number of integer vectors of dimension 3 and L1-norm of 3, that has a positive leading value and that does not have a leading zero. A(3,3) is equal to 13. The accumulated index is now index=17. The accumulated k-parameter k_acc is then updated by the absolute value of "val", i.e. by 2 units, i.e. k_acc=5.

The accumulated k_acc is now equal to the maximum K=5, and all positions of the vector are considered. The output index is therefore equal to the present accumulated index, i.e. output index 17. The last identified sign is still not included in the accumulated index and is instead extracted as a separate parameter, i.e. leading sign="+1" (next_sign_ind=0).

In a second example, having a dimension N=3 and number of unit pulses K=5, consider an integer input vector of [−4,0,−1]. The initializing is performed and "pos" is set to "2", index, k_acc to "0", dimension n=1, and the got_sign_flag is unset (=0). The first value "val" is selected as coefficient 2 of the vector, i.e. −1. Since no non-zero value has been evaluated yet, no sign has been extracted, and the flow skips the adjustment of the index based on detected signs. The flow thereby passes directly to the evaluation of the value "val", which is not identical to zero. This trigs the sign flag to be set. A first sign has been detected, and next_sign_ind is set according to the detected sign, in this case next_sign_ind=1, i.e. a negative value (−1). The accumulated index is then counted up by an offset A(1,0), which corresponds to the number of integer vectors of dimension 1 and L1-norm of 0, that has a positive leading value and that does not have a leading zero. A(1,0) is equal to 0. The accumulated index is now index=0. The accumulated k-parameter k_acc is then updated by the absolute value of "val", i.e. by 1 unit, i.e. k_acc=1.

A next repetition is prepared by increasing the number n by 1, i.e. n=2, and decreasing the position indicator "pos" by 1, e.g. pos=1. The flow returns to step 308 and a new value of position 1 is selected, i.e. val=vec(1)=0 in our example. The sign flag "got_sign_flag" indicates that a sign is detected but since the present value "val" is equal to zero, the "next_sign_ind" is saved for the next repetition. The flow continues to the evaluation of the value "val", which is identical to zero. The next_sign_ind is therefore not changed. The accumulated index is then counted up by an offset A(2,1), which corresponds to the number of integer vectors of dimension 2 and L1-norm of 1, that has a positive leading value and that does not have a leading zero. A(2,1) is equal to 1. The accumulated index is now index=1. The accumulated k-parameter k_acc is then updated by the absolute value of "val", i.e. by 0 units, i.e. still k_acc=1.

A next repetition is prepared by increasing the number n by 1, i.e. n=3, and decreasing the position indicator "pos" by 1, e.g. pos=0. The flow returns to step 308 and a new value of position 0 is selected, i.e. val=vec(0)=−4 in our example. The sign flag "got_sign_flag" indicates that a sign is detected and since the present value "val" is not equal to zero, the "next_sign_ind", emanating from vector position 2, is added to the accumulated index "index" as a LSB, giving an accumulated index of 3 (=2*1+1). The flow continues to the evaluation of the value "val", which is not identical to zero. The next_sign_ind is set according to the detected sign, in this case next_sign_ind=1, i.e. a negative value (−4). The accumulated index is then counted up by an offset A(3,1), which corresponds to the number of integer vectors of dimension 3 and L1-norm of 1, that has a positive leading value and that does not have a leading zero. A(3,1) is equal to 1. The accumulated index is now index=4. The accumulated k-parameter k_acc is then updated by the absolute value of "val", i.e. by 4 units, i.e. k_acc=5.

The accumulated k_acc is now equal to the maximum K=5, and all positions of the vector are considered. The output index is therefore equal to the present accumulated index, i.e. output index 4. The last identified sign is still not included in the accumulated index and is instead extracted as a separate parameter, i.e. leading sign=(next_sign_ind=1).

In a third example, having a dimension N=3 and number of unit pulses K=5, consider an integer input vector of [0,5,0]. The initializing is performed and "pos" is set to "2", index, k_acc to "0", dimension n=1, and the got_sign_flag is unset (=0). The first value "val" is selected as coefficient 2 of the vector, i.e. 0. Since no non-zero value has been evaluated yet, no sign has been extracted, and the flow skips the adjustment of the index based on detected signs. The flow thereby passes directly to the evaluation of the value "val", which is identical to zero. This skips the trigging of the sign flag. A first sign has thus yet not been detected. The accumulated index is then counted up by an offset A(1,0), which corresponds to the number of integer vectors of dimension 1 and L1-norm of 0, that has a positive leading value and that does not have a leading zero. A(1,0) is equal to 0. The accumulated index is now index=0. The accumulated k-parameter k_acc is then updated by the absolute value of "val", i.e. by 0 units, i.e. still k_acc=0.

A next repetition is prepared by increasing the number n by 1, i.e. n=2, and decreasing the position indicator "pos" by 1, e.g. pos=1. The flow returns to step 308 and a new value of position 1 is selected, i.e. val=vec(1)=5 in our example. The sign flag "got_sign_flag" indicates that a sign is not yet detected. The flow thereby passes directly to the evaluation of the value "val", which is not identical to zero. This trigs the sign flag to be set. A first sign has now been detected, and next_sign_ind is set according to the detected sign, in this case next_sign_ind=0, i.e. a positive value (5). The accumulated index is then counted up by an offset A(2,0), which corresponds to the number of integer vectors of dimension 2 and L1-norm of 0, that has a positive leading value and that does not have a leading zero. A(2,0) is equal to 0. The accumulated index is now still index=0. The accumulated k-parameter k_acc is then updated by the absolute value of "val", i.e. by 5 units, i.e. k_acc=5.

A next repetition is prepared by increasing the number n by 1, i.e. n=3, and decreasing the position indicator "pos" by 1, e.g. pos=0. The flow returns to step 308 and a new value of position 0 is selected, i.e. val=vec(0)=0 in our example. The sign flag "got_sign_flag" indicates that a sign is detected but since the present value "val" is equal to zero, the "next_sign_ind" is saved for the next repetition, or in this example the final step. The flow continues to the evaluation of the value "val", which is identical to zero. The next_sign_ind is therefore unchanged. The accumulated index is then counted up by an offset A(3,5), which corresponds to the number of integer vectors of dimension 3 and L1-norm of 5, that has a positive leading value and that does not have a leading zero. A(3,5) is equal to 41. The accumulated index is now index=41. The accumulated k-parameter k_acc is then updated by the absolute value of "val", i.e. by 0 units, i.e. still k_acc=5.

The accumulated k_acc is now equal to the maximum K=5, and all positions of the vector have been considered. The output index is therefore equal to the present accumulated index, i.e. output index 41. The last identified sign is still not included in the accumulated index and is instead extracted as a separate parameter, i.e. leading sign="+1" (next_sign_ind=0).

In FIG. 8, a high level schematic view of an embodiment of a basic MPVQ iteration instead using a sectioned leading sign encoding is illustrated. The figure illustrates a high level schematic view of an embodiment of a basic MPVQ-iteration using sectioned partitioning of the leading sign information. In a preferred solution, the two sign sections are implemented for each unique pos[0] amplitude k_delta, e.g. k_delta=[k−1, k−2, . . . 1]. For pos[0] value="k", all unit pulses are consumed in pos[0] and the iteration can stop. For pos[0] value being non-zero, positive next leading sign, the first encountered non-zero position sign requires 1 bit of information. For pos[0] value being non-zero, negative next leading sign, the first encountered non-zero position sign requires 1 bit of information. For pos[0] value="0", iteration is extended to pos[0] without requiring any new leading sign info.

From the iteration definition above, one can establish that:

$$M(n,k)=1+U(n,k)+U(n,k)+M(n-1,k)=1+2*U(n,k)+M(n-1,k)$$

$$M(n,k)-M(n-1,k)=1+2*U(n,k)$$

By applying Fischer's PVQ recursion, one obtains:

$$M(n,k)-M(n-1,k)=M(n-1,k-1)+M(n,k-1)$$

$$1+2*U(n,k)=M(n-1,k-1)+M(n,k-1)-M(n-1,k-1)+M(n-1,k-1)$$

$$1+2*U(n,k)=1+2*U(n,k-1)+2*M(n-1,k-1)$$

$$U(n,k)=U(n,k-1)+M(n-1,k-1)$$

$$M(n-1,k-1)=U(n,k)-U(n,k-1)$$

leading to $$M(n-1,k)=[U(n,k+1)-U(n,k)]$$

From the recursion definition is known:

$$M(n,k)=1+2*U(n,k)+[U(n,k+1)-U(n,k)]=1+U(n,k)+U(n,k+1)$$

MPVQ-size can now be determined recursively as:

$$N_{MPVQ}(n,k)=M(n,k)=1+U(n,k)+U(n,k+1).$$

See further Appendix B for the derivation of the employed MPVQ recursion formula.

$$N_{MPVQ}(n,k)=1+2*U(n,k)+N_{MPVQ}(n-1,k)$$

In the enumeration/indexing use any of the below defined properties (a-g) that:

a) $N_{PVQ}(n,k)=2*N_{MPVQ}(n,k)$, (recursively applied for efficient indexing);

b) $U(n,k)=1+U(n,k-1)+U(n-1,k-1)+U(n-1,k)$, with initial conditions U(0,*)=0, U(*,0)=0, U(1,*)=0, U(*,1)=0, and U(a, b)=U(b, a), and further for efficiency one can use U(2,k)=k−1, and U(n,2)=n−1, and U(3,k)=k*(k−1), and U(n,3)=n(n−1);

c) $N_{PVQ}(n,k)=1+U(n,k)+U(n,k+1)$, (final MPVQ-size calculation)

d) $N_{PVQ}(n,k)=1+\text{floor}((A(n,k))/2)+U(n,k+1)$, (alternative final size calculation)

e) $N_{PVQ}(n,k)-N_{MPVQ}(n-1,k)=1+2*U(n,k)=A(n,k)$, (can be used for iterative amplitude index addition determination)

f) $A(n,k)=A(n,k-1)+A(n-1,k-1)+A(n-1,k)$, (this recursion, also used in e.g. CELT/OPUS-audio, can also be used here for low complexity amplitude indexing offset updates)

g) Iteratively update the *PVQ*-offsets=U(n, k=0 . . . K+1) or preferably iteratively update: A(n, k=0 . . . K) and U(n,K+1). A(n, k) recursion is slightly faster than U(n, k) recursion and the last element U(n,K+1) *has* lower dynamic range than A(n,K+1).

Here the c) and d) are used to calculate the size the final MPVQ(n, k) codeword, which is needed to obtain the index from the bit-stream, or which is provided to the bitstream or the arithmetic encoder/decoder which is interfacing the bit stream.

Figure 9:
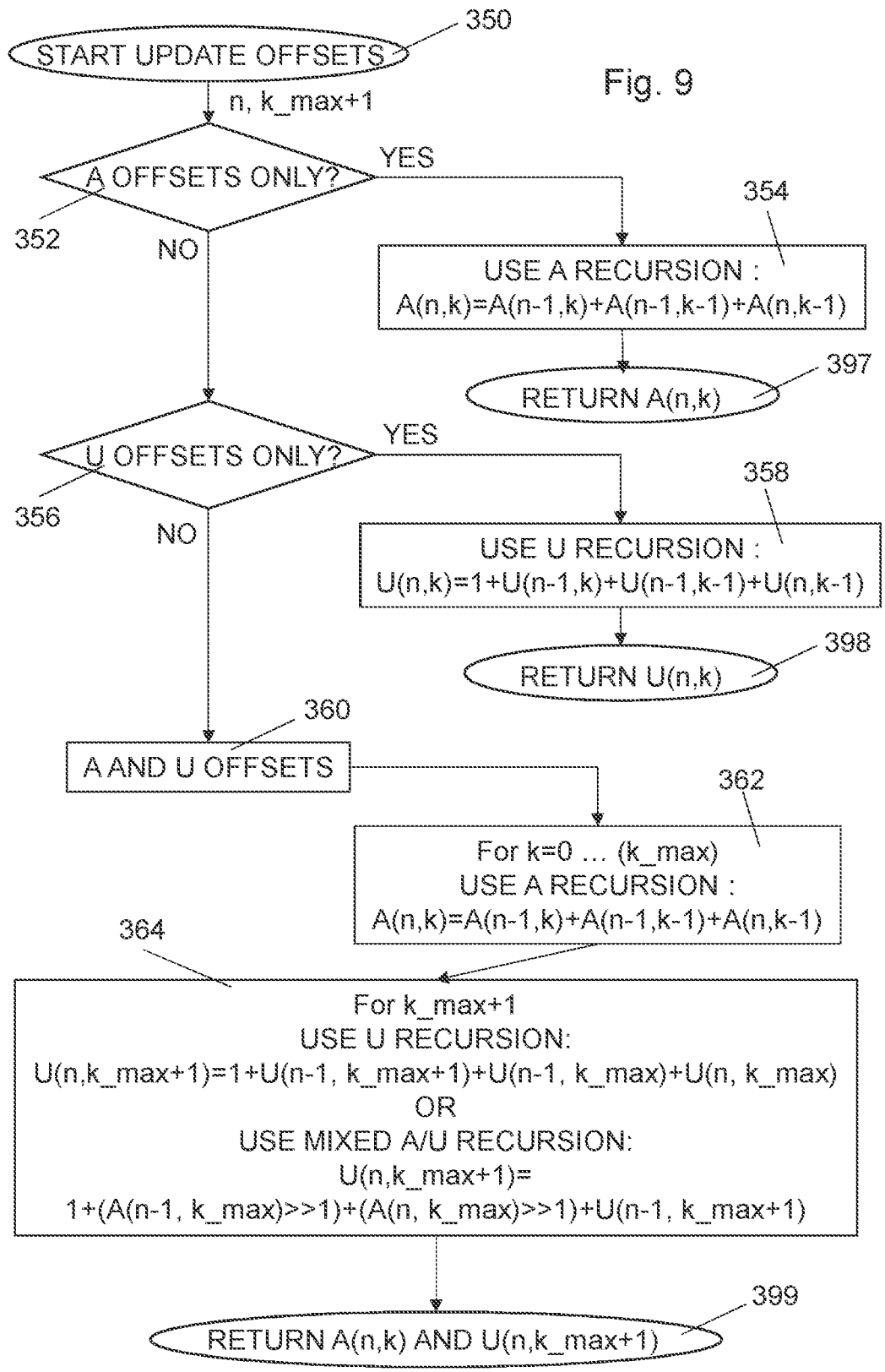
FIG. 9 is a flow diagram of steps of a combination of three embodiments of a MPVQ-A/U offset recursion for increasing dimension.

FIG. 9 illustrates a combination of three embodiments of a MPVQ-A/U offset recursion for increasing dimension.

The procedure for updating offsets starts in step 350. The input parameters are the dimension n and the k_max+1 value. This procedure provides indexing offsets of a row n−1 to indexing offsets of row n, including updating of offsets for k's of 0 . . . (k_max+1). In step 352, it is decided whether or not only A offsets are to be used. If that is the case, in the step 354, A(n,k) is calculated as:

$$A(n,k)=A(n-1,k)+A(n-1,k-1)+A(n,k-1).$$

This particular recursion is utilized also in prior art, but together with less efficient PVQ indexing processes. The A(n, k) is returned in step 397. In step 356, it is decided whether or not only U offsets are to be used. If that is the case, in step 358, U(n, k) is calculated as:

$$U(n,k)=1+U(n-1,k-1)+U(n-1,k)+U(n,k-1).$$

The U(n, k) is returned in step 398. In step 360, a combination of A and U offsets are to be used. In step 362, recursions for k=0 . . . (k_max) are performed according to:

$$A(n,k)=A(n-1,k)+A(n-1,k-1)+A(n,k-1).$$

This particular recursion is utilized also in prior art, but together with less efficient PVQ indexing processes. For the highest dynamics offset (k_max+1), recursions are performed in step 364. In one particular embodiment, a pure U recursion is used according to:

$$U(n,k\_max+1)=1+U(n-1,k\_max)+U(n-1,k\_max+1)+U(n,k\_max).$$

In another particular embodiment, a mixed A/U recursion is used according to:

$$U(n,k\_max+1)=1+(A(n-1,k\_max)>>1)+(A(n,k\_max)>>)+U(n-1,k\_max+1),$$

where (y>>1) signifies y=floor(y/2). The A(n, k) and U(n, k_max+1) are returned in step 399.

Figure 10:
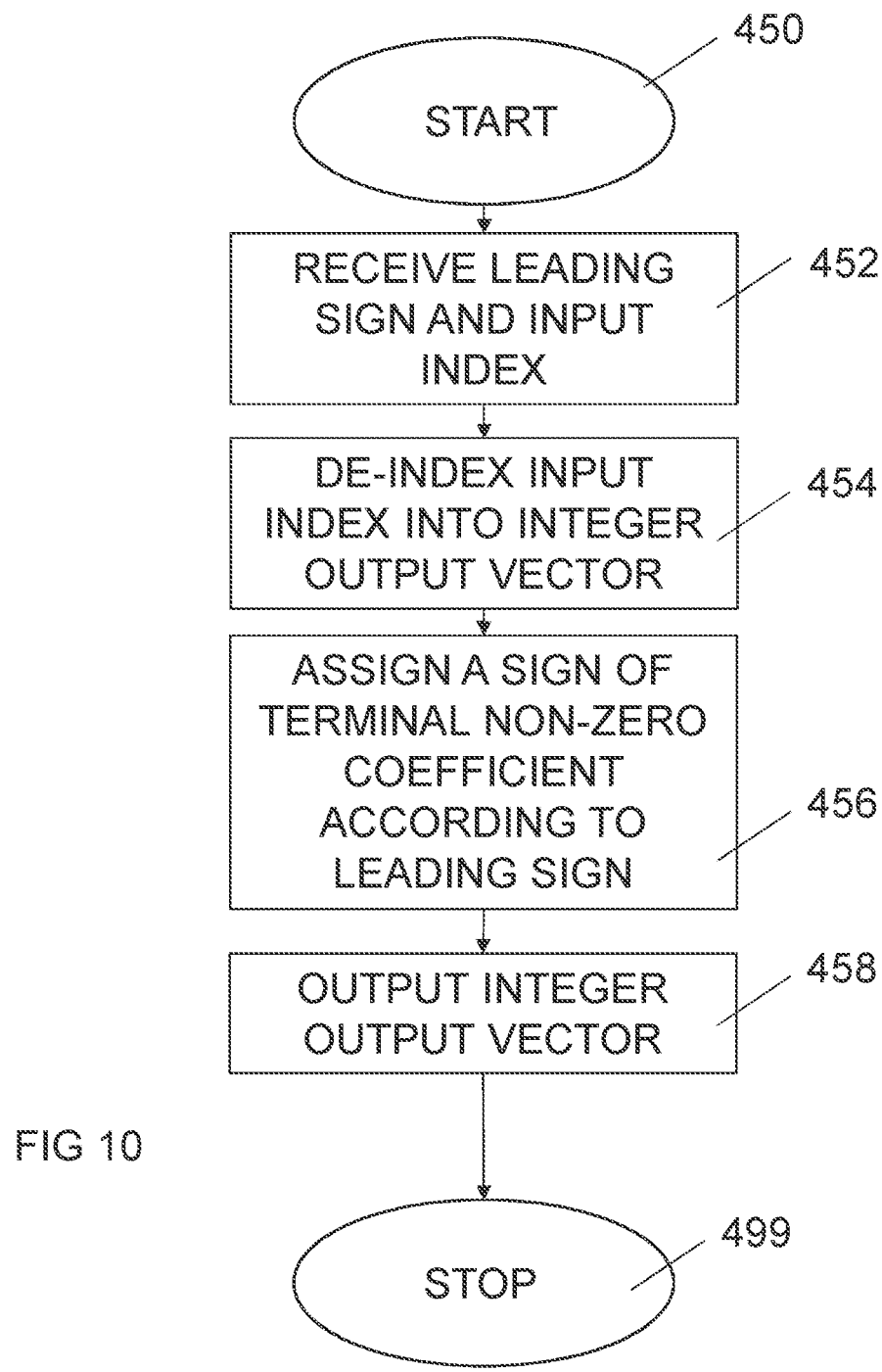
FIG. 10 illustrates a flow diagram of steps of an embodiment of a method for pyramid vector quantization deindexing of audio/video samples.

At the receiver side, an opposite procedure has to be performed, in which a leading sign and an index is transformed into an integer output vector. FIG. 10 illustrates a flow diagram of steps of an embodiment of a method for pyramid vector quantization deindexing of audio/video samples. The method starts in step 450. In step 452, a leading sign as a first codeword and an input index as a second codeword are received from an ingoing bit stream. The leading sign and the input index represent audio/video signal samples. The leading sign is a sign of a terminal non-zero coefficient in an integer output vector to be created, representing the audio/video signal samples. The integer output vector has a number of integer-valued coefficients. The terminal non-zero coefficient is one of a first non-zero coefficient and a last non-zero coefficient in said integer output vector. In step 454, the input index is deindexed into the integer output vector with a pyramid vector quantization de-enumeration scheme. The input index being created by an enumeration scheme is neglecting the sign of the terminal non-zero coefficient. In step 456, a sign of the terminal non-zero coefficient in the integer output vector is assigned according to the received leading sign. In alternative embodiments, step 456 can be performed concurrently as, in combination with or before step 454. In step 458, the integer output vector is output. The process ends in step 499

In a particular embodiment, the step of deindexing 454 is performed by an iterative de-enumeration procedure. In a further particular embodiment, the iterative de-enumeration procedure comprises an initializing step, in which a remaining index is set equal to the input index, and a repetition of an iteration step, in which one current coefficient of the integer output vector is selected for consideration. The iteration step in turn comprises finding of an offset parameter being compatible with a position of the current coefficient within the integer output vector and with the remaining index, reducing of the remaining index in dependence of the offset parameter, and setting of an amplitude of the current coefficient of the integer input vector to be equal to an amplitude associated with the offset parameter. The repetition is continued with coefficients of the integer input vector being selected one after the other as the current coefficient at least until the remaining index becomes equal to zero.

Figure 11:
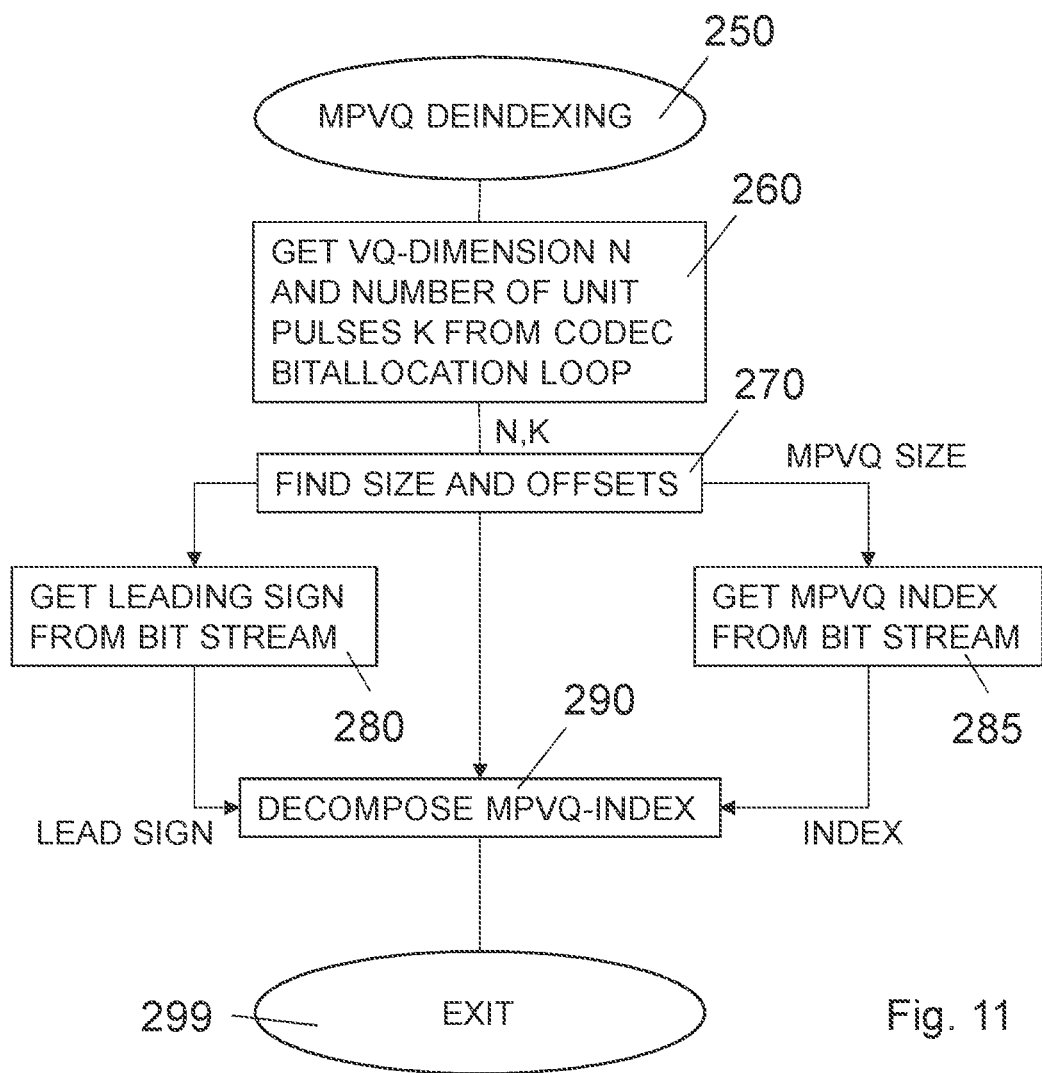
FIG. 11 is a flow diagram of steps of an embodiment of MPVQ deindexing.

Some receiver side aspects of MPVQ-deindexing are illustrated in the following using detailed block diagrams implementing embodiments of the processes. An overview of an embodiment of MPVQ deindexing is illustrated in FIG. 11. The MPVQ deindexing starts in step 250. In step 260, VQ dimensions N and the number of unit pulses K are achieved from the codec bit allocation loop. In step 270, a size and offsets are found. In step 280, a leading sign is extracted from the incoming bit stream and in step 285, the MPVQ index is obtained from the incoming bit stream. These quantities are utilized in step 290, where the MPVQ index is decomposed. The process ends in step 299.

In comparison with the flow diagram of FIG. 10, steps 260, 270, 280 and 285 can be considered as being comprised in the step 452. Steps 454 and 456 are similarly considered to be comprised in step 290.

Figure 12:
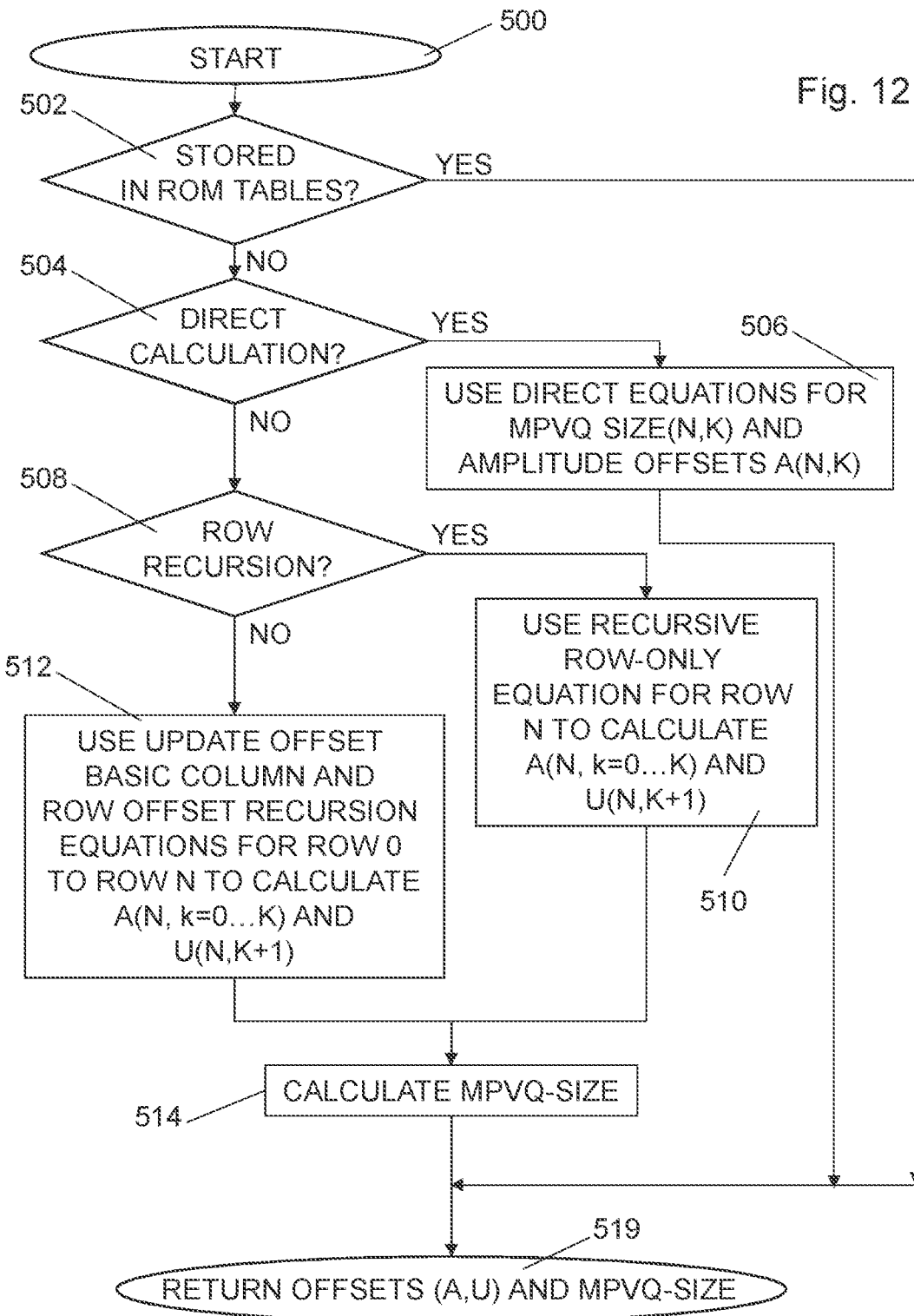
FIG. 12 is a flow diagram of steps of an embodiment of procedures to find size and offsets.

An embodiment of the procedures to find size and offsets, e.g. corresponding to step 270 of FIG. 11 is illustrated in FIG. 12. The A(n,k) offset in deindexing is typically an amplitude offset, but it also accounts for the remaining signs. The U(n,k) offset is similar. It is also an amplitude offset. However, it does not include the first leading sign (the "2"), but all the rest of the remaining leading signs are included. The offsets in general indicate the section sizes for the remaining possible combinations of amplitudes and leading signs. Sometimes this is performed with the current leading sign (A(n,k)) and sometimes without the next leading sign, but all the rest (U(n,k) case). The procedure to find the MPVQ size $N_{MPVQ}(N,K)$ and the indexing offsets A, U for dimension N from k=0 to k=K+1 starts in step 500. Note that direct equations of A(n,k), A(n,k) row-only recursion and A basic recursion is known as such in prior art. In step 502, it is checked whether or not size and offsets are stored in ROM tables. If so, which may be realistic if both N, and K are low, the procedure continues directly with step 519. In step 504, it is checked whether or not an efficient direct calculation is possible. If so, which may be realistic for low N, the process continues to step 506, in which direct equations are used for MPVQ size (N,K) and amplitude offsets A(N,K). The procedure then continues to step 519. In step 508, it is checked whether or not an efficient row recursion is possible. If so, which may be realistic for some K's, the process continues to step 510, in which recursive row-only equations are used for row N to calculate A(N, k=0 . . . K) and U(N,K+1). The procedure then continues to step 514. If it in step 508 is found that row-only recursion is not feasible, the procedure continues to step 512, in which an offset update process is used for a basic column and row offset recursion equation for row 0 to row N to calculate offsets as A(N, k=0 . . . K) and U(N,K+1). This is possible for all N and K. One example of such an update offset routine can be found in e.g. FIG. 9. In step 514, the MPVQ size can be calculated as MPVQ-size=1+(A(N,K)>>1)+U(N,K+1) or alternatively as MPVQ−size=1+U(N;K)+U(N,K+1). In step 519, the procedure is ended by returning offsets (A, U) and MPVQ size.

Figure 13:
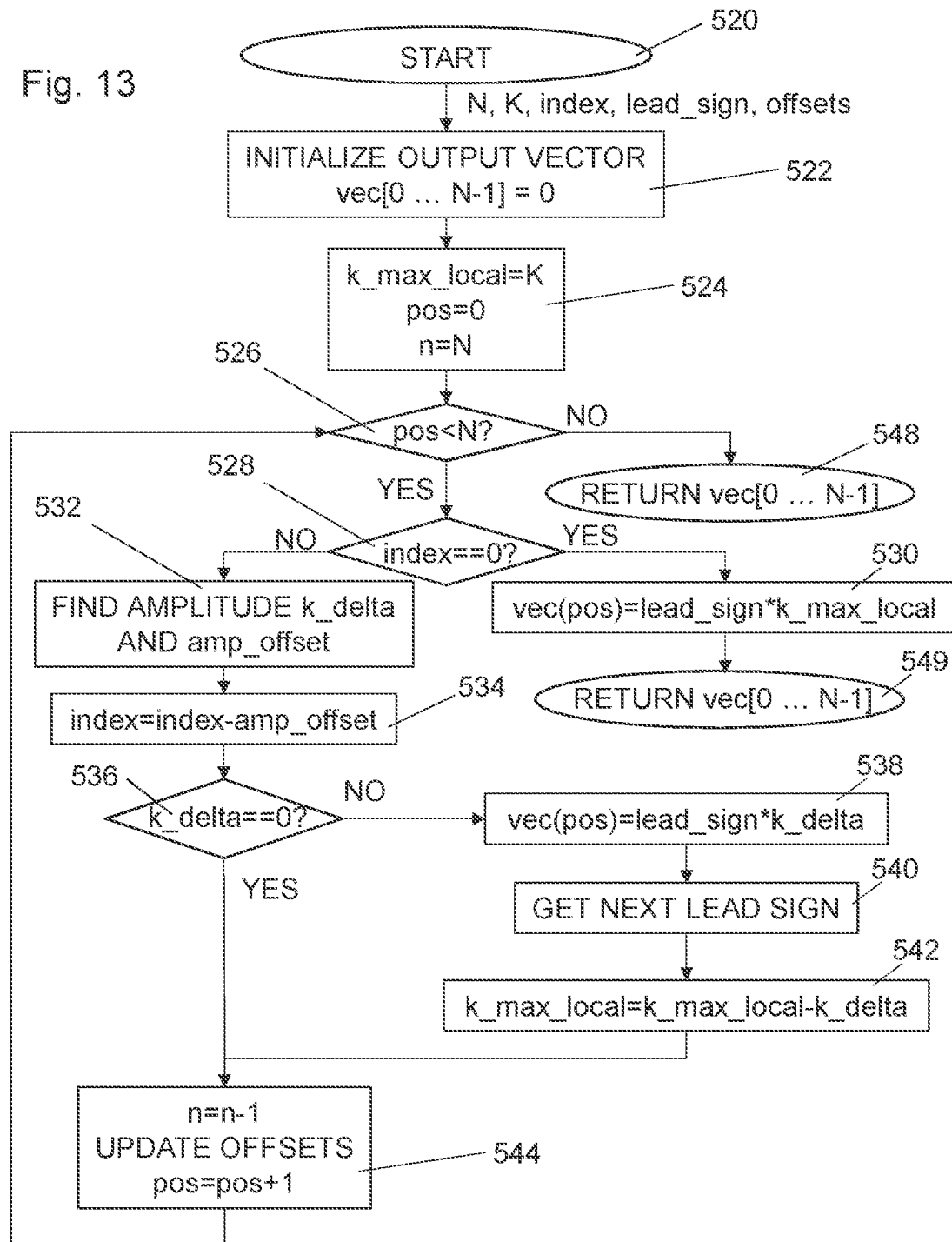
FIG. 13 is a flow diagram of steps of an embodiment of MPVQ index decomposition.

FIG. 13 illustrates an embodiment of MPVQ index decomposition. The procedure for decomposing an MPVQ index starts in step 520. The parameters N, K, the input index and leading sign as well as offset values are provided. A remaining index is set equal to the input index. In step 522, the output vector "vec" is initialized with zeros. In step 524, the local maximum k, k_max_local is set equal to K, the position in the vector starts from 0 and n is set to N. In step 526, it is investigated if all positions in the vector are considered. If so, the vector is returned as the output vector in step 548, i.e. an exit after the last position is treated. In step 528, it is investigated if the remaining index is zero. If so, no more vector positions are to be filled with non-zero values. The procedure continues to step 530, in which the leading sign is incorporated into and the vector is returned as the output vector in step 549, i.e. a fast early exit before the last position has been treated. If the remaining index is larger than zero, the procedure continues to step 532, in which a k_delta, i.e. an absolute amplitude of the vector position under investigation, and an amplitude offset "amp_offset" is found. This will be described more in detail further below. In step 534, the remaining index is reduced by the amplitude offset. If the amplitude of the vector position is not zero, as investigated in step 536, the procedure continues to step 538, where the vector position is given a value equal to the amplitude multiplied with the leading sign. For the first non-zero coefficient, the leading sign is the leading sign extracted from the bit stream. In step 540, a next leading sign for a future position is deduced. This is described more in detail further below. In step 542, the local maximum k value is reduced with the current k value "k_delta". A next repetition is then prepared in step 544 by increasing the dimension n, by updating the offsets and by increasing the position in the vector by one step. The procedure then returns to step 526.

Figure 14:
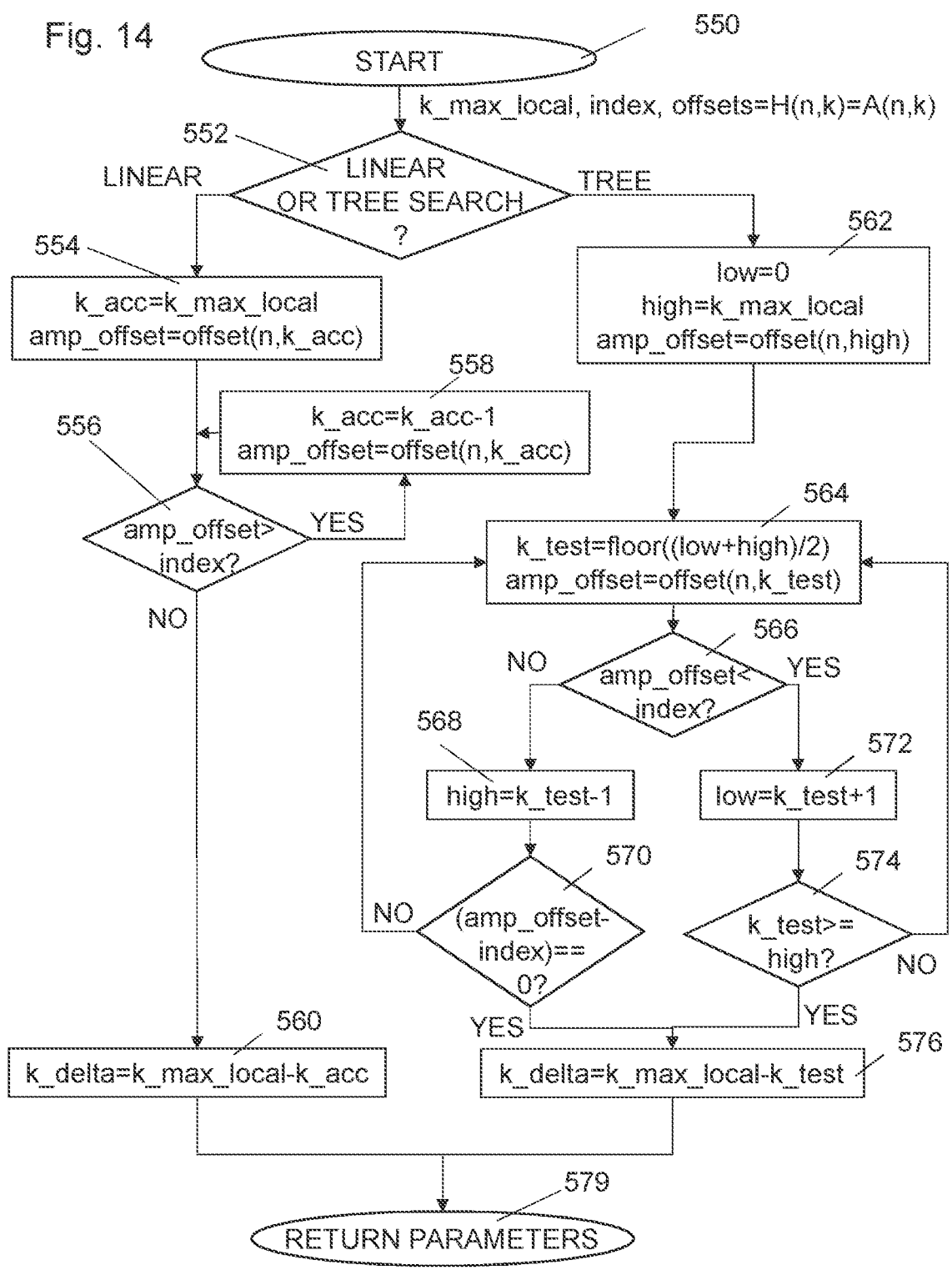
FIG. 14 is a flow diagram of steps of an embodiment for finding an amplitude of a next coefficient.

As indicated in FIG. 13, from the received index, the amplitude 'k_delta' of the current position is determined. This is preferably performed by using available A(n, k) offsets and/or U(n, k) offsets. The amplitude information offset is also deduced and the remaining index is reduced by this amplitude information offset 'amp_offset'. One embodiment of such a procedure is illustrated in FIG. 14.

An embodiment of a procedure for finding the amplitude k_delta and the amplitude offset amp_offset starts in step 550. In other words, this procedure is supposed to find the amplitude of the current position and the corresponding index offset. Linear or tree searches using offsets of A(n, k) are, as such, available in prior art. The ingoing parameters are the local maximum k "k_max_local", the index and the offsets H(n,k)=A(n,k). In step 552, a tree or linear search is selected. For the linear search option, step 554 sets an accumulated k value, k_acc, equal to the local maximum k and an amplitude offset is set equal to an offset for the present n and the accumulated k value. In step 556, it is checked whether or not the offset is larger than the index. If this is the case, in step 558 the k_acc value is reduced by one unit, a new amplitude offset is derived. The procedure then returns to step 556. This is repeated until the largest amplitude offset value less than or equal to the remaining index is found. The procedure then continues to step 560, in which the k_delta, i.e. the amplitude of the current position is calculated as the local maximum k value reduced by the k_acc value.

If a tree procedure is selected, in step 562, a high and a low parameter are defined and an amplitude offset for n and the high parameter is deduced. The k region to search is divided into two parts in step 564 with a k_test parameter and an amplitude offset for n and the high parameter is deduced. Depending on if the amplitude offset in larger or smaller than the index, as decided in step 566, The high parameter is changed, in step 568, or the low parameter is changed, in step 572. This is repeated until either the difference between the amplitude offset and the index becomes zero or the k_test point becomes equal to the high parameter, as checked in steps 570 and 574, respectively. In step 576, the k_delta, i.e. the amplitude of the current position is calculated as the local maximum k value reduced by the k_test value. The amplitude k_delta, k_acc and amp_offset, where k_acc=k_max_local−k_delta is used for sectioned sign coding, are returned in step 579.

Figure 15:
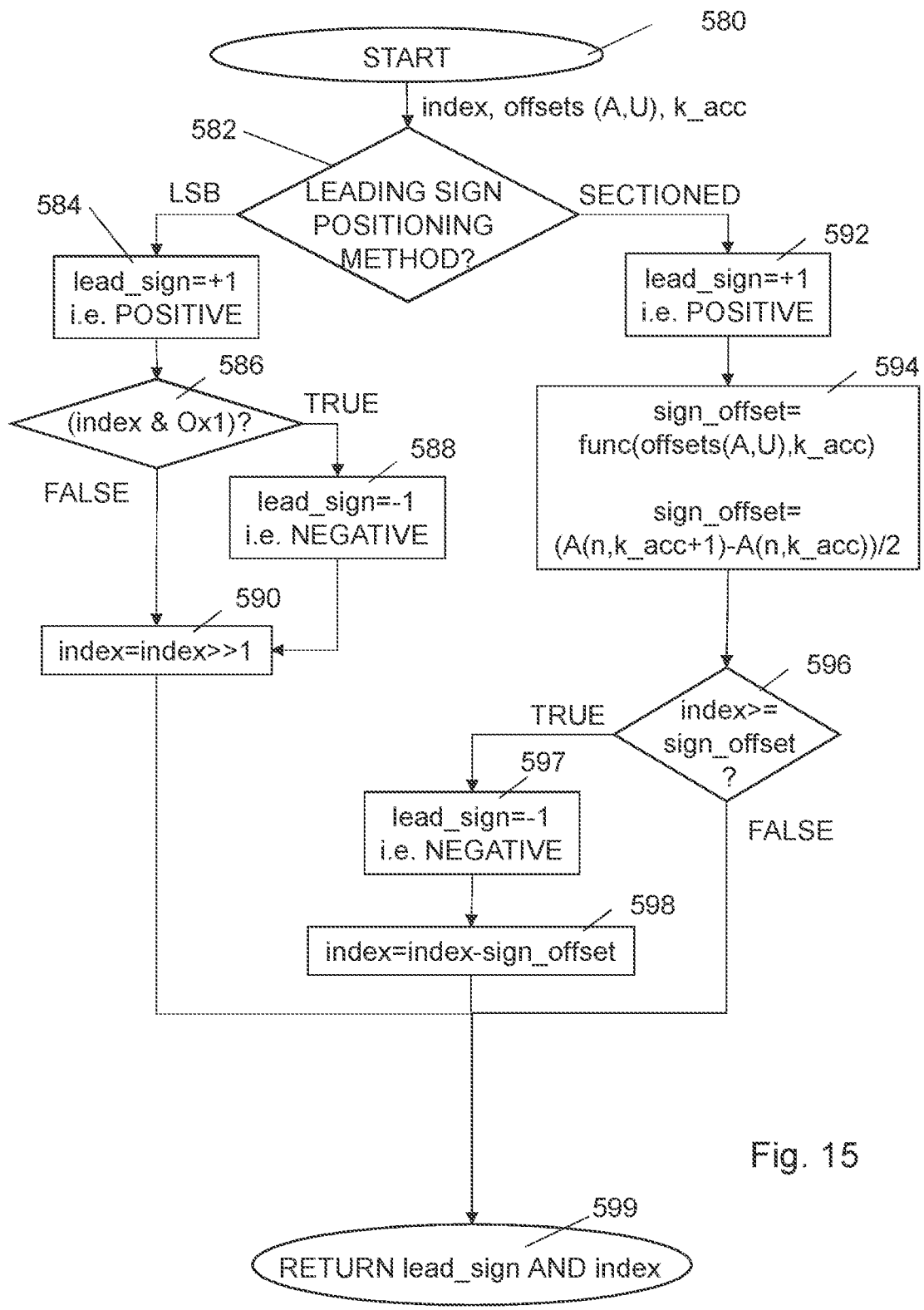
FIG. 15 is a flow diagram of steps of an embodiment of a procedure for finding the next leading sign and removing the extracted sign information.

In FIG. 13, in step 536, if the magnitude is non-zero and less than the maximum remaining K unit pulses value, the previously extracted (stored) leading sign is applied in step 538, to the current position amplitude. Subsequently the next leading sign is to be extract from the decomposed received MPVQ-index. One embodiment of a procedure for finding the next leading sign and removing the extracted sign information (bit or sign_offset) from the index is illustrated in FIG. 15.

The procedure for getting a next leading sign starts in step 580. The input parameters are the remaining index, the offsets and the accumulated k value k_acc. In step 582, the sign positioning method is selected. If the LSB approach is selected, which presently is believed to be the preferred embodiment, the leading sign is initially set to be positive (+1) in step 584. In step 586 the least significant bit in index is determined, using a bitwise 'and' operation. If the bit is a "1", this signifies a negative sign and the leading sign is consequently changed to "−1" in step 588. In step 590, the index is shifted one position, i.e. shifting out the sign bit.

If a sectioned leading sign decoding is selected, which is a little bit more complex, the leading sign is initially set to be positive (1) in step 592. In step 594, the size of the k_delta segment is divided by 2. If the index is larger than or equal to this sign offset, the sign is negative and the leading sign is consequently changed in step 597. In step 598, the index is also reduced by the found sign offset. The leading sign and modified index are returned in step 599.

Returning again to FIG. 13, if the current position has zero amplitude, the leading sign is kept, i.e. remembered for potential use in the next position after the current position.

If the magnitude equals the maximum remaining K unit pulses value, the stored leading sign is applied. Optionally a fast iteration exit can be used for this last non-zero entry, and exit early with a series of trailing zeroes. This is optional as sometimes in DSP-HW the cost of conditionally exiting an optimized constant length loop is higher than staying in the loop.

Figure 16:
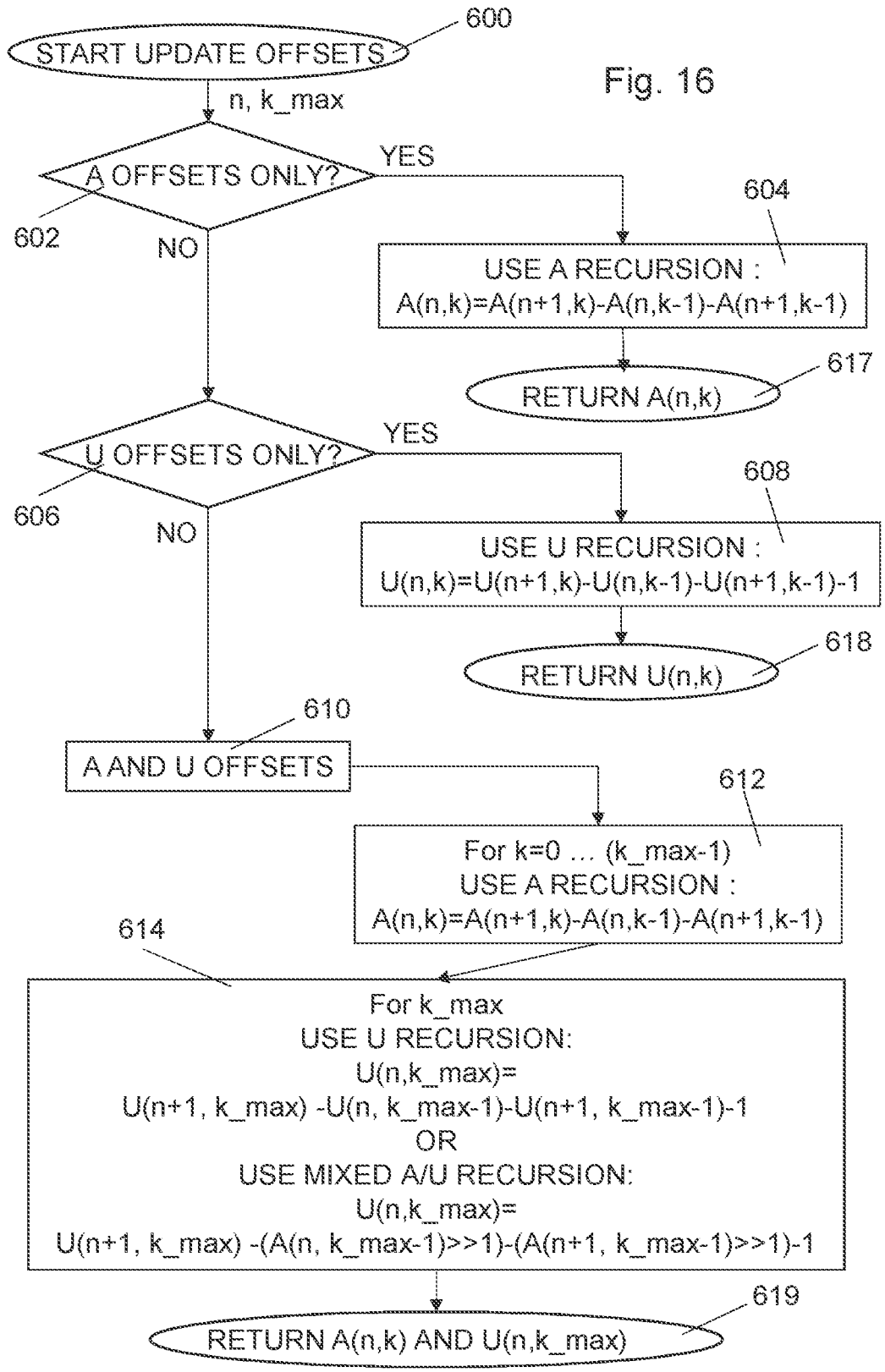
FIG. 16 is a flow diagram of steps of an embodiment of a procedure for offset updating for one dimension less.

The offsets A(n,k) (or U(n,k) can be updated recursively for the remaining vector, with one dimension less to de-index and 'k_delta' less unit pulses to de-index. One embodiment of a procedure for offset updating for one dimension less is illustrated in FIG. 16. The procedure is similar to the one presented in FIG. 9, but here, the dimension is reduced instead of increased.

The procedure for updating offsets starts in step 600. The input parameters are the dimension n and the k_max value. This procedure provides indexing offsets of a row n+1 to indexing offsets of row n, including updating of offsets for k's of 0 ... k_max. In step 602, it is decided whether or not only A offsets are to be used. If that is the case, in the step 604, A(n,k) is calculated as:

$$A(n,k)=A(n+1,k)-A(n,k-1)-A(n+1,k-1).$$

This particular recursion is utilized also in prior art, but together with less efficient PVQ indexing processes. The A(n,k) is returned in step 617. In step 606, it is decided whether or not only U offsets are to be used. If that is the case, in step 608, U(n,k) is calculated as:

$$U(n,k)=U(n+1,k)-U(n,k-1)-U(n+1,k-1)-1.$$

The U(n, k) is returned in step 618. In step 610, a combination of A and U offsets are to be used. In step 612, recursions for k=0 . . . (k-max−1) are performed according to:

$$A(n,k)=A(n+1,k)-A(n,k-1)-A(n+1,k-1).$$

This particular recursion is utilized also in prior art, but together with less efficient PVQ indexing processes. For the highest dynamics offset k_max, where k_max=K+1, recursions are performed in step 614. In one particular embodiment, a pure U recursion is used according to:

$$U(n,k\_max)=U(n+1,k\_max)-U(n,k\_max-1)-U(n+1,k\_max-1)-1.$$

In another particular embodiment, a mixed A/U recursion is used according to:

$$U(n,k\_max)=U(n+1,k\_max)-(A(n,k\_max-1)>>1)-(A(n+1,k\_max-1)>>1)-1,$$

where (y>>1) signifies y=floor(y/2). The A(n,k) and U(n, k_max) are returned in step 619.

Three examples are described here below, in order to support the understanding of the structure of FIG. 13. The examples are of an extremely low complexity in order to keep the description limited and to make the total example perceivable. However, in typical real examples, the dimensions and the number of unit pulses are far higher. The principles are however the same.

In a first example, having a dimension N=3 and number of unit pulses K=5, consider an input index of 17 and a leading sign "+1", i.e. positive.

The initializing is performed and "pos" is set to "0", i.e. the de-indexing starts from the first coefficient in the vector, k_max_local to "5", and dimension n=3. The input index is "renamed" into a remaining index. The position is lower than 3 and the remaining index is non-zero. An amplitude k_delta and offset amp_offset is searched (e.g. according to FIG. 14). If e.g. the A offsets are used, the group of offsets A(3,0 . . . 5) are investigated and the largest A offset that still is smaller than or equal to the remaining index is A(3,3)=13. k_acc therefore becomes 3, k_delta becomes 2 and amp_offset equals 13. The remaining index is reduced by the amp_offset and becomes now equal to 4. Since k_delta is not equal to zero, there is a sign to be applied. The vector position is therefore set to the absolute value (k_delta) times the received and stored leading sign, which was positive. The output vector is now [2,0,0]. A determination of a next leading sign is then performed, e.g. according to FIG. 15. If assuming an LSB sign positioning, the LSB of the remaining index (4) is zero, which corresponds to a positive sign. The lead_sign is therefore set to "+1". The remaining index is also reduced by shifting the index one step, i.e. equal to an integer division by 2. The remaining index is now equal to 2. Finally, the remaining pulse units k_max_local are updated and is now 3.

A next repetition is prepared by reducing the number n by 1, i.e. n=2, and increasing the position indicator "pos" by 1, e.g. pos=1. The available offsets are also updated according to the new n. The flow returns to step 526 and a new amplitude and offset is to be found (e.g. according to FIG. 14). If e.g. the A offsets are used, the group of offsets A(2, 0 . . . 3) are investigated and the largest A offset that still is smaller than or equal to the remaining index is A(2,1)=1. k_acc therefore becomes 1, k_delta becomes 2 and amp_offset equals 1. The remaining index is reduced by the amp_offset and becomes now equal to 1. Since k_delta is not equal to zero, there is a sign to be applied. The vector position is therefore set to the absolute value (k_delta) times the recently extracted leading sign, which was positive. The output vector is now [2,2,0]. A determination of a next leading sign is then performed, e.g. according to FIG. 15. If assuming an LSB sign positioning, the LSB of the remaining index (1) is 1, which corresponds to a negative sign. The lead_sign is therefore set to −1. The remaining index is also reduced by shifting the index one step, i.e. equal to an integer division by 2. The remaining index is now equal to 0. Finally, the remaining pulse units k_max_local are updated and is now 1.

A next repetition is prepared by reducing the number n by 1, i.e. n=1, and increasing the position indicator "pos" by 1, e.g. pos=2. The available offsets are also updated according to the new n. The flow returns to step 526. Since the remaining index is zero, the step 530 is performed to give the last vector coefficient. lead_sign is equal to −1 and k_max_local is equal to 1, which gives an output vector of [2,2,−1].

In a second example, having a dimension N=3 and number of unit pulses K=5, consider an input index of 4 and a negative leading sign. The initializing is performed and "pos" is set to "0", i.e. the de-indexing starts from the first coefficient in the vector, k_max_local to "5", and dimension n=3. The input index is "renamed" into a remaining index. The position is lower than 3 and the remaining index is non-zero. An amplitude k_delta and offset amp_offset is searched (e.g. according to FIG. 14). If e.g. the A offsets are used, the group of offsets A(3,0 . . . 5) are investigated and the largest A offset that still is smaller than or equal to the remaining index is A(3,1)=1. k_acc therefore becomes 1, k_delta becomes 4 and amp_offset equals 1. The remaining index is reduced by the amp_offset and becomes now equal to 3. Since k_delta is not equal to zero, there is a sign to be applied. The vector position is therefore set to the absolute value (k_delta) times the received leading sign, which was negative. The output vector is now [−4,0,0]. A determination of a next leading sign is then performed, e.g. according to FIG. 15. If assuming an LSB sign positioning, the LSB of the remaining index (3) is 1, which corresponds to a negative sign. The lead_sign is therefore set to −1. The remaining index is also reduced by shifting the index one step, i.e. equal to an integer division by 2. The remaining index is now equal to 2. Finally, the remaining pulse units k_max_local are updated and is now 1.

A next repetition is prepared by reducing the number n by 1, i.e. n=2, and increasing the position indicator "pos" by 1, e.g. pos=1. The available offsets are also updated according to the new n. The flow returns to step 526 and a new amplitude and offset is to be found (e.g. according to FIG. 14). If e.g. the A offsets are used, the group of offsets A(2,0 . . . 1) are investigated and the largest A offset that still is smaller than the remaining index is A(2,1)=1. k_acc therefore becomes 1, k_delta becomes 0 and amp_offset equals 1. The remaining index is reduced by the amp_offset and becomes now equal to 1. Since k_delta is equal to zero, the last extracted sign is saved for a next repetition. The output vector is still [−4,0,0].

A next repetition is prepared by reducing the number n by 1, i.e. n=1, and increasing the position indicator "pos" by 1, e.g. pos=2. The available offsets are also updated according to the new n. The flow returns to step 526 and a new amplitude and offset is to be found (e.g. according to FIG. 14). If e.g. the A offsets are used, the group of offsets A(1,0 . . . 1) are investigated and the largest A offset that still is smaller than or equal to the remaining index is A(1,1)=1. k_acc therefore becomes 1, k_delta becomes 0 and amp_offset equals 1. The remaining index is reduced by the amp_offset and becomes now equal to 0. Since k_delta is not equal to zero, there is a sign to be applied. The vector position is therefore set to the absolute value (k_delta) times the previously extracted leading sign, which was negative. The final output vector is now [−4,0,−1].

In a third example, having a dimension N=3 and number of unit pulses K=5, consider an input index of 41 and a positive leading sign. The initializing is performed and "pos" is set to "0", i.e. the de-indexing starts from the first coefficient in the vector, k_max_local to "5", and dimension n=3. The input index is "renamed" into a remaining index. The position is lower than 3 and the remaining index is non-zero. An amplitude k_delta and offset amp_offset is searched (e.g. according to FIG. 14). If e.g. the A offsets are used, the group of offsets A(3,0 . . . 5) are investigated and the largest A offset that still is smaller than or equal to the remaining index is A(3,5)=41. k_acc therefore becomes 5, k_delta becomes 0 and amp_offset equals 41. The remaining index is reduced by the amp_offset and becomes now equal to 0. Since k_delta is equal to zero, the sign is saved for a later iteration. The output vector is still [0,0,0].

A next repetition is prepared by reducing the number n by 1, i.e. n=2, and increasing the position indicator "pos" by 1, e.g. pos=1. The available offsets are also updated according to the new n. The flow returns to step 526 and a new amplitude and offset is to be found (e.g. according to FIG. 14). If e.g. the A offsets are used, the group of offsets A(2,0 . . . 5) are investigated and the largest A offset that still is smaller than or equal to the remaining index is A(2,0)=0. k_acc therefore becomes 0, k_delta becomes 5 and amp_offset equals 0. The remaining index is reduced by the amp_offset and becomes now equal to 0. Since k_delta is not equal to zero, there is a sign to be applied. The vector position is therefore set to the absolute value (k_delta) times the received and stored leading sign, which was positive. The output vector is now [0,5,0].

A next repetition is prepared by reducing the number n by 1, i.e. n=1, and increasing the position indicator "pos" by 1, e.g. pos=2. The flow returns to step 526. In step 528, it is found that the index is zero and the fast exit via steps 530 and 549 is used.

This new indexing approach, presented in the present disclosure, is an improved low complex short codeword scheme. In design it is a solution based on the optimized pure magnitude indexing schemes (Fischer/Hung/Opus/CELT) but in addition it makes efficient use of the fact that the size of any PVQ structure always is an even number of vectors.

There will still be a need to handle very large PVQ-vectors (larger than 1+B) bits in an efficient way. This can be performed e.g. by target vector dimension splitting, PVQ-vector dimension splitting or costly higher dynamic range integer calculations, for instance n*16 or n*32 virtual, software defined large integers.

The gain of going from B to B+1 bits (e.g. 32 to 33 bits) can be quantified as the extended R=bits/coefficient range capability where dimension splitting is not needed for a given dimension. E.g. for dimension N=8, one goes from R=32/8=4 bits/coefficient (or sample) to R=33/8=4.125 bits per coefficient or sample. Typically R=7 shape bits/coefficient (or sample) is required for a high quality frequency domain audio PVQ-scheme.

Figure 17A:
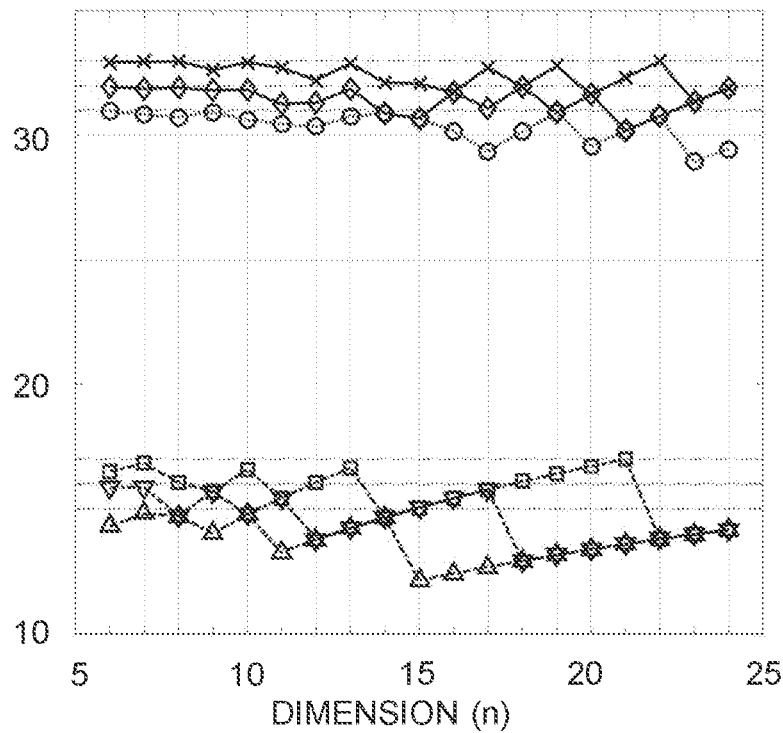
FIG. 17A is a diagram presenting an overview of PVQ-codewords for some common hardware bit limits.

FIG. 17A presents an overview of the PVQ-codewords for some common hardware bit limits. Curve 900 denotes PVQ(n, k) bitlimit 33, curve 901 denotes PVQ(n, k) bitlimit 32, curve 902 denotes PVQ(n, k) bitlimit 31, curve 903 denotes PVQ(n, k) bitlimit 17, curve 904 denotes PVQ(n, k) bitlimit 16, and curve 905 denotes PVQ(n, k) bitlimit 15. 33 bits are possible to use with new scheme and unsigned 32-bit integers, 32 bits corresponds to unsigned 32-bit integer, 31 bits corresponds to signed 32-bit integers, 17 bits are possible to use with new scheme and unsigned 16-bit integers, 16 bits correspond to unsigned 16-bit integers, 15 bits correspond to signed 16-bit integer.

Figure 17B:
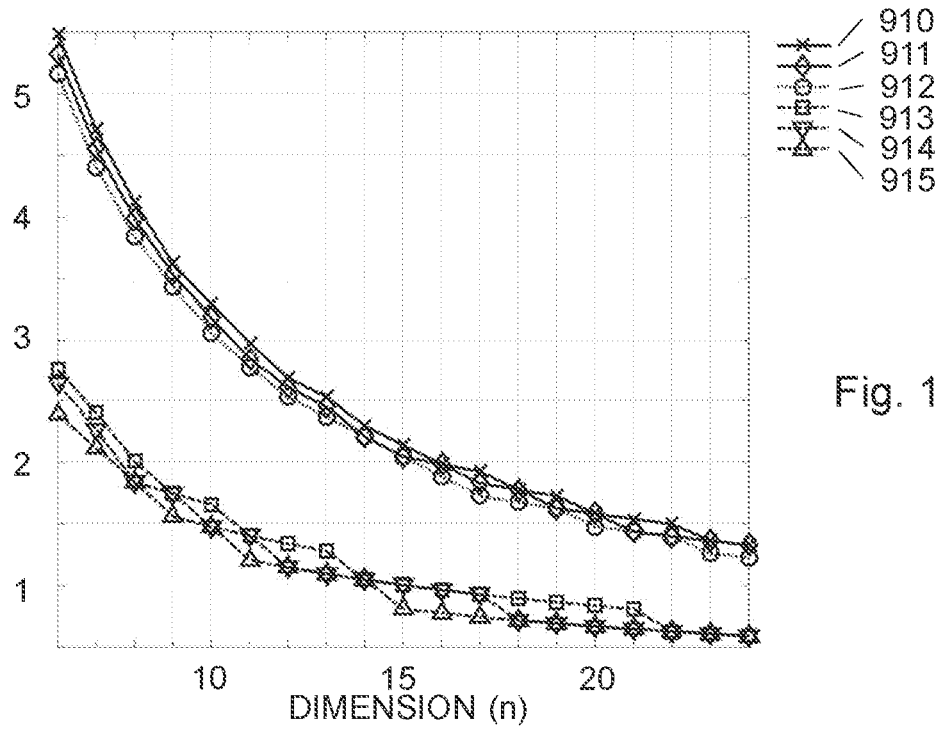
FIG. 17B is a diagram presenting an overview of the related R values in bits/sample for optimal PVQ-codeword quantizers with different BIT limits.

FIG. 17B presents an overview of the related R values in bits/sample for optimal PVQ-codeword quantizers with different BIT limits. Curve 910 denotes PVQ(n, k) bitlimit 33, curve 911 denotes PVQ(n, k) bitlimit 32, curve 912 denotes PVQ(n, k) bitlimit 31, curve 913 denotes PVQ(n, k) bitlimit 17, curve 914 denotes PVQ(n, k) bitlimit 16, and curve 915 denotes PVQ(n, k) bitlimit 15. With higher R values, higher coding quality can be achieved.

Figure 17C:
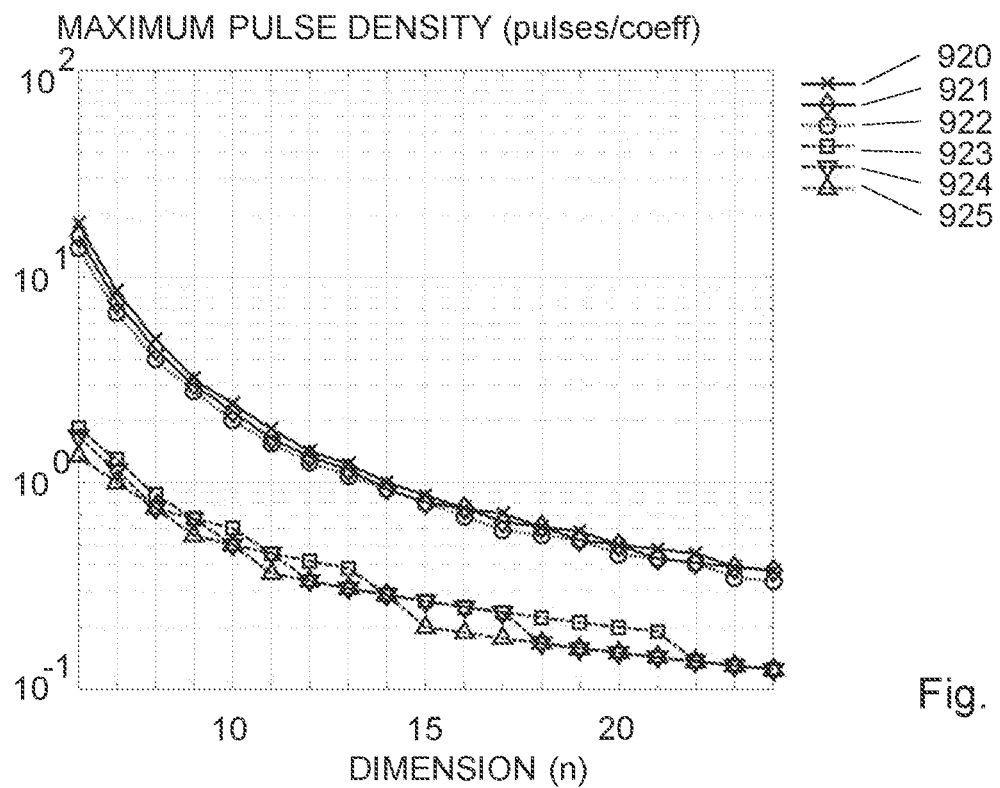
FIG. 17C is a diagram showing a corresponding achievable pulse density, which is directly correlated to the resulting shape matching capability of the PVQ.

FIG. 17C shows the corresponding achievable pulse density, which is directly correlated to the resulting shape matching capability of a gain-shape PVQ. Curve 920 denotes PVQ(n, k) bitlimit 33, curve 921 denotes PVQ(n, k) bitlimit 32, curve 922 denotes PVQ(n, k) bitlimit 31, curve 923 denotes PVQ(n, k) bitlimit 17, curve 924 denotes PVQ(n, k) bitlimit 16, and curve 925 denotes PVQ(n, k) bitlimit 15. With higher R values, higher coding quality can be achieved. The possible pulse density for optimal PVQ-codeword quantizers are shown with different BIT-limits. With higher pulse densities higher coding quality, e.g. higher VQ SNR, can be achieved.

Figure 17D:
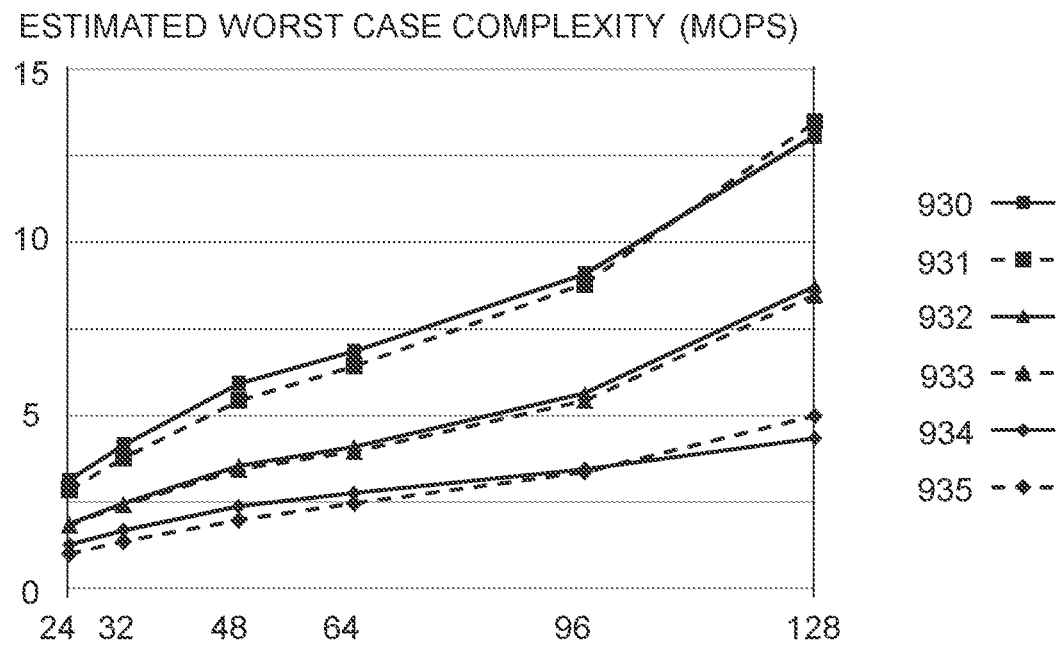
FIG. 17D is a diagram illustrating a worst case MOPS Instruction trade-off in indexing/deindexing for a sample prior art scheme PVQ and for the new scheme MPVQ.

FIG. 17D illustrates a worst case MOPS Instruction trade-off in indexing/deindexing for a sample prior art scheme PVQ and for the new scheme MPVQ, both using PVQ-codewords of maximum size 32 for a fair comparison. Curve 930 denotes total complexity for MPVQ, curve 931 denotes total complexity for PVQ, curve 932 denotes deindexing complexity for MPVQ, curve 933 denotes deindexing complexity for PVQ, curve 934 denotes indexing complexity for MPVQ, and curve 935 denotes indexing complexity for PVQ. MPVQ above can be implemented on a signed 32-bit architecture, while prior art PVQ requires an unsigned 32-bit architecture.

In a second part of the presently presented technology a low dynamic MPVQ runtime calculation of offsets is described. In Appendix A, the high level text description from the OPUS RFC is repeated as background. In the IETF-OPUS c-code (cwrs.c) the dynamically runtime calculated indexing offset A(n,k) is used for both sign and amplitude indexing. Note however, that a different offset variable name is used in OPUS c-code. The number A(n, k) represents the number of vectors PVQ(n,k) that starts with a positive non-zero value in the first position. It has been found in prior art that $$A(n,k)=(N_{PVQ}(n,k-1)+N_{PVQ}(n-1,k-1))/2,$$

In words, the number A is a weighted sum of a row n element and a previous row n−1 element in the PVQ-size matrix N(n, k).

Table 1, for A(n, k), shows an example where the prior art (CELT/OPUS) PVQ offset data scheme used, where for memory efficiency only one row e.g. n==3 is stored in RAM memory, for a given point in the forward recursion, and then n=4 is calculated based on row n=3, and so on.

Note that in a real world PVQ implementation for speech and audio coding the dimension n can be around 256 and number of unit pulses k can be around 512, depending on the target DSP capacity. So storing n*k offsets is often not feasible.

TABLE 1

Prior art A (n, k) offsets needed for PVQ(n = 6, k = 5) calculated for PVQ decoding/encoding in e.g. a IETF-OPUS-Audio like indexing scheme

| | k | | | | | | |
|---|---|---|---|---|---|---|---|
| n | 0 | 1 | 2 | 3 | 4 | 5 | k = 6 |
| 0 | 1 | | | | | | |
| 1 | 1 | 1 | 1 | 1 | 1 | 1 | 1 |
| 2 | 1 | 3 | 5 | 7 | 9 | 11 | |
| 3 | 1 | 5 | 13 | 25 | 41 | 61 | |
| 4 | 1 | 7 | 25 | 63 | 129 | 231 | |
| 5 | 1 | 9 | 41 | 129 | 321 | 681 | |
| 6 | 1 | 11 | 61 | 231 | 681 | 1683 | |

The dynamic indexing offset calculations can, however, be improved. The here proposed novel recursion is $$U(n,k)=U(n,k-1)+U(n-1,k-1)+U(n-1,k)+1,$$

It can be found that it relates to the previously employed, OPUS/CELT prior art offsets A(n, k) as:

$$A(n,k)=2*U(n,k)+1.$$

The integer range dynamics of U(n, k) is now always at least half of the A(n, k) range. This means that 1 bit extra can be made available for fast indexing, e.g. inside a 32 bit word. Also U(2,k) and U(3,k) can be directly computed faster than for A(2,k) and A(3,k), as U(2,k)=k−1, U(3,k)=k*(k−1), and U(a,b)=U(b,a) symmetrically.

TABLE 2

New Low dynamic range U(n, k) indexing offsets, calculated for MPVQ(n = 6, k = 5)

| | k | | | | | | |
|---|---|---|---|---|---|---|---|
| n | 0 | 1 | 2 | 3 | 4 | 5 | k = 6 |
| 0 | | | | | | | |
| 1 | | | | | | | |
| 2 | | 1 | 2 | 3 | 4 | 5 | |
| 3 | | 2 | 6 | 12 | 20 | 30 | |
| 4 | | 3 | 12 | 31 | 64 | 115 | |
| 5 | | 4 | 20 | 64 | 160 | 340 | |
| 6 | | 5 | 30 | 115 | 340 | 841 | |

In the Tables 1 and 2 above one can see that A(n=6,k=6)=1683 cannot fit within 10 bits. 10 bits corresponds to 1024 entries, e.g. values 0-1023. However, the new offset U(n=6, k=6) will fit within 10 bits. As the indexing offsets needs to be exactly calculated for successful exact indexing/de-indexing, offset A(6,6) cannot be allowed to saturate to 1023, or be wrapped to an incorrect low value.

The previous (IETF/OPUS-Audio PVQ-prior art) recursion is $$A(n,k)=A(n,k-1)+A(n-,k-1)+A(n-1,k).$$

It has three addition terms, making it a slightly faster to calculate, especially for high n or high k compared to the new U(n, k) recursion which has addition of 4 terms.

To keep recursion efficiency and maintain a low dynamic range when it is needed one can in another embodiment define a preferred mixed recursion where U(n, KMAX) is a function of previous A(n, lower k) offset values, and only used for dynamic recursion data that is close to the range limit of a B-bit word. This is typically true for the last column KMAX in a N-row-based recursion. In Table 3 it is seen that the offsets still stays within 10 bits, compared to Table 1, which last entry exceeds 10 bits.

TABLE 3 mixed A (n, k) and last k column U(n, 6 = KMAX) offsets calculated for efficient and range safe indexing recursion.

| | k | | | | | | |
|---|---|---|---|---|---|---|---|
| n | 0(A) | 1(A) | 2(A) | 3(A) | 4(A) | 5(A) | k = 6(U) KMAX |
| 0 | 1 | | | | | | |
| 1 | | 1 | 1 | 1 | 1 | 1 | 0 |
| 2 | | 1 | 3 | 5 | 7 | 9 | 5 |
| 3 | | 1 | 5 | 13 | 25 | 41 | 30 |
| 4 | | 1 | 7 | 25 | 63 | 129 | 115 |
| 5 | | 1 | 9 | 41 | 129 | 321 | 340 |
| 6 NMAX | | 1 | 11 | 61 | 231 | 681 | 841 |

Note that typically it is the last n-row NMAX (6 in this case) and highest (k=6 in this case) that causes dynamic range troubles. However, in some cases also the second last row (NMAX-1) may cause range problems, e.g. in row-only recursion calculations, when the numerator in a division is close to the hardware bit limit.

The derivation of the above recursive relations for the MPVQ scheme can be found in Appendix B.

An example of a prior art PVQ indexing scheme is presented in Table 4. Here, the maximum index value, A(n, k)+A(k+1)−1, needs to be less than e.g. 232. The scheme in Table 4 with switched signs [{+, 0}/−] is used in prior art OPUS/CELT. Comments: a) vector [−2,−1,1]; b) Here for indices 25-40, de-indexing a zero in position p0 may eventually become a positive value or a negative value or a zero in p1; c) p0 positive decision limit.

A prior art PVQ-indexing with [{+, 0}/−] PVQ recursive deindexing scheme PVQ(n=3,k=4), NPVQ=66, [{−, 0}/+] prior art indexing (blue, white) cells pX=position in the 3-dimensional vector [p0, p11, p2], k=4 unit pulses can be encoded, e.g. decoded index 7→vector [−2, −1, 1], offsets A(n, k) are used to determined signs, and the relation NPVQ(n=3,k=4)=A(n,k)+A(n,k+1) is used to determine the size from these offsets.

TABLE 4

Example prior art PVQ indexing scheme.

| ind | p0 | | | | | | p1 | p2 | Com. |
|---|---|---|---|---|---|---|---|---|---|
| 0 | A(n, | −4 | A(n, k) | A(n, | A(n, | A(n, | 0 | 0 | |
| 1 | k + 1) | −3 | | k − 1) | k − 2) | k − 3) | 1 | 0 | |
| 2 | | −3 | | | | | 0 | −1 | |
| 3 | | −3 | | | | | 0 | 1 | |
| 4 | | −3 | | | | | 1 | 0 | |
| 5 | | −2 | | | | | −2 | 0 | |
| 6 | | −2 | | | | | −1 | −1 | |
| 7 | | −2 | | | | | −1 | 1 | a |
| 8 | | −2 | | | | | 0 | −2 | |
| 9 | | −2 | | | | | 0 | 2 | |
| 10 | | −2 | | | | | 2 | 0 | |
| 11 | | −2 | | | | | 1 | −1 | |
| 12 | | −2 | | | | | 1 | 1 | |
| 13 | | −1 | | | | | −3 | 0 | |
| 14 | | −1 | | | | | −2 | −1 | |
| 15 | | −1 | | | | | −2 | 1 | |
| 16 | | −1 | | | | | −1 | −2 | |
| 17 | | −1 | | | | | −1 | 2 | |
| 18 | | −1 | | | | | 0 | −3 | |
| 19 | | −1 | | | | | 0 | 3 | |
| 20 | | −1 | | | | | 3 | 0 | |
| 21 | | −1 | | | | | 2 | −1 | |
| 22 | | −1 | | | | | 2 | 1 | |

TABLE 4-continued

Example prior art PVQ indexing scheme.

| ind | p0 | | | | p1 | p2 | Com. |
|---|---|---|---|---|---|---|---|
| 23 | −1 | | | | 1 | −2 | |
| 24 | −1 | | | | 1 | 2 | |
| 25 | 0 | | | | −4 | 0 | |
| 26 | 0 | | | | −3 | −1 | |
| 27 | 0 | | | | −3 | 1 | |
| 28 | 0 | | | | −2 | −2 | |
| 29 | 0 | | | | −2 | 2 | |
| 30 | 0 | | | | −1 | −3 | |
| 31 | 0 | A(n, | | | −1 | 3 | |
| 32 | 0 | k − 1) | | | 0 | −4 | |
| 33 | 0 | | | | 0 | 4 | b |
| 34 | 0 | | | | 4 | 0 | |
| 35 | 0 | | | | 3 | −1 | |
| 36 | 0 | | | | 3 | 1 | |
| 37 | 0 | | | | 2 | −2 | |
| 38 | 0 | | | | 2 | 2 | |
| 39 | 0 | | | | 1 | −3 | |
| 40 | 0 | | | | 1 | 3 | |
| 41 | A(n, k) | 4 | A(n, | A(n, | A(n, | 0 | 0 | c |
| 42 | 3 | k − 1) | k − 2) | k − 3) | −1 | 0 | |
| 43 | 3 | | | | 0 | −1 | |
| 44 | 3 | | | | 0 | 1 | |
| 45 | 3 | | | | 1 | 0 | |
| 46 | 2 | | | | −2 | 0 | |
| 47 | 2 | | | | −1 | −1 | |
| 48 | 2 | | | | −1 | 1 | |
| 49 | 2 | | | | 0 | −2 | |
| 50 | 2 | | | | 0 | 2 | |
| 51 | 2 | | | | 2 | 0 | |
| 52 | 2 | | | | 1 | −1 | |
| 53 | 2 | | | | 1 | 1 | |
| 54 | 1 | A(n, | | | −3 | 0 | |
| 55 | 1 | k − 2) | | | −2 | −1 | |
| 56 | 1 | | | | −2 | 1 | |
| 57 | 1 | | | | −1 | −2 | |
| 58 | 1 | | | | −1 | 2 | |
| 59 | 1 | | | | 0 | −3 | |
| 60 | 1 | | | | 0 | 3 | |
| 61 | 1 | | | | 3 | 0 | |
| 62 | 1 | | | | 2 | −1 | |
| 63 | 1 | | | | 2 | 1 | |
| 64 | 1 | | | | 1 | −2 | |
| 65 | 1 | | | | 1 | 2 | |

The A and U relations can be graphically seen in Table 5 for the MPVQ(3,5) example, using a leading sign recursive solution. $N_{PVQ}(n=3, k=5) = 2 \cdot N_{MPVQ}(3,5) = 2 \cdot 51 = 102$, where the "2" corresponds to a now pre-extracted leading sign bit. The vector PVQ-vec=[p0,p1,p2], e.g. decoded index 8 is [3, −1, 1], sum(abs(PVQ-vec))=5, In the Table 5 below the now pre-extracted initial sign is positive (+), i.e. the value p0 below is always larger than or equal to 0. In the example the next leading sign is stored in the LSB-bit of the 2*U(n, k) sections.

TABLE 5

Example MPVQ(3, 5) LSB based leading sign enumeration.

| ind | Size (A(n, k)) | Size (U(n, k)) | Val. p0 | Size new K | lead sign | Val. p1 | lead sign | Val. p2 |
|---|---|---|---|---|---|---|---|---|
| 0 | A(n, K) = A(3, 5) | 1 | 5 | 1, new K = 5 | none | 0 | none | 0 |
| 1 | | 2*U(n, K) | 4 | new K = K − 4 = 1 | + | 1 | none | 0 |
| 2 | | | 4 | | − | −1 | none | 0 |
| 3 | | | 4 | | + | 0 | kept | 1 |
| 4 | | | 4 | | − | 0 | kept | −1 |
| 5 | | | 3 | new K = K − 3 = 2 | + | 2 | | 0 |
| 6 | | | 3 | | − | −2 | | 0 |
| 7 | | | 3 | | + | 1 | + | 1 |
| 8 | | | 3 | | − | −1 | + | 1 |
| 9 | | | 3 | | + | 1 | − | −1 |
| 10 | | | 3 | | − | −1 | − | −1 |
| 11 | | | 3 | | + | 0 | + | 2 |
| 12 | | | 3 | | − | 0 | − | −2 |
| 13 | | | 2 | | + | 3 | | 0 |
| 14 | | | 2 | new K = | − | −3 | | 0 |
| 15 | | | 2 | K − 2 = 3 | + | 2 | + | 1 |
| 16 | | | 2 | | − | −2 | + | 1 |
| 17 | | | 2 | | + | 2 | − | −1 |
| 18 | | | 2 | | − | −2 | − | −1 |
| 19 | | | 2 | | + | 1 | + | 2 |
| 20 | | | 2 | | − | −1 | + | 2 |
| 21 | | | 2 | | + | 1 | − | −2 |
| 22 | | | 2 | | − | −1 | − | −2 |
| 23 | | | 2 | | + | 0 | kept | 3 |
| 24 | | | 2 | | − | 0 | kept | −3 |
| 25 | | | 1 | new K = | + | 4 | none | 0 |
| 26 | | | 1 | K − 1 = 4 | − | −4 | none | 0 |
| 27 | | | 1 | | + | 3 | + | 1 |
| 28 | | | 1 | | − | −3 | + | 1 |
| 29 | | | 1 | | + | 3 | − | −1 |
| 30 | | | 1 | | − | −3 | − | −1 |
| 31 | | | 1 | | + | 2 | + | 2 |
| 32 | | | 1 | | − | −2 | + | 2 |
| 33 | | | 1 | | + | 2 | − | −2 |
| 34 | | | 1 | | − | −2 | − | −2 |
| 35 | | | 1 | | + | 1 | + | 3 |
| 36 | | | 1 | | − | −1 | + | 3 |
| 37 | | | 1 | | + | 1 | − | −3 |
| 38 | | | 1 | | − | −1 | − | −3 |
| 39 | | | 1 | | + | 0 | kept | 4 |
| 40 | | | 1 | | − | 0 | kept | −4 |
| 41 | (A(n, K + 1) − A(n, K))/2 | U(n, K + 1) − U(n, K) | 0 | size = 1 + U(n − 1, K) + U(n − 1, K + 1) new K = 5 | kept (+) | 5 | none | 0 |
| 42 | | | 0 | | | 4 | + | 1 |
| 43 | | | 0 | | | 4 | − | −1 |
| 44 | | | 0 | | | 3 | + | 2 |
| 45 | | | 0 | | | 3 | − | −2 |
| 46 | | | 0 | | | 2 | + | 3 |
| 47 | | | 0 | | | 2 | − | −3 |
| 48 | | | 0 | | | 1 | + | 4 |
| 49 | | | 0 | | | 1 | − | −4 |
| 50 | | | 0 | | | 0 | kept | 5 |

Table 6 illustrates index construction examples according to Table 5.

TABLE 6

Example MPVQ(3, 5) LSB based leading sign enumeration, index construction examples.

| index | Value p0 | lead sign | Value p1 | lead sign | Value p2 | Index construction examples |
|---|---|---|---|---|---|---|
| 0 | 5 | none | 0 | none | 0 | A(3, 0) = 0 |
| 1 | 4 | + | 1 | none | 0 | A(3, 1) + 2*(A(2, 0) ) + 0 = 1 |
| 2 | 4 | − | −1 | none | 0 | A(3, 1) + 2*(A(2, 0) ) + 1 = 2 |
| 3 | 4 | + | 0 | kept | 1 | A(3, 1) + 2*(A(2, 1) ) + 0 = 3 |
| 4 | 4 | − | 0 | kept | −1 | A(3, 1) + 2*(A(2, 1) ) + 1 = 4 |
| 5 | 3 | + | 2 | | 0 | A(3, 2) + 2*(A(2, 0) ) + 0 = 5 |
| 6 | 3 | − | −2 | | 0 | A(3, 2) + 2*(A(2, 0) ) + 1 = 6 |
| 7 | 3 | + | 1 | + | 1 | A(3, 2) + 2*(A(2, 1)) + 0 = 7 |
| 8 | 3 | − | −1 | + | 1 | A(3, 2) + 2*(A(2, 1)) + 1 = 8 |
| 9 | 3 | + | 1 | − | −1 | A(3, 2) + 2*(A(2, 1) + 1 ) + 0 = 9 |
| 10 | 3 | − | −1 | − | −1 | A(3, 2) + 2*(A(2, 1) + 1) + 1 = 10 |
| 11 | 3 | + | 0 | + | 2 | |
| 12 | 3 | − | 0 | − | −2 | |
| 13 | 2 | + | 3 | | 0 | A(3, 3) + 2*0 + 0 = 13 |
| 14 | 2 | − | −3 | | 0 | A(3, 3) + 2*0 + 1 = 14 |
| 15 | 2 | + | 2 | + | 1 | A(3, 3) + 2*(A(2, 1) + 0) + 0 = 15 |

TABLE 6-continued

Example MPVQ(3, 5) LSB based leading sign enumeration, index construction examples.

| index | Value p0 | lead sign | Value p1 | lead sign | Value p2 | Index construction examples |
|---|---|---|---|---|---|---|
| 16 | 2 | − | −2 | + | 1 | A(3, 3) + 2*(A(2, 1) + 0) + 1 = 16 |
| 17 | 2 | + | 2 | − | −1 | A(3, 3) + 2*(A(2, 1) + 0) + 1 = 17 |
| 18 | 2 | − | −2 | − | −1 | A(3, 3) + 2*(A(2, 1) + 1) + 1 = 18 |
| 19 | 2 | + | 1 | + | 2 | |
| 20 | 2 | − | −1 | + | 2 | |
| 21 | 2 | + | 1 | − | −2 | |
| 22 | 2 | − | −1 | − | −2 | |
| 23 | 2 | + | 0 | kept | 3 | |
| 24 | 2 | − | 0 | kept | −3 | |
| 25 | 1 | + | 4 | none | 0 | A(3, 4) + 2*(A(2, 0) ) + 0 = 24 |
| 26 | 1 | − | −4 | none | 0 | A(3, 4) + 2*(A(2, 0) ) + 1 = 25 |
| 27 | 1 | + | 3 | + | 1 | |
| 28 | 1 | − | −3 | + | 1 | |
| 29 | 1 | + | 3 | − | −1 | |
| 30 | 1 | − | −3 | − | −1 | |
| 31 | 1 | + | 2 | + | 2 | |
| 32 | 1 | − | −2 | + | 2 | |
| 33 | 1 | + | 2 | − | −2 | |
| 34 | 1 | − | −2 | − | −2 | |
| 35 | 1 | + | 1 | + | 3 | |
| 36 | 1 | − | −1 | + | 3 | |
| 37 | 1 | + | 1 | − | −3 | A(3, 4) + 2*(A(2, 3) ) + 0 = 37 |
| 38 | 1 | − | −1 | − | −3 | A(3, 4) + 2*(A(2, 3) ) + 1 = 38 |
| 39 | 1 | + | 0 | kept | 4 | A(3, 4) + 2*(A(2, 3) ) + 0 = 39 |
| 40 | 1 | − | 0 | kept | −4 | A(3, 4) + 2*(A(2, 4) ) + 1 = 40 |
| 41 | 0 | kept | 5 | none | 0 | A(3, 5) = 41 |
| 42 | 0 | (+) | 4 | + | 1 | A(3, 5) + A(2, 1) + 0 = 42 |
| 43 | 0 | | 4 | − | −1 | A(3, 5) + A(2, 1) + 1 = 43 |
| 44 | 0 | | 3 | + | 2 | A(3, 5) + A(2, 2) + 0 = 44 |
| 45 | 0 | | 3 | − | −2 | A(3, 5) + A(2, 2) + 1 = 45 |
| 46 | 0 | | 2 | + | 3 | A(3, 5) + A(2, 3) + 0 = 46 |
| 47 | 0 | | 2 | − | −3 | A(3, 5) + A(2, 3) + 1 = 47 |
| 48 | 0 | | 1 | + | 4 | A(3, 5) + A(2, 4) + 0 = 48 |
| 49 | 0 | | 1 | − | −4 | A(3, 5) + A(2, 4) + 1 = 49 |
| 50 | 0 | | 0 | kept | 5 | A(3, 5) + A(2, 5) = 50 |

Note that the PVQ-size in Table 5 now has to be computed using $N_{MPVQ}=1+U(n,k)+U(n,K+1)$, as A(n,k+1), cannot be computed safely within the $2*N_{MPVQ}(n, k)$ bit-limit (e.g. 32 bits) for all n, k. Prior art uses PVQ-size=A(n,K+1)+A(n,K), or a summation over non-zero elements using MOPS costly combinatorial functions or a ROM costly table lookup of stored values.

A(n,k) can also be found as 1+2*U(n,k) in the basic recursion schematics of FIG. 5 (Sectioned positioning of the leading sign(s)) and in FIG. 2 (LSB positioning of the leading sign(s)).

In another part of the presently presented technology an optimized MPVQ-indexing through pre-extraction of sign encoding positions is described. It is also possible to optimize the encoder side MPVQ index composition inner loop by pre-extracting the MPVQ leading signs into a vector of sign encoding positions encode_sign [0 . . . N−1], and the actual sign to encode at that position, and the remaining initial leading sign. However, this requires running a pre-processing sign shifting function which may be costly in the case of few pulses. However, in some cases it can be the preferred way to implement the MPVQ-indexing as the inner loop of the index-composition becomes even more straightforward, and can be strongly optimized e.g. for DSP-pipelining.

FIG. 24 illustrates an example of sign pre-shifting that utilizes N=8 and K=13.

In FIG. 24, the encoding is done right to left, i.e. position (N−1) to position 0.

The pre-shifting function shifts the first sign to the variable 'lead_sign' and the rest of the signs in PVQ-vec are shifted to the next (to the left) non-zero position. The last non-zero position in PVQ-vec will always get a 0 value in the encode_sign vector.

Figure 18:
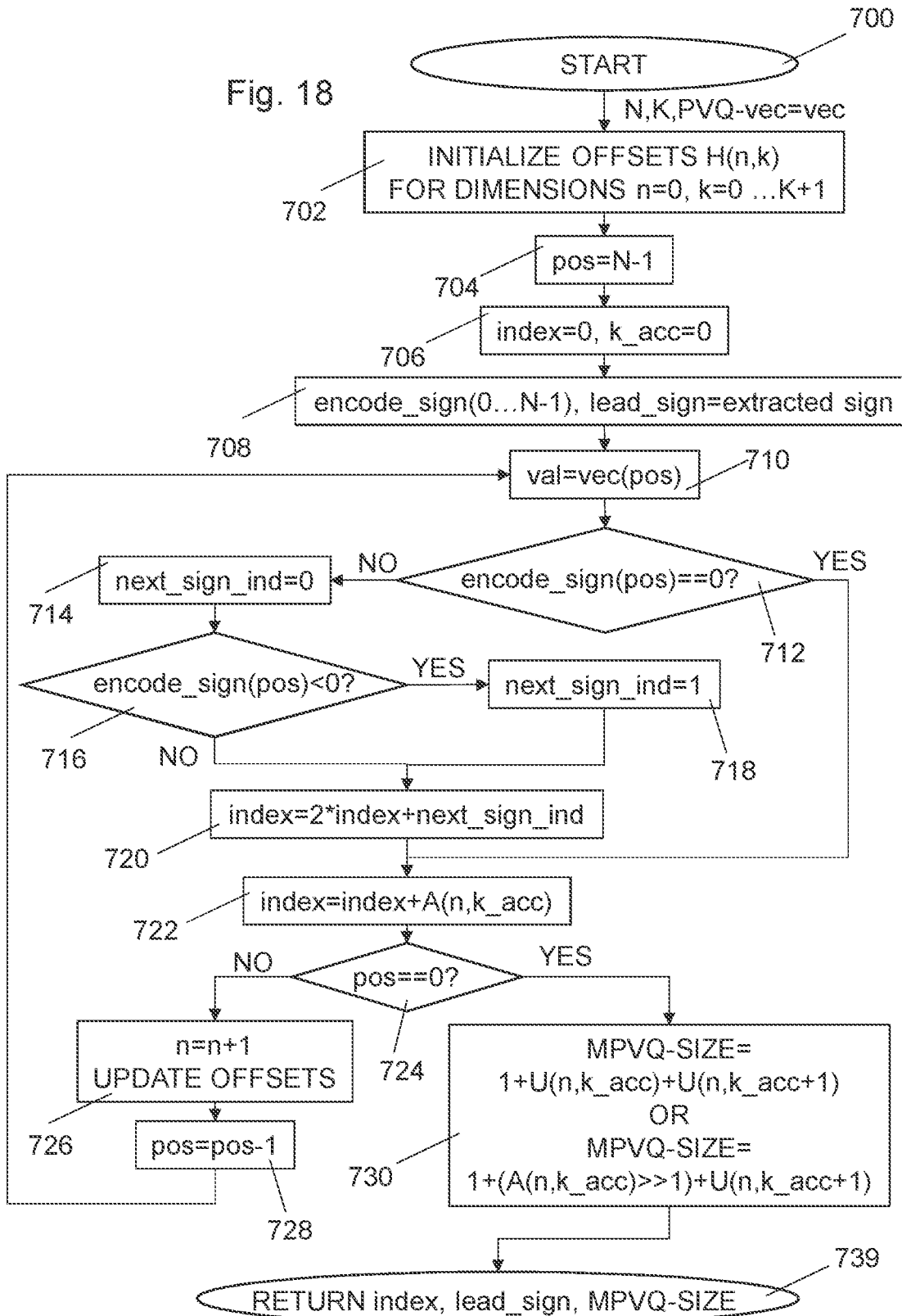
FIG. 18 is a flow diagram of steps of an embodiment of a MPVQ-index composition using pre-extracted leading signs.

FIG. 18 illustrates an embodiment of a MPVQ-index composition using pre-extracted leading signs. There, embodiments of detailed block diagrams for this MPVQ-index composition implementation are shown. The procedure to compose MPVQ index with pre-extracted leading signs and MPVQ size starts in step 700. This embodiment is based on a solution with next sign in LSB position. Input parameters are N, K and the PVQ-vector as "vec". Step 702 is an initializing step, with known offset recursion base case, and set n=1. In step 704, the position parameter is set to N−1, i.e. the vector is analyzed from the end towards the beginning starting with the last position. The accumulated index and the accumulated pulses are set to 0 in step 706. First, in step 708, the signs are analyzed, which will be described more in detail further below. The leading sign is thereby determined, and a sign vector is available. In step 710, a value is set equal to the current input vector coefficient. In steps 712-720, the accumulated index is adapted for the sign of the coefficient, if the coefficient is non-zero, in this embodiment by adding a LSB. In step 722, the accumulated index is modified according to the offset associated with the remaining unit pulses and the present dimension. If the present position is non-zero, as checked in step 724, i.e. the search has not reached the front of the input vector, a new repetition is prepared in steps 726 and 728 and the procedure returns to step 710. If the entire vector is searched, the MPVQ-SIZE is calculated in step 730 and the outgoing index, leading sign and MPVQ size are provided in step 739.

Figure 19:
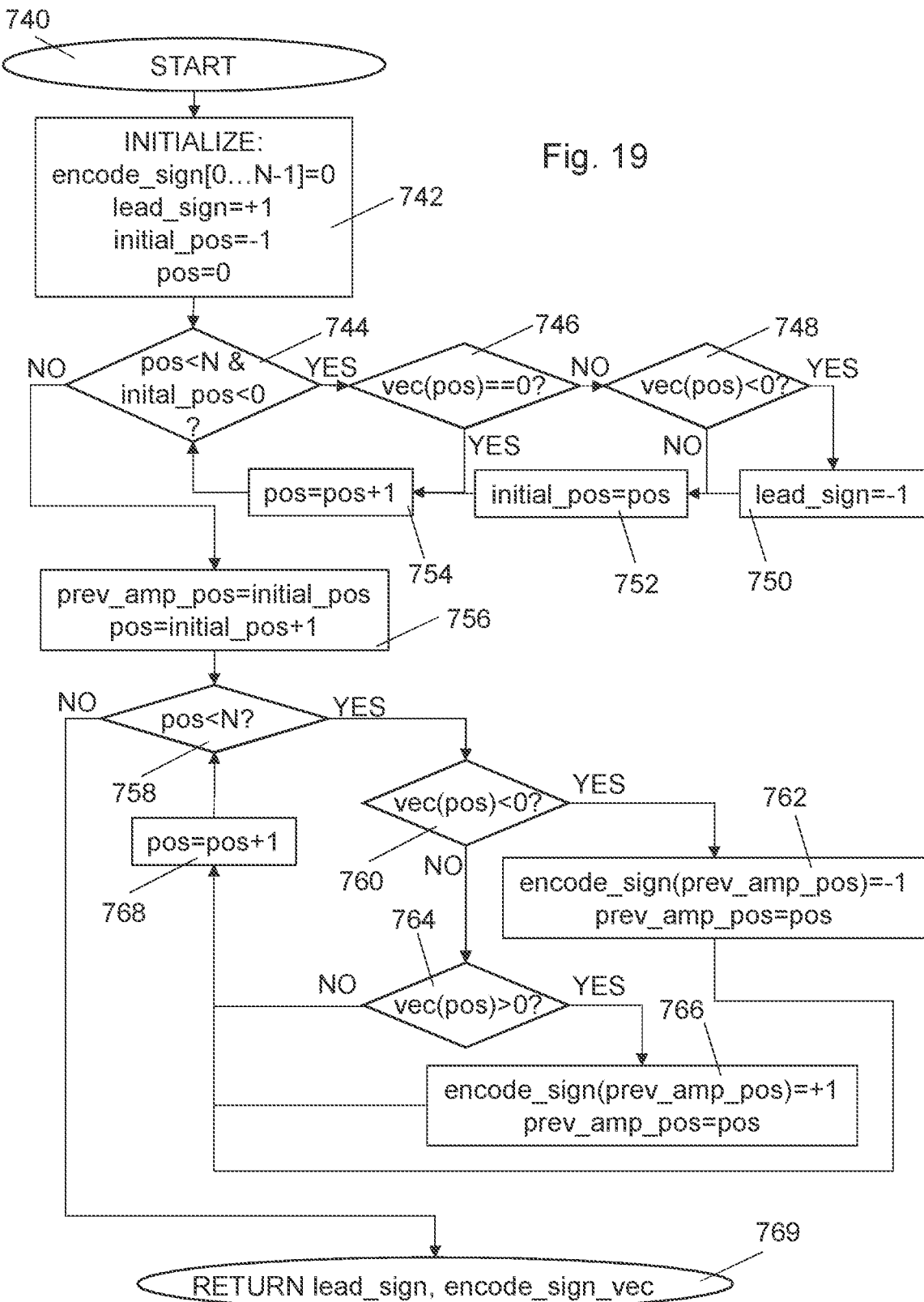
FIG. 19 is a flow diagram of steps of an embodiment of a sign extraction function.

FIG. 19 illustrates an embodiment of a sign extraction function. The procedure starts in step 740. In step 742, initializing is performed, giving an encoded sign vector 0-coefficients, assuming a positive leading sign, giving a temporary position of initial non-zero coefficient as −1 and starts with position number 0. In step 744, it is checked if the position is less than the maximum and still no leading sign is found. If so, in step 746, it is checked if the vector coefficient of the current position is zero. If so, the present position is stepped one step forward in step 754 and the process is iterated. If the present vector coefficient is non-zero, the procedure continues to step 748, where a negative coefficient results in a negative lead_sign in step 750. The position of the first non-zero coefficient is recorded as initial_pos in step 752 before the procedure continues to step 754. If it in step 744 is found that the leading sign is found, the procedure continues to step 756, in which the sign vector encode_sign procedure is initialized. Steps 758-766 continue to search through the input vector for non-zero coefficients, and corresponding positions in the sign vector are given the sign of the following non-zero coefficient. When all positions are investigated, the leading sign and the sign vector are returned in step 769.

A benefit with this approach is that the pre-shifting or pre-localization of the leading sign encoding positions makes it possible to avoid leading sign shuffling in the indexing inner iteration loop. This can be a benefit when one wants to optimize the encoding inner loop in certain hardware where branches (IFs/ELSEs) are costly to implement.

Table 7 illustrates an MPVQ Sectioned leading sign iteration example. $N_{PVQ}(n=3,k=5)=2*N_{MPVQ}(3,5)=2*51=102$, where the "2" corresponds to a now pre-extracted leading sign bit. The vector PVQ-vec=[p0, p1, p2], e.g. decoded index 8 is [3, 0, 2], sum(abs(PVQ-vec))=5. In the Table 7 the now pre-extracted initial sign is positive, in the example the next leading sign derived from the low/high sections of the 2*U(n, k) initial amplitude sections.

TABLE 7

Example MPVQ(3, 5) Sectioned leading sign enumeration.

| ind | Size (A(n, k)) | Size (U(n, k)) | Val. p0 | Size new K | lead sign | Val. p1 | lead sign | Val. p2 |
|---|---|---|---|---|---|---|---|---|
| 0 | A(n, K) = A(3, 5) | 1 | 5 | 1, new K = 5 | + | 0 | none | 0 |
| 1 |  | 2*U(n, K) | 4 | new K = K − 4 = 1 | + | 1 | none | 0 |
| 2 |  |  | 4 |  | − | 0 | kept | 1 |
| 3 |  |  | 4 |  | − | 1 | none | 0 |
| 4 |  |  | 4 |  | + | 0 | kept | 1 |
| 5 |  |  | 3 | new K = K − 3 = 2 | + | 2 | none | 0 |
| 6 |  |  | 3 |  | + | 1 | + | 1 |
| 7 |  |  | 3 |  | + | 1 | − | −1 |
| 8 |  |  | 3 |  | − | 0 | kept | 2 |
| 9 |  |  | 3 |  | − | −2 | none | 0 |
| 10 |  |  | 3 |  | − | −1 | + | 1 |
| 11 |  |  | 3 |  | − | −1 | − | −1 |
| 12 |  |  | 3 |  | + | 0 | kept | −2 |
| 13 |  |  | 2 | new K = K − 2 = 3 | + | 3 | none | 0 |
| 14 |  |  | 2 |  | + | 2 | + | 1 |
| 15 |  |  | 2 |  | + | 2 | − | −1 |
| 16 |  |  | 2 |  | + | 1 | + | 2 |
| 17 |  |  | 2 |  | + | 1 | − | −2 |
| 18 |  |  | 2 |  | − | 0 | kept | 3 |
| 19 |  |  | 2 |  | − | −3 | none | 0 |
| 20 |  |  | 2 |  | − | −2 | + | 1 |
| 21 |  |  | 2 |  | − | −2 | − | −1 |
| 22 |  |  | 2 |  | − | −1 | + | 2 |
| 23 |  |  | 2 |  | − | −1 | − | −2 |
| 24 |  |  | 2 |  | + | 0 | kept | −3 |
| 25 |  |  | 1 | new K = K − 1 = 4 | + | 4 | none | 0 |
| 26 |  |  | 1 |  | + | 3 | + | 1 |
| 27 |  |  | 1 |  | + | 3 | − | −1 |
| 28 |  |  | 1 |  | + | 2 | + | 2 |
| 29 |  |  | 1 |  | + | 2 | − | −2 |
| 30 |  |  | 1 |  | + | 1 | + | 3 |
| 31 |  |  | 1 |  | + | 1 | − | −3 |
| 32 |  |  | 1 |  | − | 0 | kept | 4 |
| 33 |  |  | 1 |  | − | −4 | none | 0 |
| 34 |  |  | 1 |  | − | −3 | + | 1 |
| 35 |  |  | 1 |  | − | −3 | − | −1 |
| 36 |  |  | 1 |  | − | −2 | + | 2 |
| 37 |  |  | 1 |  | − | −2 | − | −2 |
| 38 |  |  | 1 |  | − | −1 | + | 3 |
| 39 |  |  | 1 |  | − | −1 | − | −3 |
| 40 |  |  | 1 |  | − | 0 | kept | −4 |
| 41 | (A(n, K + 1) − A(n, K))/2 | U(n, K + 1) − U(n, K) | 0 | size = 1 + U(n − 1, K) + U(n − 1, K + 1) new K K = 5 | kept | 5 | none | 0 |
| 42 |  |  | 0 |  | (+) | 4 | + | 1 |
| 43 |  |  | 0 |  |  | 4 | − | −1 |
| 44 |  |  | 0 |  |  | 3 | + | 2 |
| 45 |  |  | 0 |  |  | 3 | − | −2 |
| 46 |  |  | 0 |  |  | 2 | + | 3 |
| 47 |  |  | 0 |  |  | 2 | − | −3 |
| 48 |  |  | 0 |  |  | 1 | + | 4 |
| 49 |  |  | 0 |  |  | 1 | − | −4 |
| 50 |  |  | 0 |  |  | 0 | kept | 5 |

Table 8 illustrates index construction examples according to Table 7.

In a further part of the presently presented technology a mixed low dynamic row-only recursion is described. If the k value is low enough, it is possible to calculate the offset needed for a given row n in the offset matrix A(n, k) using the new row-only recursion formula presented further below. Detailed derivation of the new recursion formulas are given in Appendix B. The generic recursive equation for a given row n for the PVQ difference offset A(n,k), is used in the 2012 prior art IETF/OPUS-Audio code:

$$A(n,k)=A(n,k-2)+((2*n-1)*A(n,k-1)-A(n,k-2))/(k-1).$$

TABLE 8

Example MPVQ(3, 5) Sectioned leading sign enumeration, index construction examples.

| Value index | Value p0 | lead sign | Value p1 | lead sign | Value p2 | Index construction examples |
|---|---|---|---|---|---|---|
| 0 | 5 | + | 0 | none | 0 | A(3, 0) = 0 |
| 1 | 4 | + | 1 | none | 0 |  |
| 2 | 4 | − | 0 | kept | 1 |  |
| 3 | 4 | − | 1 | none | 0 |  |
| 4 | 4 | + | 0 | kept | 1 |  |
| 5 | 3 | + | 2 | none | 0 |  |
| 6 | 3 | + | 1 | + | 1 |  |
| 7 | 3 | + | 1 | − | −1 |  |
| 8 | 3 | − | 0 | kept | 2 |  |
| 9 | 3 | − | −2 | none | 0 |  |
| 10 | 3 | − | −1 | + | 1 |  |
| 11 | 3 | − | −1 | − | −1 |  |
| 12 | 3 | + | 0 | kept | −2 |  |
| 13 | 2 | + | 3 | none | 0 | A(3, 3) + 0*(A(3, 4) − (A3, 3))/2 = 13 |
| 14 | 2 | + | 2 | + | 1 |  |
| 15 | 2 | + | 2 | − | −1 |  |
| 16 | 2 | + | 1 | + | 2 |  |
| 17 | 2 | + | 1 | − | −2 |  |
| 18 | 2 | − | 0 | kept | 3 |  |
| 19 | 2 | − | −3 | none | 0 | A(3, 3) + (A(3, 4) − (A3, 3))/2 = 19 |
| 20 | 2 | − | −2 | + | 1 |  |
| 21 | 2 | − | −2 | − | −1 |  |
| 22 | 2 | − | −1 | + | 2 |  |
| 23 | 2 | − | −1 | − | −2 |  |
| 24 | 2 | + | 0 | kept | −3 |  |
| 25 | 1 | + | 4 | none | 0 | A(3, 4) + 0*(A(3, 5) − (A3, 4))/2 = 25 |
| 26 | 1 | + | 3 | + | 1 |  |
| 27 | 1 | + | 3 | − | −1 |  |
| 28 | 1 | + | 2 | + | 2 |  |
| 29 | 1 | + | 2 | − | −2 |  |
| 30 | 1 | + | 1 | + | 3 |  |
| 31 | 1 | + | 1 | − | −3 |  |
| 32 | 1 | − | 0 | kept | 4 |  |
| 33 | 1 | − | −4 | none | 0 | A(3, 4) + (A(3, 5) − (A3, 4))/2 = 33 |
| 34 | 1 | − | −3 | + | 1 |  |
| 35 | 1 | − | −3 | − | −1 |  |
| 36 | 1 | − | −2 | + | 2 |  |
| 37 | 1 | − | −2 | − | −2 |  |
| 38 | 1 | − | −1 | + | 3 |  |
| 39 | 1 | − | −1 | − | −3 |  |
| 40 | 1 | − | 0 | kept | −4 |  |
| 41 | 0 | kept | 5 | none | 0 | A(3, 5) = 41 |
| 42 | 0 | (+) | 4 | + | 1 | A(3, 5) + A(2, 1) + 0 = 42 |
| 43 | 0 |  | 4 | − | −1 | A(3, 5) + A(2, 1) + 1 = 43 |
| 44 | 0 |  | 3 | + | 2 | A(3, 5) + A(2, 2) + 0 = 44 |
| 45 | 0 |  | 3 | − | −2 | A(3, 5) + A(2, 2) + 1 = 45 |
| 46 | 0 |  | 2 | + | 3 | A(3, 5) + A(2, 3) + 0 = 46 |
| 47 | 0 |  | 2 | − | −3 | A(3, 5) + A(2, 3) + 1 = 47 |
| 48 | 0 |  | 1 | + | 4 | A(3, 5) + A(2, 4) + 0 = 48 |
| 49 | 0 |  | 1 | − | −4 | A(3, 5) + A(2, 4) + 1 = 49 |
| 50 | 0 |  | 0 | kept | 5 | A(3, 5) + A(2, 5) = 50 |

By massaging and manipulation the equation above and using the new relation that $$U(n,k)=(A(n,k)-1)/2,$$

one can obtain a new preferred lower dynamic range mixed recursion formula:

$$U(n,k)=U(n,k-2)+(n*A(n,k-1)-N_{MPVQ}(n,k-2))/(k-1),$$

where $N_{MPVQ}(n,k)=1+U(n,k)+U(n,k+1)$, (the MPVQ(n,k) size).

The new numerator term n*A(n, k−1) is here of much lower dynamic range than the corresponding prior art numerator term (2*n−1)*A(n,k−1).

In a preferred solution this row-only recursion can be further massaged to only use past A(n k) values for row n, by using the fact that A(n, k) is odd for k>0. We obtain a new very efficient mixed recursion formula:

$$U(n,k)=A(n,k-2)\!\gg\!1+(n^*A(n,k-1)-(1+A(n,k-1)\!\gg\!1+A(n,k-2)\!\gg\!1))/(k-1),$$

where ">>" is integer division by 2, a low cost right shift in most hardware.

This enables the use of fast row-only recursions with limited precision, e.g. within 64 or 32 or 33 bits, for higher n and higher k values than the prior art row-only recursion. In other words, the new n*A(n,k−1) term overflows/wraps later than the old term 2*n*A(n, k−1) as one increases the range of n's or k's, for the row recursion.

The dynamic benefit of optimized row-only recursion can also be seen indirectly in the reduced dynamic offset Table 2, and also in the mixed recursion offset Table 3, as the U(n,k) resulting offsets have lower dynamics than the previously used A(n, k).

In a further part of the presently presented technology a Mixed MPVQ leading sign iteration and any legacy PVQ iteration is described. Another possible enumeration alternative is to employ an initial MPVQ-leading sign enumeration stage followed by any other efficient PVQ-enumeration scheme, for the remainder of the vector. In other words, whenever the second leading sign is to be enumerated, the PVQ-enumeration method in use can be switched to a legacy scheme. The initial leading sign MPVQ stages will make it possible to use one bit more than the legacy short codeword scheme, and the initial MPVQ stage will reduce the dynamics of the offsets (A,U) to at least 1 bit less, after the first MPVQ stage.

Table 99 shows an example deindexing structure and results for MPVQH, a hybrid combination a first MPVQ stage followed by a second OPUS/IETF-Audio magnitude and (Size PVQ(n, k)=A(n,k)+A(n, k+1)) based enumeration stage.

TABLE 9

Example MPVQH(3, 5) hybrid single leading sign enumeration.

| ind | Size | Val p0 | Size | | | Val p1 | Size | | | | Val p2 | Size |
|---|---|---|---|---|---|---|---|---|---|---|---|---|
| 0 | 1 | −5 | 1 | 1 | 1 | 1 | 0 | 1 | 1 | 1 | 0 | 1 |
| 1 | | −4 | | | | 2* | −1 | 3 | | | 0 | 1 |
| 2 | | −4 | | | | U(3, | 0 | | | | −1 | 2 |
| 3 | | −4 | | | | k − | 0 | | | | 1 | |
| 4 | U(3, k) + | −4 | 2* | 2* | 2* | 3 = | 1 | 1 | | | 0 | 1 |
| 5 | U(3, k + | −3 | U(3, | U(3, | U(3, | 2*2 | −2 | 5 | | | 0 | 1 |
| 6 | 1) = | −3 | k) = | k − | k − | | −1 | | | | −1 | 2 |
| 7 | 20 + 30 = | −3 | 2*20 | 1) = | 2) = | | −1 | | | | 1 | |
| 8 | 50 | −3, | | 2*1 | 2*6 | | 0 | | | | −2 | 2 |
| 9 | (This | −3 | | 2 | | | 0 | | | | 2 | |
| 10 | sum | −3 | | | | | 2 | 3 | | | 0 | 1 |
| 11 | has to | −3 | | | | | 1 | | | | −1 | 2 |
| 12 | be | −3 | | | | | 1 | | | | 1 | |
| 13 | below | −2 | | | | | −3 | 7 | | | 0 | 1 |
| 14 | the | −2 | | | | | −2 | | | | −1 | 2 |
| 15 | target | −2 | | | | | −2 | | | | 1 | |
| 16 | indexing | −2 | | | | | −1 | | | | −2 | 2 |
| 17 | numerical | −2 | | | | | −1 | | | | 2 | |
| 18 | dynamics | −2 | | | | | 0 | | [p1 , p2] section | | | −3 | 2 |
| 19 | e.g. | −2 | | | | | 0 | | where the sub- | | | | |
| 20 | <2³² or | −2 | | | | | 3 | 5 | index is encoded | | | 0 | 1 |
| 21 | <2³¹) | −2 | | | | | 2 | | as PVQ(2, | | | −1 | 2 |
| 22 | | −2 | | | | | 2 | | remaining | | | 1 | |
| 23 | | −2 | | | | | 1 | | k) sub pyramid | | | −2 | 2 |
| 24 | | −2 | | | | | 1 | | using any other | | | 2 | |
| 25 | | −1 | | | | | −4 | 9 | PVQ scheme, like | | | 0 | 1 |
| 26 | | −1 | | | | | −3 | | the IETF/OPUS- | | | −1 | 2 |
| 27 | | −1 | | | | | −3 | | Audio magnitude | | | 1 | |
| 28 | | −1 | | | | | −2 | | scheme. | | | −2 | 2 |
| 29 | | −1 | | | | | −2 | | | | | 2 | |
| 30 | | −1 | | | | | −1 | | | | | −3 | 2 |
| 31 | | −1 | | | | | −1 | | | | | 3 | |
| 32 | | −1 | | | | | 0 | | | | | −4 | 2 |
| 33 | | −1 | | | | | 0 | | | | | 4 | |
| 34 | | −1 | | | | | 4 | | | | | 0 | 1 |
| 35 | | −1 | | | | | 3 | | | | | −1 | 2 |
| 36 | | −1 | | | | | 3 | | | | | 1 | |
| 37 | | −1 | | | | | 2 | 7 | | | | −2 | 2 |
| 38 | | −1 | | | | | 2 | | | | | 2 | |
| 39 | | −1 | | | | | 1 | | | | | −3 | 2 |
| 40 | | −1 | | | | | 1 | | | | | 3 | |
| 41 | | 0 | M(2, | | | | −5 | 1 | 1 | 1 | 1 | 0 | 1 |
| 42 | | 0 | k) = | | | | −4 | 2* | 2* | 2* | 2*U(2, | −1 | 2 |
| 43 | | 0 | 1 + | | | | −4 | U(2, | U(2, | U(2, | k − 3) | 1 | |
| 44 | | 0 | U(2, | | | | −3 | k) | k − | k − | | −2 | 2 |
| 45 | | 0 | k + | | | | −3 | | 1) | 2) | | 2 | |
| 46 | | 0 | 1) + | | | | −2 | | | | | −3 | 2 |
| 47 | | 0 | U(2, | | | | −2 | | | | | 3 | |

TABLE 9-continued

Example MPVQH(3, 5) hybrid single leading sign enumeration.

| ind | Size | Val p0 | Size | Val p1 | Size | Val p2 | Size |
|---|---|---|---|---|---|---|---|
| 48 |  | 0 | k) = | −1 |  | −4 | 2 |
| 49 |  | 0 | 10 | −1 |  | 4 |  |
| 50 |  | 0 |  | 0 | M(1, k) | −5 | 1 |

MPVQ-variation for (n=3,k=5). This hybrid version uses single leading sign iterative indexing stage followed by a prior art IETF/OPUS like [{−, 0}/+] magnitude based PVQ-indexing stage cells, $N_{PVQ}=2*N_{MPVQ}=2*51=102$, where the "2" corresponds to a single initial single extracted leading sign bit.

The drawback with a hybrid scheme (like the above exemplified MPVQH) using a first MPVQ(n,k) stage and then another pyramid based PVQ-enumeration stage (above a IETF/OPUS-like magnitude stage) when a second sign is to be added, is that the PROM code size will be quite much larger, and that the switch of indexing method inside the iteration loop will require further decision logic requiring further DSP cycles inside the critical iteration loops. Also several offsets memories may have to be maintained. However a hybrid MPVQ single leading sign stage followed by stages of a subsequent regular PVQ scheme can also provide the benefit of extending the total short codeword size by 1 bit, e.g. from 32 to 33 bits.

In the above described embodiments, the leading sign has been selected as the sign of the first non-zero coefficient in the vector. However, in other embodiments, the leading sign can also be selected as the last non-zero coefficient in the vector. The leading sign is thus a sign of a terminal non-zero coefficient in the integer input vector or the integer output vector. The terminal non-zero coefficient is one of a first non-zero coefficient and a last non-zero coefficient in the integer input vector or the integer output vector. The use of extracting the leading sign is that the remaining indexing can be simplified. One prominent reason is that the indexing scheme can reduced by a factor 2. Before the indexing, it is not known how many non-zero coefficients there are in the vector to be treated. However, there is always a terminal non-zero coefficient.

In the above described embodiments, it has also been assumed that the indexing of the integer input vector starts from the last coefficient and ends with the first coefficient, and that the de-indexing starts with the first coefficient of the integer output vector and ends with the last. In alternative embodiments, the indexing may instead start with the first vector coefficient and end with the last, whereas the de-indexing starts with the last coefficient and ends with the first. This can be combined with any of the alternative of the terminal non-zero coefficients. In further embodiments, the indexing may pick the coefficients of the integer input vector in any predetermined order, and the corresponding de-indexing then goes through the coefficients of the integer output vector in the opposite direction. The pyramid vector quantization enumeration scheme and the pyramid vector quantization de-enumeration scheme may then be adapted accordingly. In one particular embodiment, the "position" in the integer input/output vector can be a position in the assumed treatment order and do not have to correspond to the actual position within the vector itself.

The proposed technology may in particular embodiments be applied to a user terminal or user equipment, which may be a wired or wireless device.

As used herein, the non-limiting terms "User Equipment" (UE) and "wireless device" may refer to a mobile phone, a cellular phone, a Personal Digital Assistant, PDA, equipped with radio communication capabilities, a smart phone, a laptop or Personal Computer (PC) equipped with an internal or external mobile broadband modem, a tablet PC with radio communication capabilities, a target device, a device to device UE, a machine type UE or UE capable of machine to machine communication, iPAD, Customer Premises Equipment (CPE), Laptop Embedded Equipment (LEE), Laptop Mounted Equipment (LME), Universal Serial Bus (USB) dongle, a portable electronic radio communication device, a sensor device equipped with radio communication capabilities or the like. In particular, the term "UE" and the term "wireless device" should be interpreted as non-limiting terms comprising any type of wireless device communicating with a radio network node in a cellular or mobile communication system or any device equipped with radio circuitry for wireless communication according to any relevant standard for communication within a cellular or mobile communication system.

As used herein, the term "wired device" may refer to any device configured or prepared for wired connection to a network. In particular, the wired device may be at least some of the above devices, with or without radio communication capability, when configured for wired connection.

The proposed technology may in particular embodiments be applied to a network node, which may be a wired or wireless device.

The network node can in particular embodiments be a radio network node. As used herein, the non-limiting term "radio network node" may refer to base stations, network control nodes such as network controllers, radio network controllers, base station controllers, and the like. In particular, the term "base station" may encompass different types of radio base stations including standardized base stations such as Node Bs, or evolved Node Bs, eNBs, and also macro/micro/pico radio base stations, home base stations, also known as femto base stations, relay nodes, repeaters, radio access points, base transceiver stations, BTSs, and even radio control nodes controlling one or more Remote Radio Units, RRUs, or the like.

The network node can in particular embodiments be a network node in a wired communication system.

The UE or network node may also include radio circuitry for communication with one or more other nodes, including transmitting and/or receiving information.

It will be appreciated that the methods and devices described herein can be combined and re-arranged in a variety of ways.

For example, embodiments may be implemented in hardware, or in software for execution by suitable processing circuitry, or a combination thereof.

The steps, functions, procedures, modules and/or blocks described herein may be implemented in hardware using any conventional technology, such as discrete circuit or integrated circuit technology, including both general-purpose electronic circuitry and application-specific circuitry.

Particular examples include one or more suitably configured digital signal processors and other known electronic circuits, e.g. discrete logic gates interconnected to perform a specialized function, or Application Specific Integrated Circuits (ASICs).

Alternatively, at least some of the steps, functions, procedures, modules and/or blocks described herein may be implemented in software such as a computer program for execution by suitable processing circuitry such as one or more processors or processing units.

The flow diagram or diagrams presented herein may therefore be regarded as a computer flow diagram or diagrams, when performed by one or more processors. A corresponding apparatus may be defined as a group of function modules, where each step performed by the processor corresponds to a function module. In this case, the function modules are implemented as a computer program running on the processor.

Examples of processing circuitry includes, but is not limited to, one or more microprocessors, one or more Digital Signal Processors, DSPs, one or more Central Processing Units, CPUs, video acceleration hardware, and/or any suitable programmable logic circuitry such as one or more Field Programmable Gate Arrays, FPGAs, or one or more Programmable Logic Controllers, PLCs.

It should also be understood that it may be possible to re-use the general processing capabilities of any conventional device or unit in which the proposed technology is implemented. It may also be possible to re-use existing software, e.g. by reprogramming of the existing software or by adding new software components.

The proposed technology provides an encoder configured to encode audio/video signals, wherein the encoder is configured to obtain an integer input vector representing audio/video signal samples, which integer input vector has a number of integer-valued coefficients, extract a leading sign from said integer input vector, said leading sign being a sign of a terminal non-zero coefficient in the input vector, said terminal non-zero coefficient being one of a first non-zero coefficient and a last non-zero coefficient in the integer input vector, index said integer input vector with a pyramid vector quantization enumeration scheme into an output index, which output index together with said leading sign representing audio/video signal samples, wherein the pyramid vector quantization enumeration scheme is designed for neglecting the sign of the terminal non-zero coefficient, and to output the leading sign as a first codeword and the output index as a second codeword into an outgoing bit stream.

In a particular example, the encoder comprises a processor and a memory. The memory comprising instructions executable by the processor, whereby the encoder/processor is operative to obtain an integer input vector representing audio/video signal samples, which integer input vector has a number of integer-valued coefficients, extract a leading sign from said integer input vector, said leading sign being a sign of a terminal non-zero coefficient in the input vector, said terminal non-zero coefficient being one of a first non-zero coefficient and a last non-zero coefficient in the integer input vector, index said integer input vector with a pyramid vector quantization enumeration scheme into an output index, which output index together with the leading sign representing audio/video signal samples, wherein the pyramid vector quantization enumeration scheme is designed for neglecting the sign of the terminal non-zero coefficient, and to output the leading sign as a first codeword and the output index as a second codeword into an outgoing bit stream.

The proposed technology also provides a decoder configured deindex into audio/video samples by pyramid vector quantization, wherein the decoder is configured to receive a leading sign as a first codeword and an input index as a second codeword from an ingoing bit stream, the leading sign and the input index representing audio/video signal samples, which leading sign is a sign of a terminal non-zero coefficient in an integer output vector to be created, representing the audio/video signal samples, which integer output vector has a number of integer-valued coefficients, which terminal non-zero coefficient is one of a first non-zero coefficient and a last non-zero coefficient in the integer output vector, deindex the input index into the integer output vector with a pyramid vector quantization de-enumeration scheme, wherein the input index being created by an enumeration scheme is designed for neglecting the sign of the terminal non-zero coefficient, assign a sign of the terminating non-zero coefficient according to the received leading sign, and to output the vector.

Figure 20:
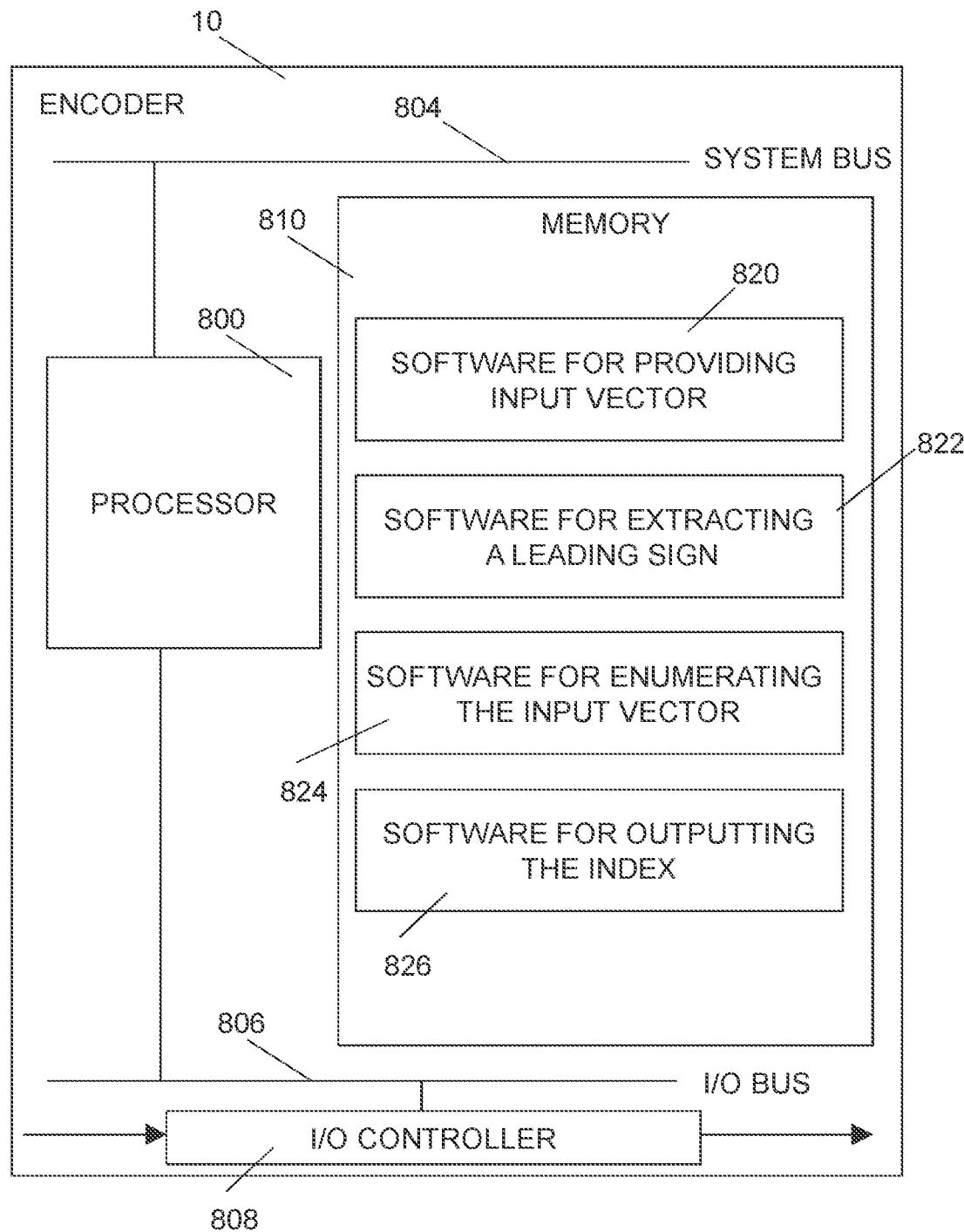
FIG. 20 illustrates schematically an embodiment of an encoder.

In a particular example, the decoder comprises a processor and a memory. The memory comprising instructions executable by the processor, whereby the decoder/processor is operative to receive a leading sign as a first codeword and an input index as a second codeword from an ingoing bit stream, the leading sign and the input index representing audio/video signal samples, which leading sign is a sign of a terminal non-zero coefficient in an integer output vector to be created, representing the audio/video signal samples, which integer output vector has a number of integer-valued coefficients, which terminal non-zero coefficient is one of a first non-zero coefficient and a last non-zero coefficient in the integer output vector, deindex the input index into the integer output vector with a pyramid vector quantization de-enumeration scheme, wherein the input index being created by an enumeration scheme is designed for neglecting the sign of the terminal non-zero coefficient, assign a sign of the terminating non-zero coefficient according to the received leading sign, and to output the vector In the following, an example of a computer implementation will be described with reference to FIG. 20. The encoder 10 comprises processing circuitry such as one or more processors 800 and a memory 810. In this particular example, at least some of the steps, functions, procedures, modules and/or blocks described herein are implemented in a computer program 820-826, which is loaded into the memory for execution by the processing circuitry. The processing circuitry and memory are interconnected to each other to enable normal software execution. An optional input/output 804-808 device may also be interconnected to the processing circuitry and/or the memory to enable input and/or output of relevant data such as input parameter(s) and/or resulting output parameter(s).

Figure 21:
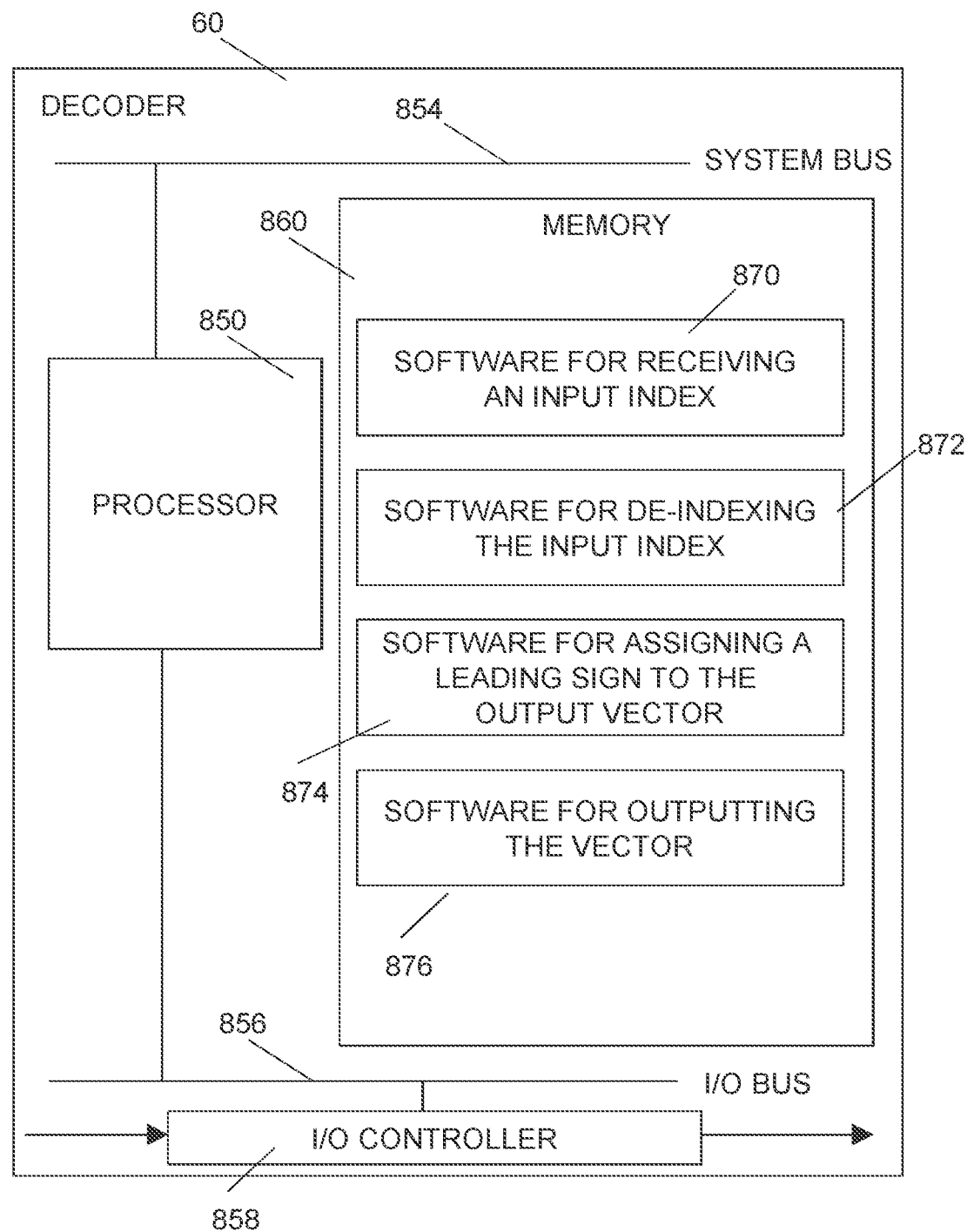
FIG. 21 illustrates schematically an embodiment of a decoder.

In the following, another example of a computer implementation will be described with reference to FIG. 21. The decoder 60 comprises processing circuitry such as one or more processors 850 and a memory 860. In this particular example, at least some of the steps, functions, procedures, modules and/or blocks described herein are implemented in a computer program 870-876, which is loaded into the memory for execution by the processing circuitry. The processing circuitry and memory are interconnected to each other to enable normal software execution. An optional input/output device 854-858 may also be interconnected to the processing circuitry and/or the memory to enable input and/or output of relevant data such as input parameter(s) and/or resulting output parameter(s).

The term 'computer' should be interpreted in a general sense as any system or device capable of executing program code or computer program instructions to perform a particular processing, determining or computing task.

In a particular embodiment, the computer program comprises instructions, which when executed by at least one processor, cause the processor(s) to obtain an integer input vector representing said audio/video signal samples, which integer input vector has a number of integer-valued coefficients, to extract a leading sign from the integer input vector, which leading sign is a sign of a terminal non-zero coefficient in the integer input vector, which terminal non-zero coefficient is one of a first non-zero coefficient and a last non-zero coefficient in the integer input vector, to index the integer input vector with a pyramid vector quantization enumeration scheme into an output index, which output index together with the leading sign representing the audio/video signal samples, which pyramid vector quantization enumeration scheme neglecting the sign of the terminal non-zero coefficient, and to output the leading sign as a first codeword and the output index as a second codeword into an outgoing bit stream.

In a particular embodiment, the computer program comprises instructions, which when executed by at least one processor, cause the processor(s) to receive a leading sign as a first codeword and an input index as a second codeword from an ingoing bit stream, where the leading sign and the input index represent audio/video signal samples, which leading sign is a sign of a terminal non-zero coefficient in an integer output vector to be created, representing the audio/video signal samples, which integer output vector has a number of integer-valued coefficients, which terminal non-zero coefficient is one of a first non-zero coefficient and a last non-zero coefficient in the integer output vector, to deindex the input index into the integer output vector with a pyramid vector quantization de-enumeration scheme, which input index is created by an enumeration scheme neglecting the sign of said terminal non-zero coefficient, to assigning a sign of the terminating non-zero coefficient according to the received leading sign, and to output the integer output vector.

The proposed technology also provides a carrier comprising the computer program, wherein the carrier is one of an electronic signal, an optical signal, an electromagnetic signal, a magnetic signal, an electric signal, a radio signal, a microwave signal, or a computer-readable storage medium.

The software or computer program may thus be realized as a computer program product, which is normally carried or stored on a computer-readable medium. The computer-readable medium may include one or more removable or non-removable memory devices including, but not limited to a Read-Only Memory, ROM, a Random Access Memory, RAM, a Compact Disc, CD, a Digital Versatile Disc, DVD, a Blueray disc, a Universal Serial Bus, USB, memory, a Hard Disk Drive, HDD storage device, a flash memory, a magnetic tape, or any other conventional memory device. The computer program may thus be loaded into the operating memory of a computer or equivalent processing device for execution by the processing circuitry thereof.

As indicated herein, the encoder may alternatively be defined as a group of function modules, where the function modules are implemented as a computer program running on at least one processor.

Figure 22:
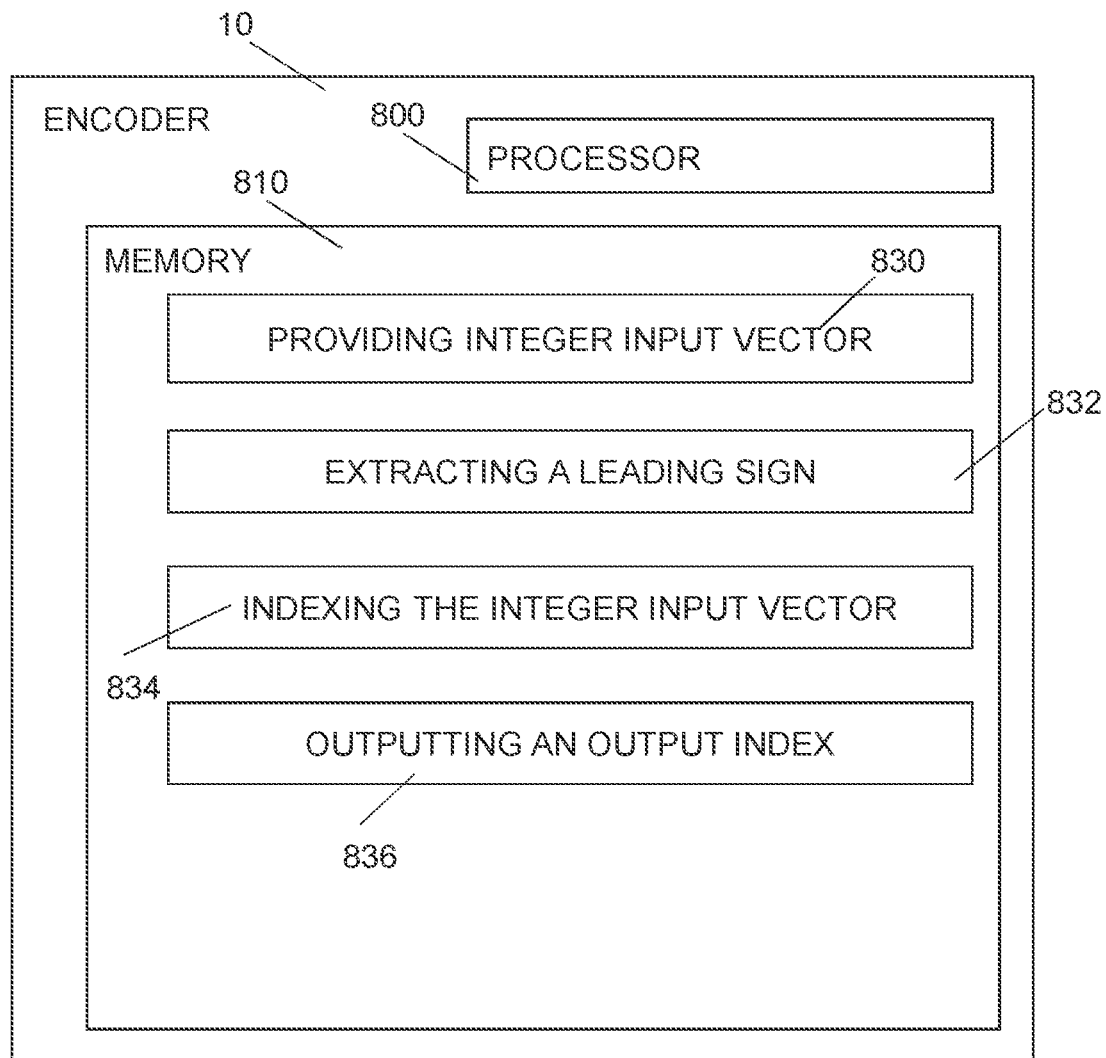
FIG. 22 illustrates schematically an embodiment of an encoder.

FIG. 22 is a schematic block diagram illustrating an example of an encoder 10 comprising a group of function modules 830-836.

The computer program residing in memory 810 may thus be organized as appropriate function modules 830-836 configured to perform, when executed by the processor 800, at least part of the steps and/or tasks described herein. An example of such function modules 830-836 is illustrated in FIG. 22.

As indicated herein, the decoder may alternatively be defined as a group of function modules, where the function modules are implemented as a computer program running on at least one processor.

Figure 23:
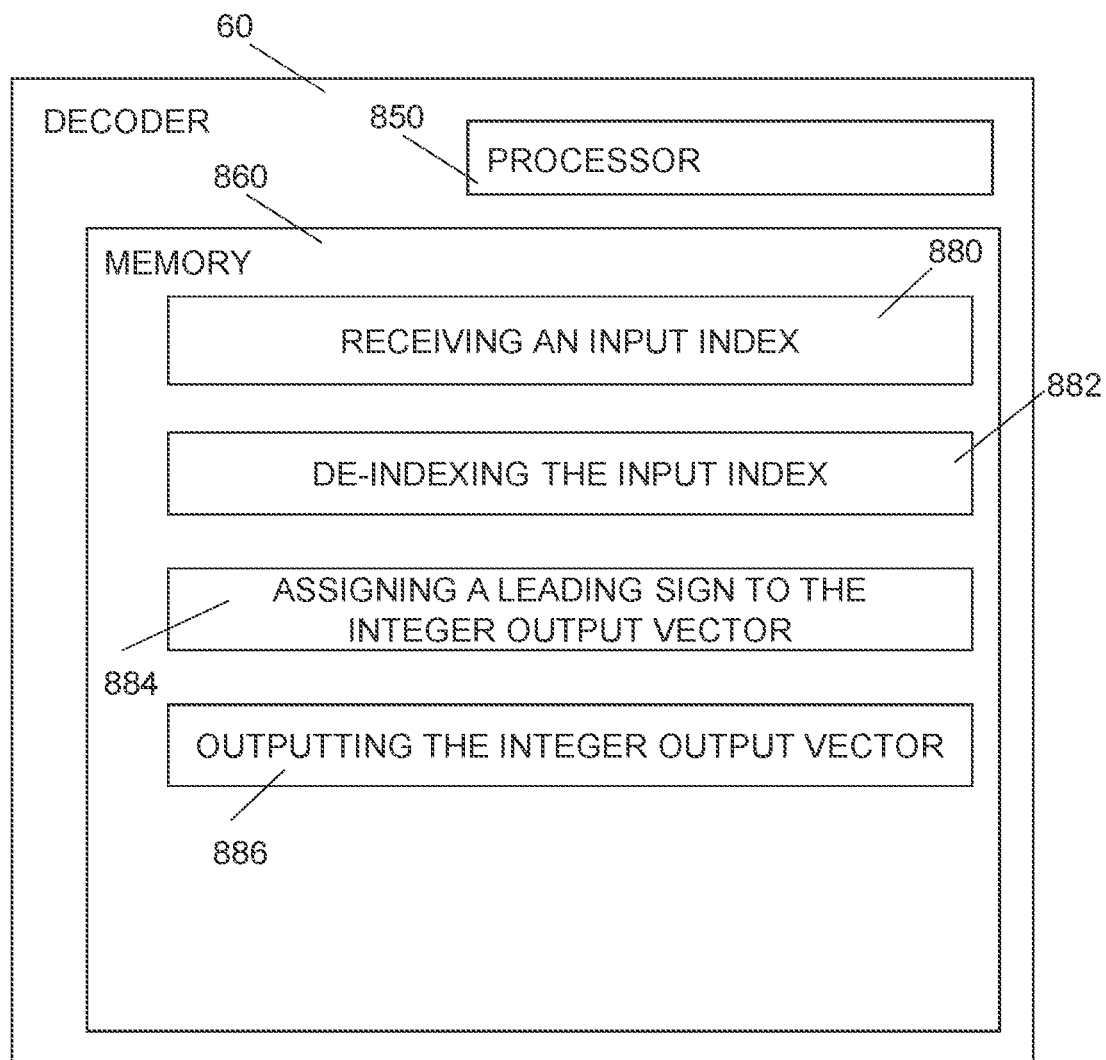
FIG. 23 illustrates schematically an embodiment of a decoder.

FIG. 23 is a schematic block diagram illustrating an example of a decoder 60 comprising a group of function modules 880-886.

The computer program residing in memory 860 may thus be organized as appropriate function modules 880-886 configured to perform, when executed by the processor 850, at least part of the steps and/or tasks described herein. An example of such function modules 880-886 is illustrated in FIG. 23.

The proposed approaches improves the performance of a short codeword based pyramid vector quantization schemes. The scheme reduces the dynamic range of the required indexing offsets. The desired side effect of the reduced dynamic range is that 1-bit larger 'short' PVQ-codewords can be used, without any significant penalty, for a given HW.

This makes it possible to use B+1 bit PVQ-codeword scheme on DSP hardware supporting B bit unsigned arithmetic, and this makes it possible to implement a B bit PVQ-codeword scheme on a DSP hardware which only supports signed B-bit integer arithmetic (with a B−1 bit magnitude).

Further, the overhead required for transmitting splitting side information will be reduced due to the capability of efficiently encoding 1-bit larger codewords. As an example is used, PVQ-encoding of k evenly distributed pulses in dimension N=128, where 5 bits is used to encode the relation for each binary dimension split and 71 bits were allocated to the PVQ over dimension N=128 by the audio codec bit-allocation algorithm. Optimal unrestricted PVQ gives:

$$\log 2(N_{PVQ}(N=128,k=12))=67.2 \text{ bits},$$

$$\log 2(N_{MPVQ}(N=128,k=12+1))=71.5 \text{ bits}.$$

67.2<71<71.5, i.e. 12 unit pulses are possible using an optimal unlimited PVQ over N=128, resulting in a pulse density of 12/128.

Legacy B=32 bit scheme requires 2 splits, into nearly equal dimensions [N1=43, N2=43, N3=42]:

$$2*\log 2(N_{PVQ}(43,4))+\log 2(N_{PVQ}(42,4))+2*5=63.25+2*5=73.25 \text{ bits}$$

73.25 is over the bit budget 71. By trying to reduce number of pulses by 1 to 11, one obtains:

$$2*\log 2(N_{PVQ}(43,4))+\log 2(N_{PVQ}(42,3))+2*5=58.84+2*5=68.84<71.$$

Resulting pulse density becomes 11/128.

Legacy B=32 bit scheme requires 2 splits, into non-uniform split dimensions [N1=64, N2=32, N3=32]:

$$\log 2(N_{PVQ}(64,6))+2*\log 2(N_{PVQ}(32,3))+2*5=53.34+2*5=73.34 \text{ bits}$$

73.25 is over the bit budget 71. By trying to reduce number of pulses by 1 to 11, one obtains:

$$2*\log2(N_{PVQ}(32,3))+\log2(N_{PVQ}(64,5))+2*5=58.92+2*5=68.9<71.$$

Resulting pulse density becomes 11/128.

New (B+1)=33-bit MPVQ scheme requires one split into [N1=64,N2=64]):

$$2*\log2(2*N_{MPVQ}(64,6))+5=2*32.51+5=70.02 \text{ bits}<71,$$

where $$2*N_{MPVQ}(64,6)=N_{PVQ}(64,6)=32.51>B.$$

Resulting pulse density becomes 12/128. In other words, given 71 bits allocated to dimension N=128 vector, the old 32 bit codeword scheme can only provide 11 pulses, while the new 33-bit codeword scheme can provide 12 pulses.

Due to its 1-bit larger encoding range of 33-bits, the new scheme is better suited to allocate bits according the audio codec's original bit allocation instructions, as the overhead for additional vectors splitting (often) may be reduced.

An example audio codec bit allocation scheme can be found in the ITU-T G.719 specification, section 7.5.2 or OPUUS RFC6716, section 4.3.4.1.

The embodiments described above are merely given as examples, and it should be understood that the proposed technology is not limited thereto. It will be understood by those skilled in the art that various modifications, combinations and changes may be made to the embodiments without departing from the present scope as defined by the appended claims. In particular, different part solutions in the different embodiments can be combined in other configurations, where technically possible.

ABBREVIATIONS

VQ Vector Quantizer/Quantization
PVQ Pyramid VQ
PVQ(n, k) The PVQ structure with dimension n and k unit pulses, the
PVQ(n, k) is pyramid structure with an L1-norm equaling k.
MPVQ leading sign Modular PVQ
MPVQ(n,k) The MPVQ structure with dimension n and k unit pulses, the MPVQ(n,k) structure is a sliced PVQ(n, k) pyramid structure, the L1-norm of MPVQ(n,k) is k.
$N_{PVQ}$(N,K) Size of PVQ (dimension N, K unit pulses)
$N_{MPVQ}$(N,K) Size of MPVQ (dimension N, K unit pulses)
SIMD Single Instruction Multiple Data (a DSP instruction category)
DSP Digital Signal Processor
HW HardWare
SW SoftWare
N,dim Dimension
n,l current dimension
k, K number of unit pulses in PVQ(n, k) and in MPVQ(n, k)
KMAX maximum K-value
B bit-limit in the target hardware system for efficient operations, typically (16), 32 or 64 bits in today's processors.
R bits per sample, or bits per coefficient,
x target vector
r, vec shape vector (also sometimes called residual)
G gain (scalar or vector) for scaling target vector
RAM Random Access Memory
OPS Operations Per Second
MOPS Million Operations Per Second
P-ROM Program ROM
ROM Read-Only Memory (typically pre-stored data)
LSB Least Significant Bit
MSB Most Significant Bit
LP Linear Prediction

APPENDIX A

In this appendix, relevant extracts from the IETF/OPUS audio PVQ-sections are included to establish the prior art status. The refined and optimized OPUS-Audio PVQ indexing/de-indexing algorithm involve several optimizations which are not described in the text description of RFC 6716 but is provided as a c-code file (cwrs.c) in an attachment IETF/OPUS-Audio RFC6716 PVQ-deindexing "PVQ Decoding Decoding of PVQ vectors is implemented in decode_pulses( ) (cwrs.c). The unique codeword index is decoded as a uniformly distributed integer value between 0 and V(N,K)−1, where V(N,K) is the number of possible combinations of K pulses in N samples. The index is then converted to a vector in the same way specified in [PVQ]. The indexing is based on the calculation of V(N,K) (denoted N(L,K) in [PVQ]).

The number of combinations can be computed recursively as V(N,K)=V(N−1,K)+V(N,K−1)+V(N−1,K−1), with V(N,0)=1 and V(0,K)=0, K!=0. There are many different ways to compute V(N,K), including precomputed tables and direct use of the recursive formulation. The reference implementation applies the recursive formulation one line (or column) at a time to save on memory use, along with an alternate, univariate recurrence to initialize an arbitrary line, and direct polynomial solutions for small N. All of these methods are equivalent, and have different trade-offs in speed, memory usage, and code size. Implementations MAY use any methods they like, as long as they are equivalent to the mathematical definition.

The decoded vector X is recovered as follows. Let i be the index decoded with the procedure in Section 4.1.5 with ft=V(N,K), so that 0<=i<V(N,K). Let k=K. Then, for j=0 to (N−1), inclusive, do:

1. Let p=(V(N−j−1,k)+V(N−j,k))/2.
2. If i<p, then let sgn=1, else let sgn=−1 and set i=i−p.
3. Let k0=k and set p=p−V(N−j−1,k).
4. While p>i, set k=k−1 and p=p−V(N−j−1,k).
5. Set X[j]=sgn*(k0−k) and i=i−p.

The decoded vector X is then normalized such that its L2-norm equals one."

IETF/OPUS-audio PVQ Codeword Limit and Splitting

"Split Decoding

To avoid the need for multi-precision calculations when decoding PVQ codevectors, the maximum size allowed for codebooks is 32 bits. When larger codebooks are needed, the vector is instead split in two sub-vectors of size N/2. A quantized gain parameter with precision derived from the current allocation is entropy coded to represent the relative gains of each side of the split, and the entire decoding process is recursively applied. Multiple levels of splitting may be applied up to a limit of LM+1 splits. The same recursive mechanism is applied for the joint coding of stereo audio."

"Spherical Vector Quantization

CELT uses a Pyramid Vector Quantizer (PVQ) [PVQ] for quantizing the details of the spectrum in each band that have not been predicted by the pitch predictor. The PVQ codebook consists of all sums of K signed pulses in a vector of N samples, where two pulses at the same position are required to have the same sign. Thus, the codebook includes all integer codevectors y of N dimensions that satisfy sum(abs(y(j)))=K.

In bands where there are sufficient bits allocated, PVQ is used to encode the unit vector that results from the normalization in Section 5.3.2 directly. Given a PVQ codevector y, the unit vector X is obtained as X=y/‖y‖, where ‖.‖ denotes the L2 norm."

"PVQ Search

The search for the best codevector y is performed by alg_quant( ) (vq.c). There are several possible approaches to the search, with a trade-off between quality and complexity. The method used in the reference implementation computes an initial codeword y1 by projecting the normalized spectrum X onto the codebook pyramid of K−1 pulses:

y0=truncate_towards_zero((K−1)*X/sum(abs(X)))

Depending on N, K and the input data, the initial codeword y0 may contain from 0 to K−1 non-zero values. All the remaining pulses, with the exception of the last one, are found iteratively with a greedy search that minimizes the normalized correlation between y and X:

$$J = -X^T * y / \|y\|$$

The search described above is considered to be a good trade-off between quality and computational cost. However, there are other possible ways to search the PVQ codebook and the implementers MAY use any other search methods. See alg_quant( ) in celt/vq.c."

IETF/OPUS Audio RFC-6716 PVQ-Indexing

"PVQ Encoding

The vector to encode, X, is converted into an index i such that 0<=i<V(N,K) as follows. Let i=0 and k=0. Then, for j=(N−1) down to 0, inclusive, do:
1. If k>0, set i=i+(V(N−j−1,k−1)+V(N−j,k−1))/2.
2. Set k=k+abs(X[j]).
3. If X[j]<0, set i=i+(V(N−j−1,k)+V(N−j,k))/2.

The index i is then encoded using the procedure in Section 5.1.4 with ft=V(N,K)."

APPENDIX B

Derivation of the MPVQ Related Recursion Equations

Derivation of the U(n, k) and M(n, k)=$N_{MPVQ}$(n, k) size relation using Fischer's formula:

Use N(n, k) as a short notation for $N_{PVQ}$(n, k), the number of PVQ-vectors for dimension n with k unit pulses.

Fischer's original PVQ recursion from 1986:

$$N(n,k)=N(n-1,k)+N(n-1,k-1)+N(n-1,k) \quad (1)$$

Define $$M(n,k)=N(n,k)/2; \quad (2)$$

M(n,k) is used below as short notation for $N_{MPVQ}$(n,k)

// M(n,k) number of PVQ-vectors with an positive initial
// sign, is half the number of entries in a full PVQ-
// pyramid N(n,k))
Define U(n, k) as sum( j=1,j=k−1,M(n−1,j)  (3)
// the number of vectors with a remaining
// leading
// +(positive) sign, excluding the vectors with an
// initial position value of 'k' and excluding
the
// vectors an initial position value of '0'

$$M(n,k)=1+2*U(n,k)+M(n-1,k); \quad (4)$$

// 1 for k=KMAX, only one such leading vector possible
// 2*U(n,k) for the number of vectors with a new/next leading
// sign, ("2" due to positive or negative new/next leading
// sign) (the "(U(n,k)" vectors have initial positive
// amplitudes [ KMAX-1, KMAX-2 ... 1 ]) M(n−1,k) for remaining
// with vectors a leading zero value (Equivalently with M (n,k)=$N_{MPVQ}$ (n, k))

$$N_{MPVQ}(n,k)=1+2*U(n,k)+N_{MPVQ}(n-1,k) \quad (4b)$$

$$M(n,k)-M(n-1,k)=1+2*U(n,k)=A(n,k) \quad (5)$$

Combine (1) (2) (5)

$$M(n-1,k)=U(n,k+1)-U(n,k) \quad (6)$$

Combine (4) (6)

$$M(n,k)=1+U(n,k)+U(n,k+1) \quad (7)$$

(7) can now be used for size calculation, as both U(n, k) and U (n,k+1)<M (n,k) (5) the difference (5), A (n, k), can still be used for amplitude offset iterations, if only used for offsets up to A(n, KMAX), as A(n, KMAX+1), may exceed M(n, KMAX), and thus causing numeric problems in precision limited hardware Derivation of Direct Row Calculation Recursion for U(n, k)

$$U(n,k)=(A(n,k)-1)/2 \text{ (from eq (5))}$$

Generic equation for a PVQ difference row A(n,k), used in CELT/OPUS-Audio $$A(n,k)=A(n,k-2)+((2*n-1)*A(n,k-1)-A(n,k-2))/(k-1) \quad (8)$$

Combine (5) (8)

$$U(n,k)=((2*n-1)*(U(n,k-1)+(k-2)*U(n,k-2)+n-1)/(k-1) \quad (9)$$

Or allow a mixed recursion $$U(n,k)=(A(n,k-2)-1)/2+((2*n-1)*A(n,k-1)-A(n,k-2))/(2*(k-1)) \quad (10)$$

Due to the high dynamic range of the numerator of (8 and 9, 10), special care has to be taken when evaluating this direct function,esp. in a limited precision arithmetic system (e.g. a 32 bit system).

(8) is used in IETF/OPUS, and original-CELT

(10) can be used in the MPVQ system calculation of U(n, KMAX+1), as it is known apriori that all previous A(n, k<KMAX+1) have low enough values.

(10) can be simplified even further (as A(n, k) is always odd for k>1)

$$U(n,k)=\text{floor}(A(n,k-2)/2)+(n*A(n,k-1)-(\text{floor}(A(n,k-1)/2)+\text{floor}(A(n,k-2)/2+1)))/(k-1) \quad (11)$$

or $U(n,k)=U(n,k-2)+(n*A(n,k-1)-N_{MPVQ}(n,k-2))/(k-1) \quad (11.b)$

MPVQ n,k-Matrix Recursion Relations

From Fischer relation (1) N(n, k)=N(n−1, k)+N(n−1, k−1)+N(n−1, k)

Combine (7) and (5) one can find these recursive relations:

$$U(n,k+1)=1+U(n-1,k)+U(n-1,k+1)+U(n,k) \quad (12),$$

with initial conditions
U(0,*)=0, U(1,*)=0, and U(a,b)=U(b,a)

$$A(n,k+1)=A(n-1,k)+A(n-1,k+1)+A(n,k) \quad (13)$$

with initial conditions A(0,0)=1, A(0,1+)=0, A(1,*)=1, and A(a,b)=A(b,a)

(13) can now be used to iteratively calculate row n, k=0:KMAX 15 from previous vector row n−1, k=0:KMAX for A(n,k), and (12) be used to iteratively calculate row n, k=0:KMAX+1 from previous vector row n−1, k=0:KMAX+1 for U(n,k).

(13) is used in IETF-OPUS-Audio

Using (12) and the fact that A(n, k) is odd, we obtain a new efficient mixed recursion formula:

$$U(n,k+1)=1+A(n-1,k)>>1+U(n-1,k+1)+A(n,k)>>1 \quad (14),$$

where ">>" is integer division by 2 (a right shift), as A(large n, k+1) may saturate, Equation 14 is used to stay within the given dynamic range e.g (32 bits, for the last (k+1) offset column.

The Vector Radius Relation, Enumeration by Products and Vector Length Recursion Relations Hung, Tsern, Meng 1998 also summarizes some relevant additional relations for a PVQ(l==n, k) pyramid the size is N(l, k)=$N_{PVQ}$(l, k), The vector radius recursive relation" (43)" below is a basic row-only size relation for row l=n.

The enumeration formula by products "(44)" below is a number of non-zero elements based product relation for the PVQ size.

$$(l-1)N(l, k) = 2kN(l-1, k) + (l-1)N(l-2, k) \quad (42)$$
Vector length recursion $$kN(l, k) = 2lN(l, k-1) + (k-2)N(l, k-2) \quad (44)$$
Vector radius recursion $$N(l, k) = \sum_s 2^s \binom{l}{s}\binom{k-1}{s-1} \quad (44)$$
Enumeration formula by products

The invention claimed is:

1. A method for pyramid vector quantization indexing of coefficients derived from an audio or video signal, wherein the method comprises:
    obtaining an input vector having a plural number of the coefficients;
    extracting a leading sign from the input vector, the leading sign being a sign of a non-zero coefficient in the input vector;
    indexing the input vector with a modified pyramid vector quantization enumeration scheme into an output index, which output index together with the leading sign represent the coefficients;
    said modified pyramid vector quantization enumeration scheme neglecting said leading sign when performing the indexing of the input vector into the output index; and
    outputting the leading sign and the output index as codewords in an outgoing bit stream.

2. The method of claim 1, wherein the indexing of the input vector with the modified pyramid quantization enumeration scheme comprises:
    shifting a sign of a non-zero coefficient such that the shifted sign is encoded in association with next non-zero coefficient in a direction of the indexing of the input vector into the output index.

3. The method of claim 1, wherein the obtaining of the input vector comprises obtaining an integer input vector having the plural number of the coefficients.

4. The method of claim 1, wherein the extraction of the leading sign from the input vector extracts the sign of a first occurring non-zero coefficient of the input vector in a direction of the indexing of the input vector into the output index.

5. The method of claim 1, wherein the extraction of the leading sign from the input vector extracts the sign of a last occurring non-zero coefficient of the input vector in a direction of the indexing of the input vector into the output index.

6. The method of claim 1, wherein:
    the indexing is performed by an iterative enumeration procedure;
    the iterative enumeration procedure comprises repetition of an iteration step in which one current coefficient of the input vector is selected for consideration, the iteration step comprises:
        finding an offset parameter that is associated with all coefficients of the input vector processed prior to the current coefficient of the input vector; and
        increasing an accumulated index in dependence of the offset parameter;
    the repetition of the iteration step is continued with coefficients of the input vector being selected one after the other as the current coefficient at least until a majority of the coefficients in the input vector have been considered; and
    the iterative enumeration procedure further comprising a terminating step in which the output index is set based on a value of the accumulated index responsive to ending repetition of the iteration step.

7. The method of claim 6, wherein:
    the repetition of the iteration step is continued with coefficients of the input vector being selected one after the other as the current coefficient at least until all of the coefficients in the input vector have been considered; and
    the terminating step of the iterative enumeration procedure sets the output index equal to the accumulated index responsive to the ending of the repetition of the iteration step.

8. The method of claim 6, wherein the increasing of the accumulated index in each iteration step is based on a least significant bit in dependence of a sign of a previous non-zero coefficient in the input vector.

9. The method of claim 6, wherein the increasing of the accumulated index is based at least partly on a first offset parameter U(n,k), where n is a dimension of the input vector and k is a number of unit pulses, the first offset parameter U(n,k) being defined as a number of vectors of dimension n and L1-norm of k, that does not have a leading zero, and does not have the leading value k, has a leading positive value, and has a positive next leading sign.

10. The method of claim 6, wherein the increasing of the index is based at least partly on a second offset parameter A(n,k), where n is the dimension of the input vector and k is the number of unit pulses, the second offset parameter A(n,k) being defined as the number of vectors of dimension n and L1-norm of k, that has a positive leading value and that does not have a leading zero.

11. An encoder circuit configured to perform pyramid vector quantization indexing of coefficients derived from an audio or video signal, the encoder comprising:
at least one processor; and
at least one memory storing computer program code that is executed by the at least one processor to perform operations comprising:
obtaining an input vector having a plural number of the coefficients;
extracting a leading sign from the input vector, the leading sign being a sign of a non-zero coefficient in the input vector;
indexing the input vector with a modified pyramid vector quantization enumeration scheme into an output index, which output index together with the leading sign represent the coefficients;
said modified pyramid vector quantization enumeration scheme neglecting said leading sign when performing the indexing of the input vector into the output index; and
outputting the leading sign and the output index as codewords in an outgoing bit stream.

12. The encoder circuit of claim 11, wherein the operation of indexing the input vector with the modified pyramid quantization enumeration scheme comprises:
shifting a sign of the non-zero coefficient such that the shifted sign is encoded in association with next non-zero coefficient in a direction of the indexing of the input vector into the output index.

13. The encoder circuit of claim 11, wherein the operation of obtaining of the input vector comprises obtaining an integer input vector having the plural number of the coefficients.

14. The encoder circuit of claim 11, wherein the operation of extraction of the leading sign from the input vector extracts the sign of a first occurring non-zero coefficient of the input vector in a direction of the indexing of the input vector into the output index.

15. The encoder circuit of claim 11, wherein the operation of extraction of the leading sign from the input vector extracts the sign of a last occurring non-zero coefficient of the input vector in a direction of the indexing of the input vector into the output index.

16. The encoder circuit of claim 11, wherein:
the operation of indexing is performed by an iterative enumeration procedure;
the iterative enumeration procedure comprises repetition of an iteration operation in which one current coefficient of the input vector is selected for consideration, the iteration operation comprises:
finding an offset parameter that is associated with all coefficients of the input vector processed prior to the current coefficient of the input vector; and
increasing an accumulated index in dependence of the offset parameter;
the repetition of the iteration operation is continued with coefficients of the input vector being selected one after the other as the current coefficient at least until a majority of the coefficients in the input vector have been considered; and
the iterative enumeration procedure further comprising a terminating operation in which the output index is set based on a value of the accumulated index responsive to ending repetition of the iteration operation.

17. The encoder circuit of claim 16, wherein:
the repetition of the iteration operation is continued with coefficients of the input vector being selected one after the other as the current coefficient at least until all of the coefficients in the input vector have been considered; and
the terminating operation of the iterative enumeration procedure sets the output index equal to the accumulated index responsive to the ending of the repetition of the iteration operation.

18. The encoder circuit of claim 16, wherein the operation of increasing of the accumulated index in each iteration operation is based on a least significant bit in dependence of a sign of a previous non-zero coefficient in the input vector.

19. The encoder circuit of claim 16, wherein the increasing of the accumulated index is based at least partly on a first offset parameter U(n,k), where n is the dimension of the input vector and k is a number of unit pulses, the first offset parameter U(n,k) being defined as the number of vectors of dimension n and L1-norm of k, that does not have a leading zero, and does not have the leading value k, has a leading positive value, and has a positive next leading sign.

20. The encoder circuit of claim 16, wherein the increasing of the index is based at least partly on a second offset parameter A(n,k), where n is a dimension of the input vector and k is the number of unit pulses, the second offset parameter A(n,k) being defined as a number of vectors of dimension n and L1-norm of k, that has a positive leading value and that does not have a leading zero.

* * * * *

UNITED STATES PATENT AND TRADEMARK OFFICE
CERTIFICATE OF CORRECTION

PATENT NO. : 10,715,807 B2
APPLICATION NO. : 16/512587
DATED : July 14, 2020
INVENTOR(S) : Jonas Svedberg Page 1 of 2

It is certified that error appears in the above-identified patent and that said Letters Patent is hereby corrected as shown below:

In the Specification

In Column 10, Line 37, delete "$\hat{q}$." and insert -- $\hat{g}$. --, therefor.

In Column 16, Line 51, delete "leading sign=(next_sign_ind=1)." and insert -- leading sign= "+1"(next_sign_ind=1). --, therefor.

In Column 18, Line 32, delete "$N_{PVQ}(n,k)=1+U(n,k)+U(n,k+1)$," and insert -- $N_{MPVQ}(n,k)=1+U(n,k)+U(n,k+1)$, --, therefor.

In Column 18, Line 35, delete "$N_{PVQ}(n,k)=1+floor((A(n,k))/2)+U(n,k+1)$," and insert -- $N_{MPVQ}(n,k)=1+floor((A(n,k))/2)+U(n,k+1)$, --, therefor.

In Column 18, Line 38, delete "$N_{PVQ}(n,k)-N_{MPVQ}(n-1,k)=1+2*U(n,k)=A(n,k)$," and insert -- $N_{MPVQ}(n,k)-N_{MPVQ}(n-1,k)=1+2*U(n,k)=A(n,k)$, --, therefor.

In Column 27, Line 54, delete "$A(n,k)=A(n,k-1)+A(n-,k-1)+A(n-1,k)$." and insert -- $A(n,k)=A(n,k-1)+A(n-1,k-1)+A(n-1,k)$. --, therefor.

In Column 28, Line 38, delete "[p0, p11, p2], k=4" and insert -- [p0, p1, p2], k=4 --, therefor.

In Column 33, Lines 2-3, delete "$N_{PVQ}(n=3,k=5)=2*N_{MPVQ}Q(3,5)=2*51=102$," and insert -- $N_{PVQ}(n=3,k=5)=2*N_{MPVQ}(3,5)=2*51=102$, --, therefor.

In Column 35, Line 5, delete "A(n k)" and insert -- A(n,k) --, therefor.

In Column 36, Line 17, delete "Table 99" and insert -- Table 9 --, therefor.

In Column 37, Line 15, delete "$N_{PVQ}=2*N_{MPVQ}=2*51=102$," and insert -- $N_{PVQ}=2*N_{MPVQH}=2*51=102$, --, therefor.

Signed and Sealed this
Fifth Day of January, 2021

Andrei Iancu
*Director of the United States Patent and Trademark Office*

CERTIFICATE OF CORRECTION (continued)
U.S. Pat. No. 10,715,807 B2

In Column 42, Line 47, delete "log2($N_{PVQ}$(N=128,k=12))=67.2 bits," and insert -- log2($N_{PVQ}$(N=128,k=12))=67.2 bits, --, therefor.

In Column 44, Line 62, above ""Spherical Vector Quantization", insert -- IETF/OPUS-Audio RFC-6716 PVQ search --.

In Column 47, Line 15, delete "k=0:KMAX 15" and insert -- k=0:KMAX --, therefor.